US007420199B2

(12) United States Patent
Gutsche et al.

(10) Patent No.: US 7,420,199 B2
(45) Date of Patent: Sep. 2, 2008

(54) RESISTIVITY CHANGING MEMORY CELL HAVING NANOWIRE ELECTRODE

(75) Inventors: Martin Ulrich Gutsche, Dorfen (DE); Harald Seidl, Pöring (DE); Franz Kreupl, München (DE)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 11/182,022

(22) Filed: Jul. 14, 2005

(65) Prior Publication Data

US 2007/0012956 A1 Jan. 18, 2007

(51) Int. Cl.
*H01L 29/02* (2006.01)

(52) U.S. Cl. ........................ 257/2; 257/3; 257/4; 257/5

(58) Field of Classification Search ................. 257/1-5; 438/800, 900; 977/734, 755, 762
See application file for complete search history.

(56) References Cited

U.S. PATENT DOCUMENTS 6,605,535 B1 8/2003 Lee et al.
6,787,450 B2 9/2004 Sinha et al.
2004/0251551 A1* 12/2004 Hideki ....................... 257/758
2006/0160304 A1* 7/2006 Hsu et al. ................... 438/257
2006/0237799 A1* 10/2006 Lu et al. ..................... 257/382

FOREIGN PATENT DOCUMENTS

EP 1 274 092 A2 6/2002
EP 1 473 767 A2 4/2004
KR 04106824 12/2004
WO WO 2006/003620 A1 1/2006

OTHER PUBLICATIONS

Yi Cui et al., "High Performance Silicon Nanowire Field Effect Transistors", Nano Letters, vol. 3, No. 2, pp. 149-152 (2003).
Yi Cui et al., "Diameter-Controlled Synthesis of Single-Crystal Silicon Nanowires", Applied Physics Letters, vol. 78, No. 15, pp. 2214-2216 (Apr. 9, 2001).
Charles M. Lieber, "Nanowire Superlattices", Nano Letters, vol. 2, No. 2, pp. 81-82, (Feb. 2002).
Vladimir L. Merkulov et al., "Effects of Spatial Separation on the Growth of Vertically Aligned Carbon Nanofibers Produced by Plasma-Enhanced Chemical Vapor Deposition", Applied Physics Letters, vol. 80, No. 3, pp. 476-478, (Jan. 21, 2002).

* cited by examiner

*Primary Examiner*—Jerome Jackson
*Assistant Examiner*—Jami M Valentine
(74) *Attorney, Agent, or Firm*—Dicke, Billig & Czaja, PLLC

(57) ABSTRACT

A memory cell includes a first electrode comprising a nanowire, a second electrode, and phase-change material between the first electrode and the second electrode.

18 Claims, 40 Drawing Sheets

RESISTIVITY CHANGING MEMORY CELL HAVING NANOWIRE ELECTRODE

BACKGROUND

Phase-change memories include phase-change materials that exhibit at least two different states. Phase-change material may be used in memory cells to store bits of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice. Some phase-change materials exhibit two crystalline states, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase-change materials may be induced reversibly. In this way, the memory may change from the amorphous state to the crystalline state, and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell. To minimize the amount of power that is used in each memory cell, the cross-section of the electrical contact for the phase-change material of the memory cell should be minimized.

SUMMARY

One embodiment of the present invention provides a memory cell. The memory cell includes a first electrode comprising a nanowire, a second electrode, and phase-change material between the first electrode and the second electrode.

BRIEF DESCRIPTION OF THE DRAWINGS

Embodiments of the invention are better understood with reference to the followings drawings. The elements of the drawings are not necessarily to scale relative to each other. Like reference numerals designate corresponding similar parts.

DETAILED DESCRIPTION

Figure 1:
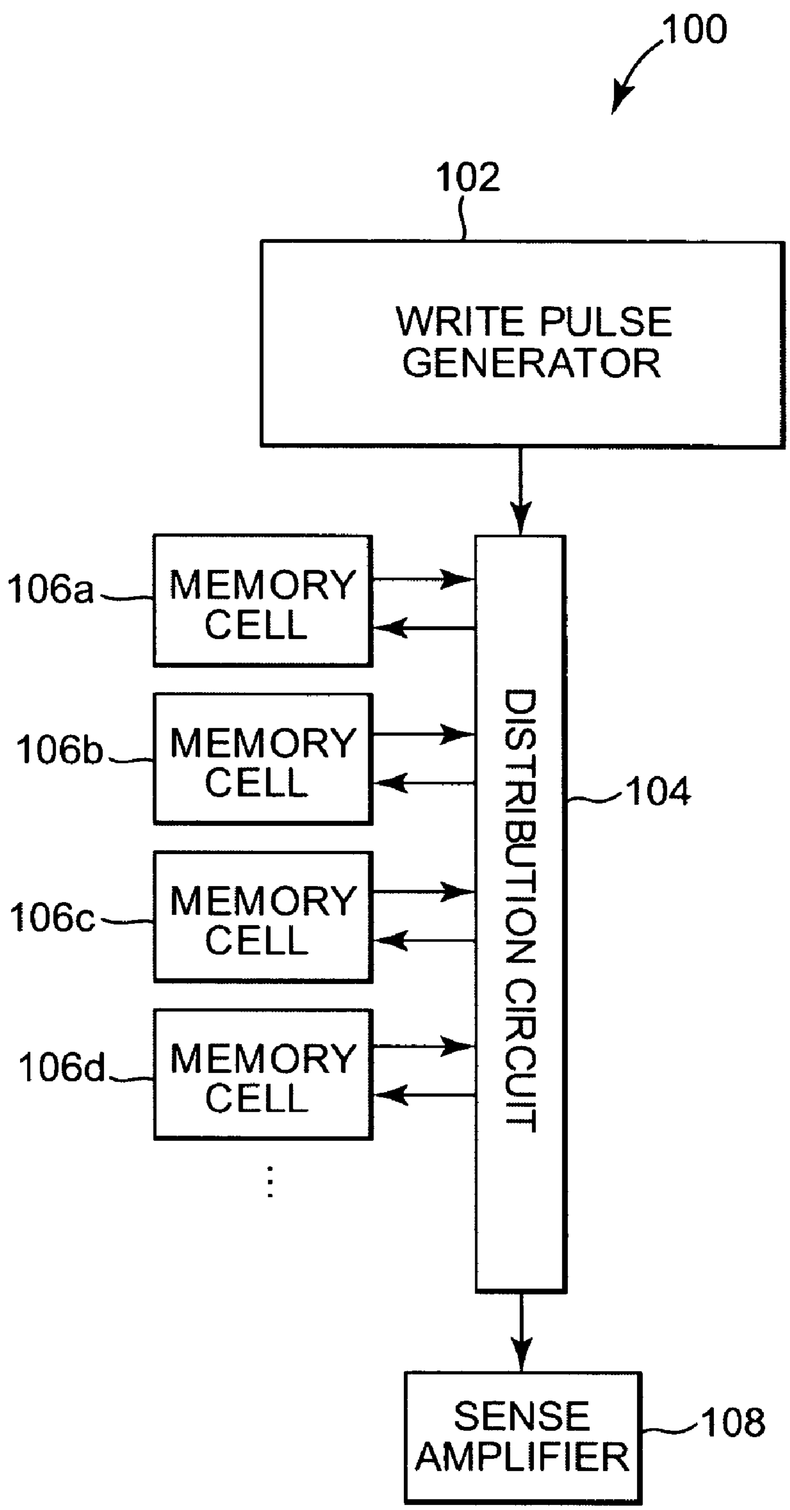
FIG. 1 is a block diagram illustrating one embodiment of a memory cell device.

FIG. 1 illustrates a block diagram of one embodiment of a memory cell device 100. Memory cell device 100 includes a write pulse generator 102, a distribution circuit 104, memory cells 106*a*, 106*b*, 106*c*, and 106*d*, and a sense amplifier 108. In one embodiment, memory cells 106*a*-106*d* are phase-change memory cells that are based on the amorphous to crystalline phase transition of the memory material.

Each phase-change memory cell 106*a*-106*d* includes phase-change material defining a storage location. The phase-change material is coupled to a first electrode comprising a nanowire, nanotube, or nanofiber. The nanotube, nanowire, or nanofiber electrode provides a small contact area with the phase-change material to reduce the power requirements for the phase-change memory cells 106*a*-106*d*. The memory cell can be fabricated using typical lithography techniques since the nanowire, nanotube, or nanofiber is grown rather than deposited using lithographic techniques. The nanowire, nanotube, or nanofiber electrode memory cell decreases the contact area and phase-change volume of the memory cell as compared to typical phase-change memory cells. This results in lower set and particularly reset currents and powers.

In one embodiment, write pulse generator 102 generates current or voltage pulses that are controllably directed to memory cells 106*a*-106*d* via distribution circuit 104. In one embodiment, distribution circuit 104 includes a plurality of transistors that controllably direct current or voltage pulses to the memory cells.

In one embodiment, memory cells 106*a*-106*d* are made of a phase-change material that may be changed from an amorphous state to a crystalline state or from a crystalline state to an amorphous state under influence of temperature change. The degree of crystallinity thereby defines at least two memory states for storing data within memory cell device 100. The at least two memory states can be assigned to the bit values "0" and "1". The bit states of memory cells 106*a*-106*d* differ significantly in their electrical resistivity. In the amorphous state, a phase-change material exhibits significantly higher resistivity than in the crystalline state. In this way, sense amplifier 108 reads the cell resistance such that the bit value assigned to a particular memory cell 106*a*-106*d* is determined.

To program a memory cell 106*a*-106*d* within memory cell device 100, write pulse generator 102 generates a current or voltage pulse for heating the phase-change material in the target memory cell. In one embodiment, write pulse generator 102 generates an appropriate current or voltage pulse, which is fed into distribution circuit 104 and distributed to the appropriate target memory cell 106*a*-106*d*. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is heating the phase-change material of the target memory cell above its melting temperature, and then quickly quench cooling the material, thereby achieving the amorphous state.

Figure 2A:
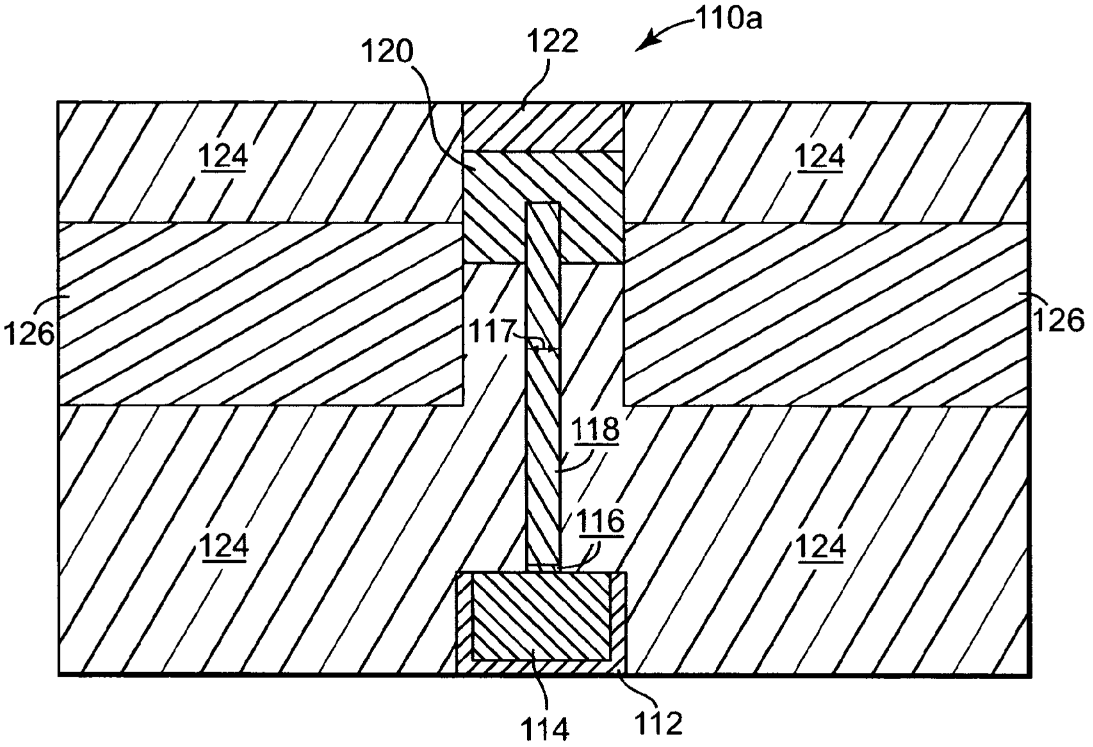
FIG. 2A illustrates a cross-sectional view of one embodiment of a phase-change memory cell.

FIG. 2A illustrates a cross-sectional view of one embodiment of a phase-change memory cell 110*a*. Phase-change memory cell 110*a* includes a selection device (not shown), a landing pad 114 including a liner 112, a catalyst material layer 116, a first electrode 118 comprising a nanowire or nanotube, phase-change material 120, a second electrode 122, and insulation material 124 and 126. Phase-change material 120 is laterally completely enclosed by insulation material 124 and 126, which defines the current path and hence the location of the phase-change region in phase-change material 120. Phase-change material 120 provides a storage location for storing one bit or several bits of data. A selection device, such as an active device like a transistor or a diode, is coupled to landing pad 114 to control the application of current or voltage to first electrode 118, and thus to phase-change material 120, to set and reset phase-change material 120.

Phase-change material 120 is in contact with nanotube or nanowire 118 and second electrode 122. Nanowire or nanotube 118 has a width or cross-sectional area 117 within the range of approximately 10-100 nanometers. An advantage of the nanowire or nanotube contact memory cell structure is that the contact area between phase-change material 120 and first electrode 118 is defined by the cross-sectional area 117 of the nanotube or nanowire, which is grown on catalyst material layer 116 to provide first electrode 118.

Phase-change material 120 may be made up of a variety of materials in accordance with the present invention. Generally, chalcogenide alloys that contain one or more elements from column IV of the periodic table are useful as such materials. In one embodiment, phase-change material 120 of memory cell 110*a* is made up of a chalcogenide compound material, such as GeSbTe or AgInSbTe. In another embodiment, the phase-change material can be chalcogen free such as GeSb, GaSb, SbTe, or GeGaSb.

During a set operation of phase-change memory cell 110*a*, a set current or voltage pulse is selectively enabled to the selection device and sent through first electrode 118 to phase-change material 120 thereby heating it above its crystallization temperature (but usually below its melting temperature). In this way, phase-change material 120 reaches its crystalline state during this set operation. During a reset operation of phase-change memory cell 110*a*, a reset current and/or voltage pulse is selectively enabled to the selection device and sent through first electrode 118 to phase-change material 120. The reset current or voltage quickly heats phase-change material 120 above its melting temperature. After the current and/or voltage pulse is turned off, phase-change material 120 quickly quench cools into the amorphous state.

Figure 2B:
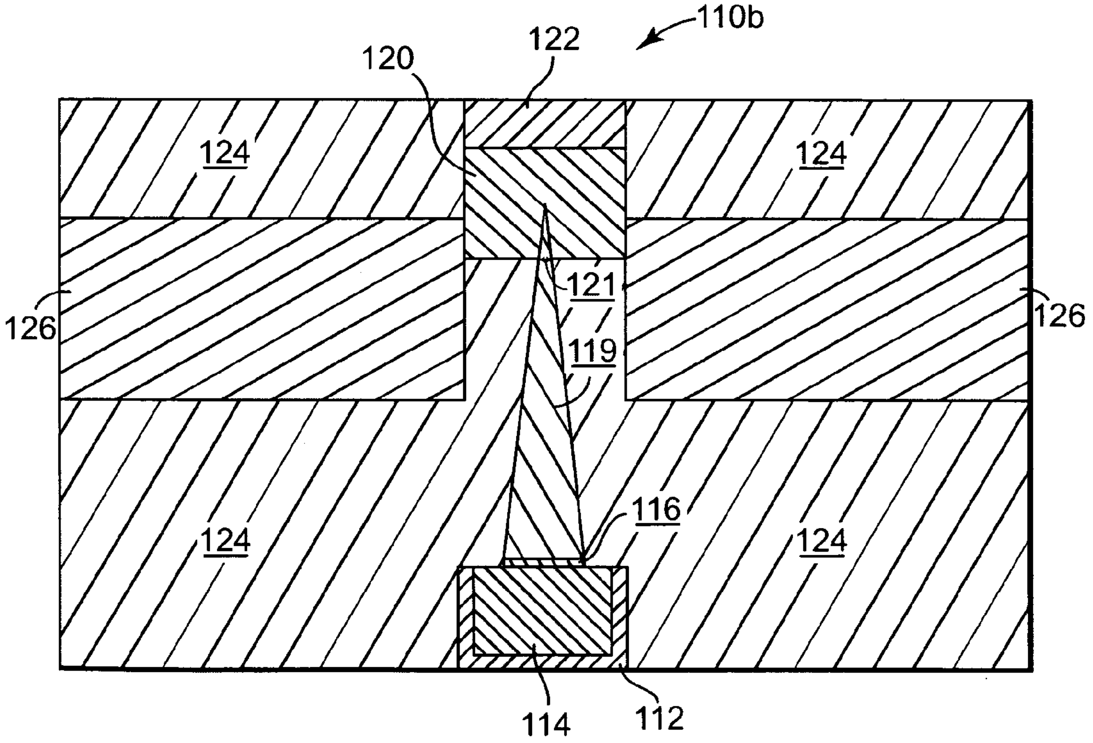
FIG. 2B illustrates a cross-sectional view of another embodiment of a phase-change memory cell.

FIG. 2B illustrates a cross-sectional view of another embodiment of a phase-change memory cell 110*b*. Phase-change memory cell 110*b* is similar to phase-change memory cell 110*a* except that first electrode 118 comprising a nanowire or nanotube is replaced with first electrode 119 comprising a nanofiber. Nanofiber 119 has a width or cross-sectional area 121 where nanofiber 119 enters phase-change material 120 within the range of approximately 10-100 nanometers. Phase-change memory cell 110*b* operates similarly to phase-change memory cell 110*a*.

Figure 3:
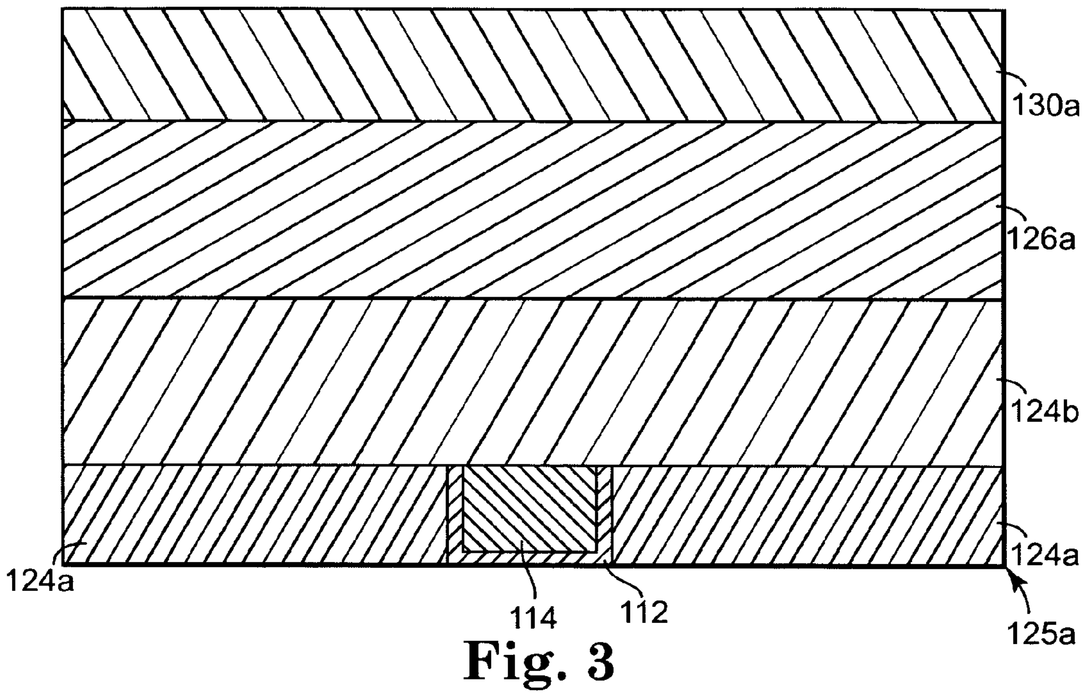
FIG. 3 illustrates a cross-sectional view of one embodiment of a preprocessed wafer, first insulation material layer, second insulation material layer, and photoresist layer.

FIG. 3 illustrates a cross-sectional view of one embodiment of a preprocessed wafer 125*a*, a first insulation material layer 124*b*, a second insulation material layer 126*a*, and a photoresist layer 130*a*. Preprocessed wafer 125*a* includes insulation material 124*a*, a landing pad 114 having a liner 112, and lower wafer layers (not shown). In one embodiment, landing pad 114 is a tungsten plug, copper plug, or other suitable conducting material. In one embodiment, liner 112 comprises TiN or another suitable liner material. Insulation material 124*a* is $SiO_2$, fluorinated silica glass (FSG) or other suitable dielectric material.

Insulation material, such as $SiO_2$, FSG, or other suitable dielectric material, is deposited over preprocessed wafer 125*a* to provide first insulation material layer 124*b*. First insulation material layer 124*b* is deposited using chemical vapor deposition (CVD), atomic layer deposition (ALD), metal organic chemical vapor deposition (MOCVD), plasma vapor deposition (PVD), jet vapor deposition (JVP), or other suitable deposition technique. Insulation material, such as $Si_3N_4$ or other suitable dielectric material, is deposited over first insulation material layer 124*b* to provide second insulation material layer 126*a*. Second insulation material layer 126*a* is deposited using CVD, ALD, MOCVD, PVD, JVP or other suitable deposition technique. Photoresist is spin coated or applied in another suitable manner over second insulation material layer 126*a* to provide photoresist layer 130*a*.

Figure 4:
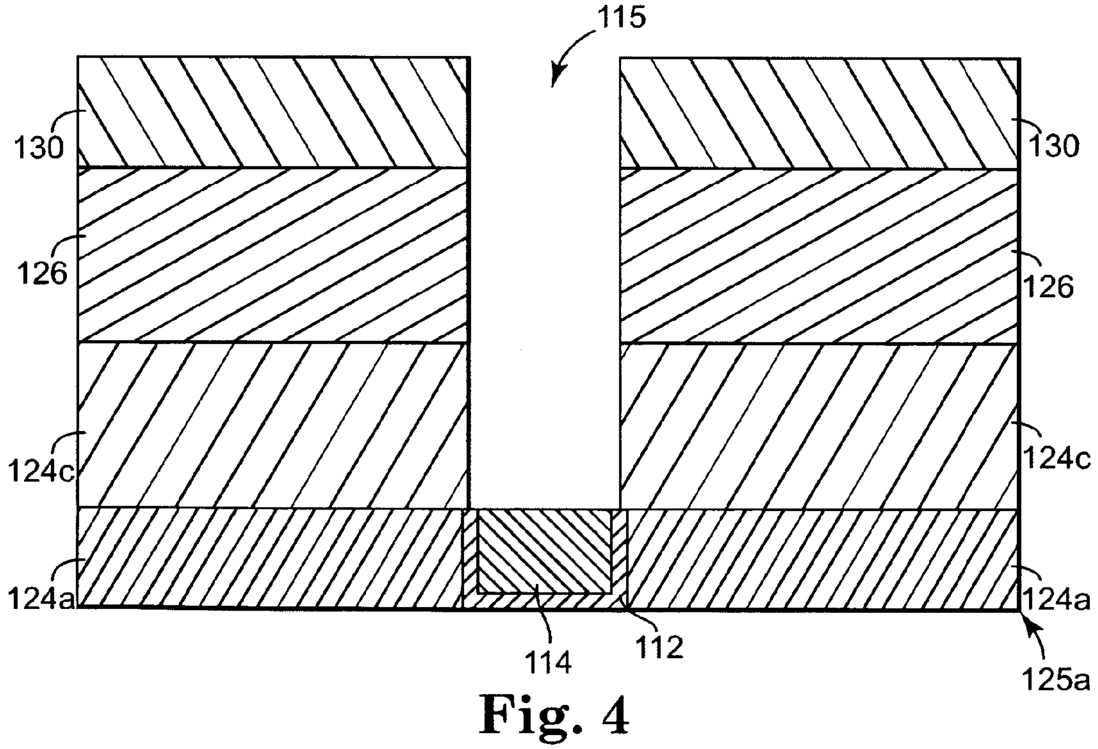
FIG. 4 illustrates a cross-sectional view of one embodiment of the preprocessed wafer, first insulation material layer, second insulation material layer, and photoresist layer after patterning the photoresist layer and etching the first insulation material layer and the second insulation material layer.

FIG. 4 illustrates a cross-sectional view of one embodiment of preprocessed wafer 125*a*, first insulation material layer 124*c*, second insulation material layer 126, and photoresist layer 130 after etching second insulation material layer 126*a* and first insulation material layer 124*b*. Optical lithography is used to pattern opening 115 in photoresist layer 130*a* to provide photoresist layer 130. The exposed portion of second insulation material layer 126*a* is etched and then the exposed portion of first insulation material layer 124*b* is etched to provide second insulation material layer 126 and first insulation material layer 124*c* and to expose landing pad 114.

Figure 5:
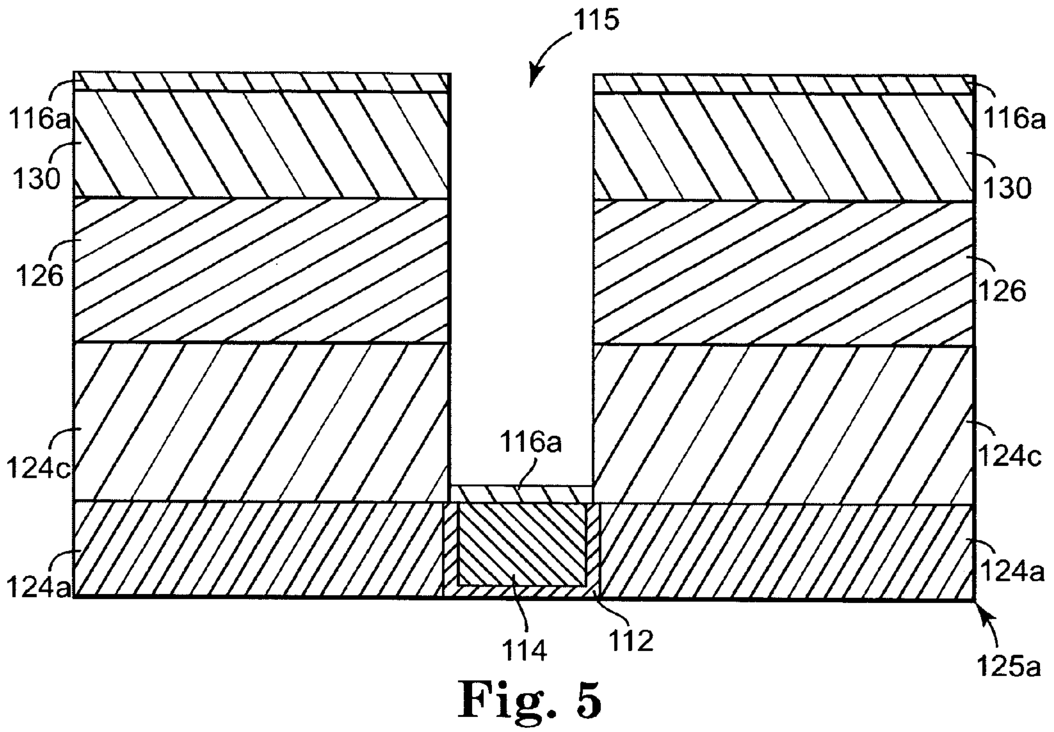
FIG. 5 illustrates a cross-sectional view of one embodiment of the preprocessed wafer, first insulation material layer, second insulation material layer, photoresist layer, and a catalyst material layer.

FIG. 5 illustrates a cross-sectional view of one embodiment of preprocessed wafer 125*a*, first insulation material layer 124*c*, second insulation material layer 126, photoresist layer 130, and a catalyst material layer 116*a*. A catalyst material, such as a silicide forming metal such as Ti, Pd, Pt, Au, Cu, Co, Cr, Hf, Ir, Mn, Mo, Ni, Rh, Ta, W, Zr, or other suitable catalyst material, is deposited over photoresist layer 130 and landing pad 114 to provide catalyst material layer 116*a*. Catalyst material layer 116*a* is deposited using CVD, ALD, MOCVD, PVD, JVP or other suitable deposition technique.

Figure 6:
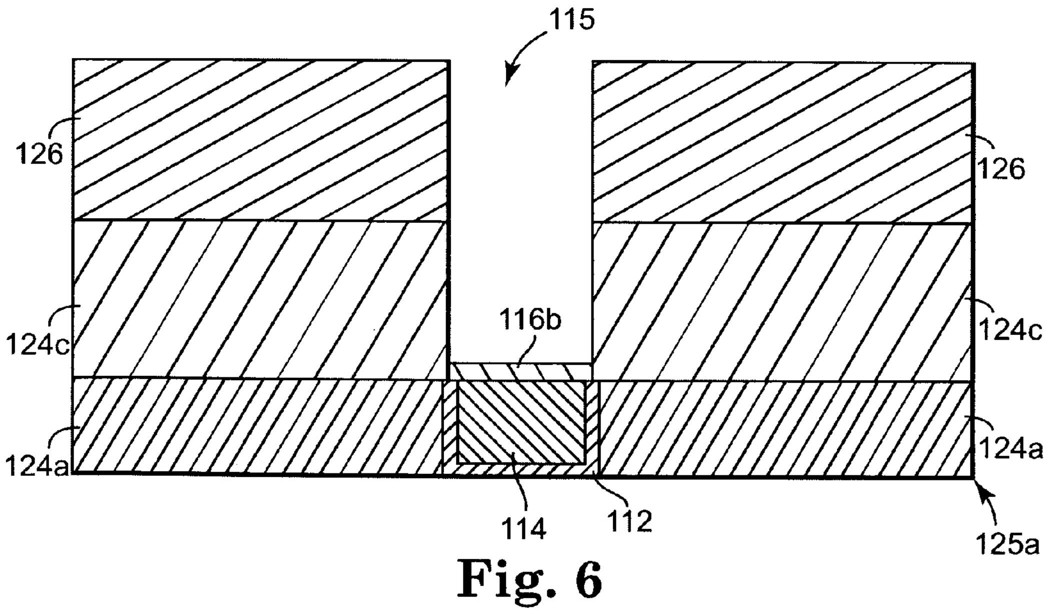
FIG. 6 illustrates a cross-sectional view of one embodiment of the preprocessed wafer, first insulation material layer, second insulation material layer, and catalyst material layer after removing the photoresist layer.

FIG. 6 illustrates a cross-sectional view of one embodiment of preprocessed wafer 125*a*, first insulation material layer 124*c*, second insulation material layer 126, and catalyst material layer 116*b* after removing photoresist layer 130. Photoresist layer 130 is stripped using a photoresist removal process that also removes the portion of catalyst material layer 116*a* over photoresist layer 130 leaving catalyst material layer 116*b* over landing pad 114.

Figure 7:
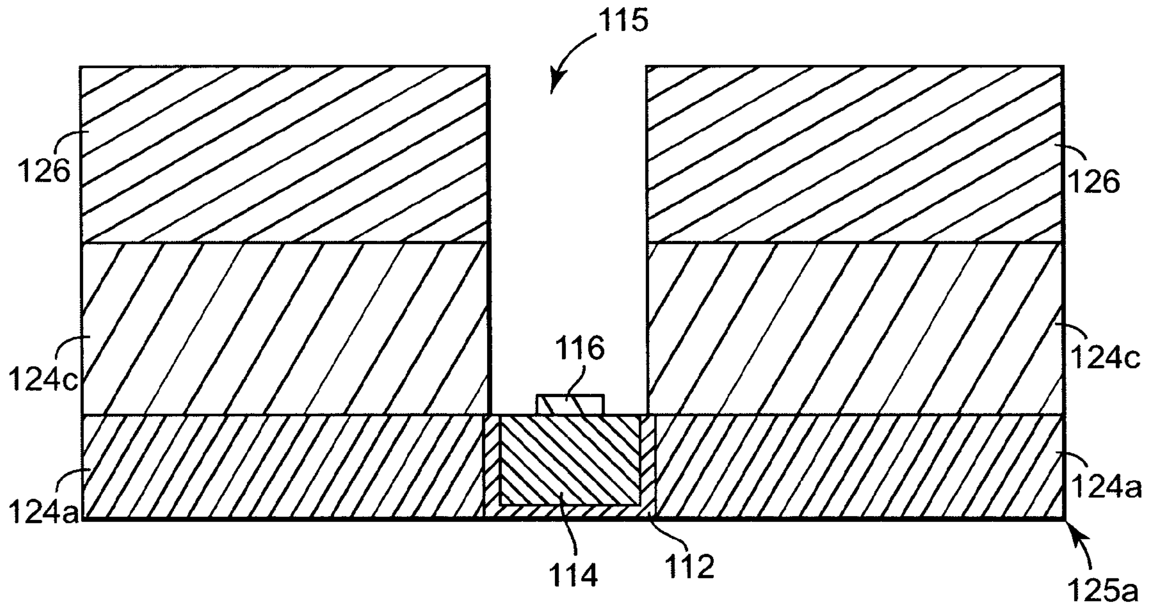
FIG. 7 illustrates a cross-sectional view of one embodiment of the preprocessed wafer, first insulation material layer, second insulation material layer, and catalyst material layer after heating the catalyst material layer.

FIG. 7 illustrates a cross-sectional view of one embodiment of preprocessed wafer 125*a*, first insulation material layer 124*c*, second insulation material layer 126, and catalyst material layer 116 after heating catalyst material layer 116*b*. In one embodiment, catalyst material layer 116*b* is heated to reduce the area of the catalyst material by coagulation to provide catalyst material layer 116. Catalyst material layer 116 defines the area on which a nanotube, nanowire, or nanofiber is grown.

Figure 8A:
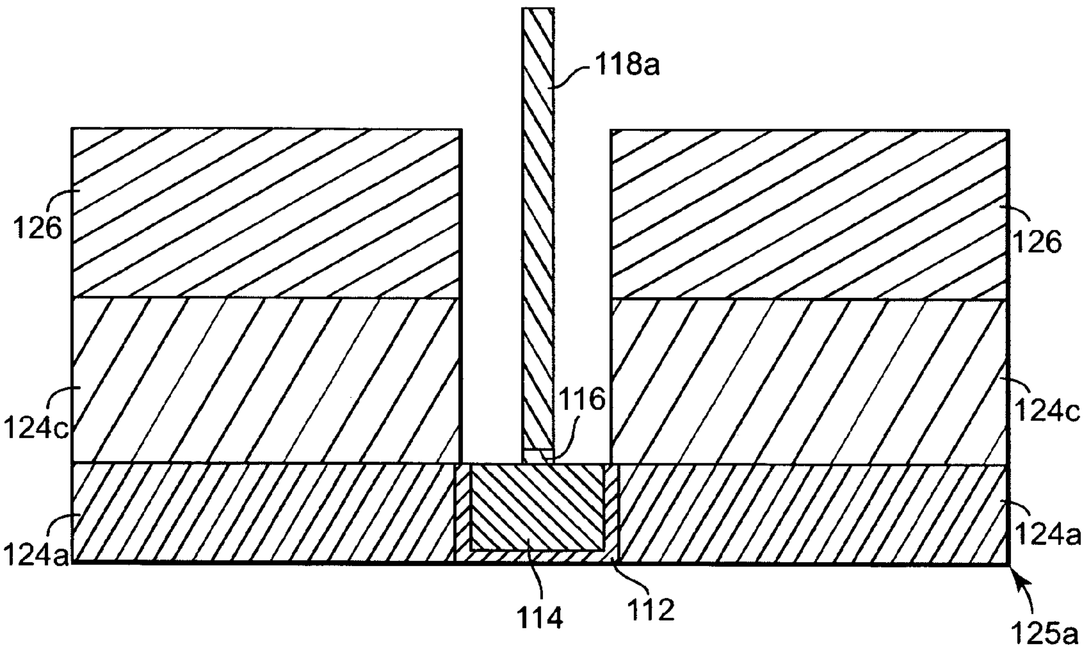
FIG. 8A illustrates a cross-sectional view of one embodiment of the preprocessed wafer, first insulation material layer, second insulation material layer, catalyst material layer, and a nanotube or nanowire.

FIG. 8A illustrates a cross-sectional view of one embodiment of preprocessed wafer 125*a*, first insulation material layer 124*c*, second insulation material layer 126, catalyst material layer 116, and a nanotube or nanowire 118*a*. Nanotube or nanowire 118*a* is grown on catalyst material layer 116 to provide a first electrode. Nanotube or nanowire 118*a* is a silicon based, carbon based, or other suitable material based nanotube or nanowire.

Figure 8B:
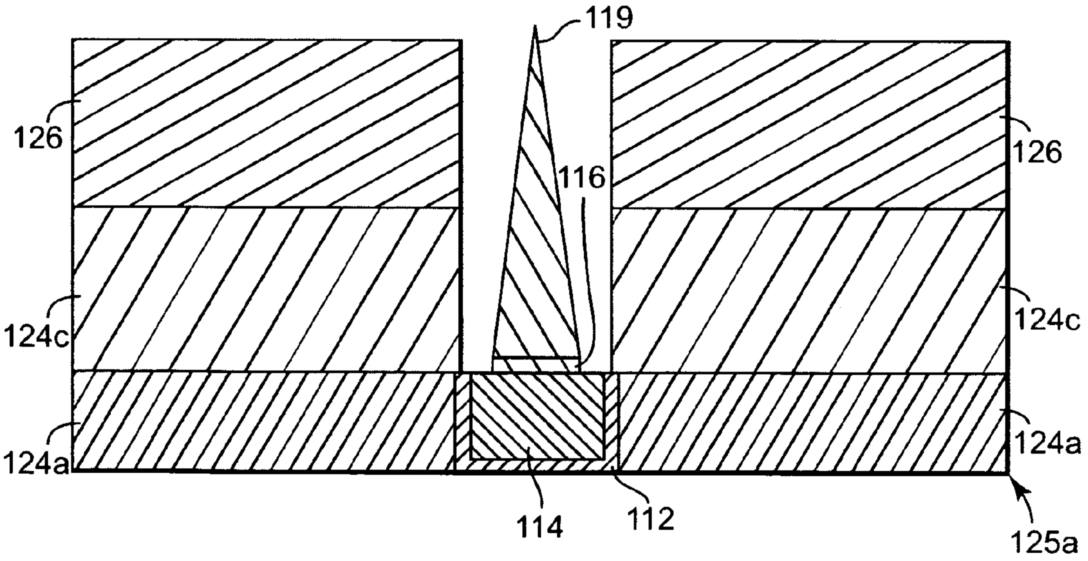
FIG. 8B illustrates a cross-sectional view of one embodiment of the preprocessed wafer, first insulation material layer, second insulation material layer, catalyst material layer, and a nanofiber.

FIG. 8B illustrates a cross-sectional view of one embodiment of preprocessed wafer 125*a*, first insulation material layer 124*c*, second insulation material layer 126, catalyst material layer 116, and a nanofiber 119. Nanofiber 119 is grown on catalyst material layer 116 to provide a first electrode. Nanofiber 119 is a silicon based, carbon based, or other suitable material based nanofiber.

Figure 9A:
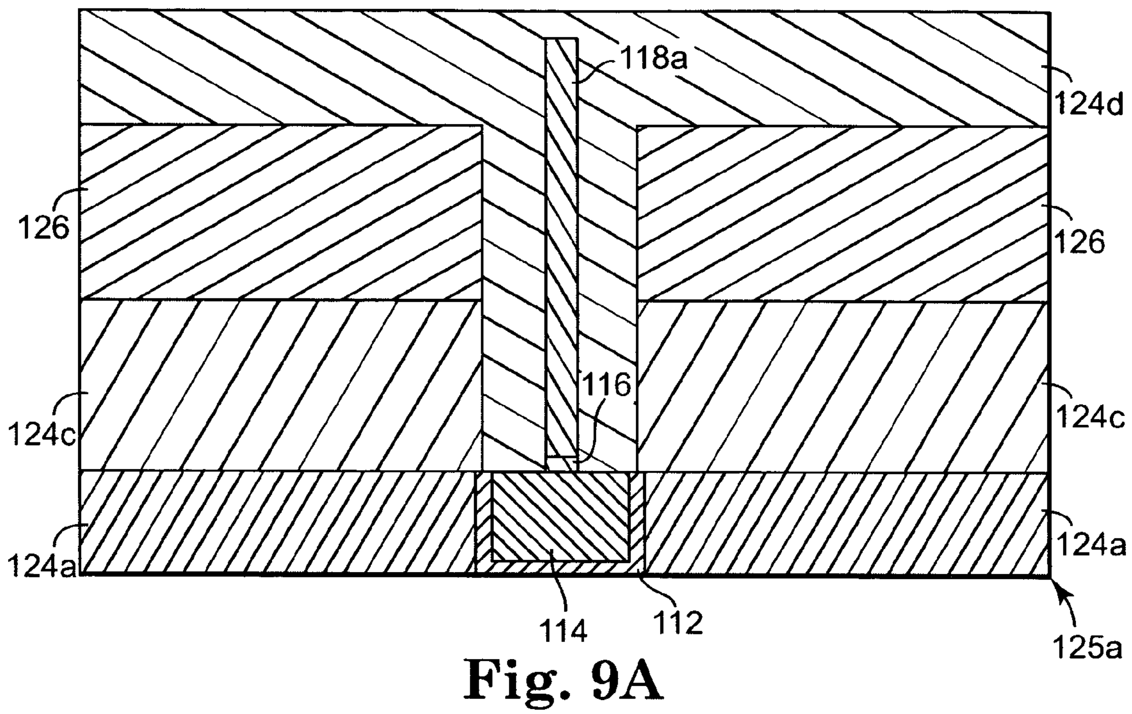
FIG. 9A illustrates a cross-sectional view of one embodiment of the preprocessed wafer, first insulation material layer, second insulation material layer, catalyst material layer, nanotube or nanowire, and a third insulation material layer.

FIG. 9A illustrates a cross-sectional view of one embodiment of preprocessed wafer 125*a*, first insulation material layer 124*c*, second insulation material layer 126, catalyst material layer 116, nanotube or nanowire 118*a*, and a third insulation material layer 124*d*. Insulation material, such as $SiO_2$, FSG, or other suitable dielectric material, is deposited over exposed portions of second insulation material layer 126, first insulation material layer 124*c*, landing pad 114, and nanotube or nanowire 118*a* to provide third insulation material layer 124*d*. Third insulation material layer 124*d* is deposited using CVD, ALD, MOCVD, PVD, JVP, or other suitable deposition technique.

Figure 9B:
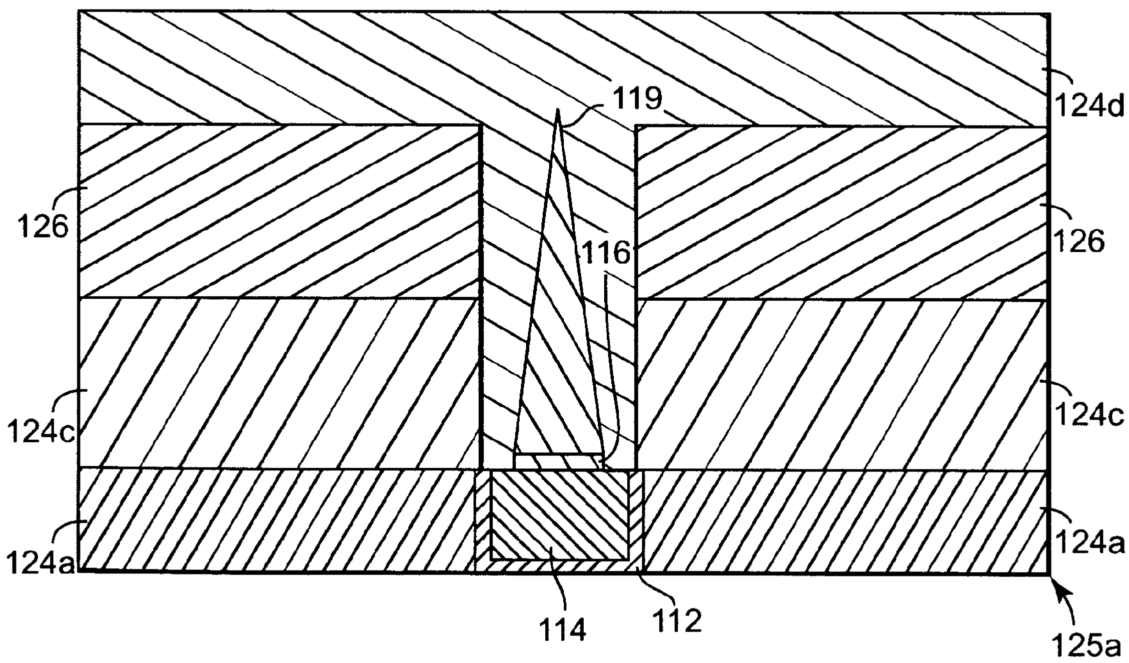
FIG. 9B illustrates a cross-sectional view of one embodiment of the preprocessed wafer, first insulation material layer, second insulation material layer, catalyst material layer, nanofiber, and a third insulation material layer.

FIG. 9B illustrates a cross-sectional view of one embodiment of preprocessed wafer 125*a*, first insulation material layer 124*c*, second insulation material layer 126, catalyst material layer 116, nanofiber 119, and a third insulation material layer 124*d*. Insulation material, such as $SiO_2$, FSG, or other suitable dielectric material, is deposited over exposed portions of second insulation material layer 126, first insulation material layer 124*c*, catalyst material layer 116, and nanofiber 119 to provide third insulation material layer 124*d*. Third insulation material layer 124*d* is deposited using CVD, ALD, MOCVD, PVD, JVP, or other suitable deposition technique.

Figure 10A:
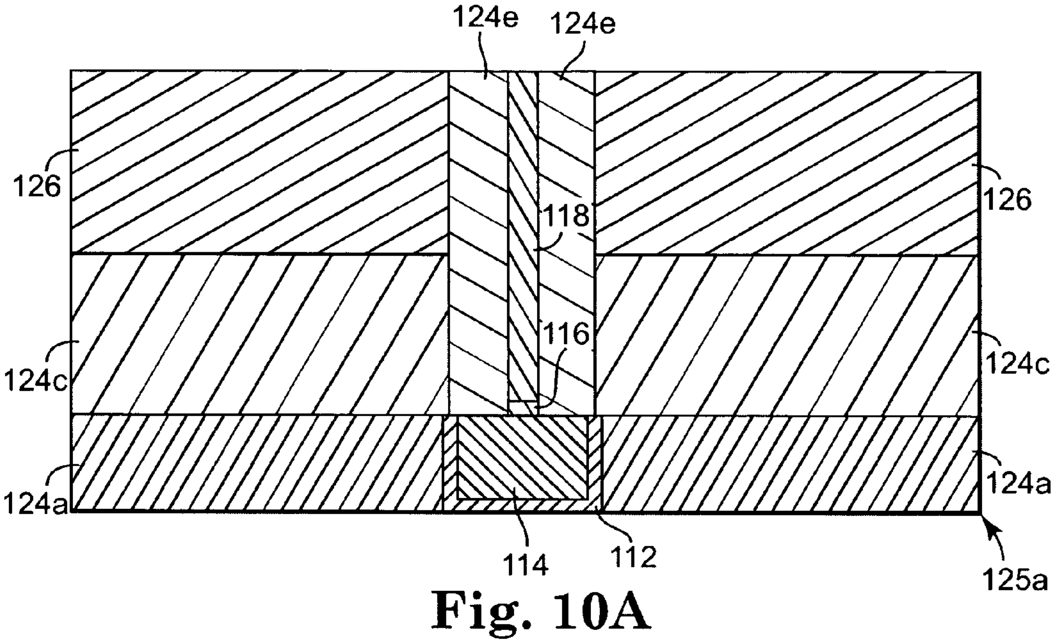
FIG. 10A illustrates a cross-sectional view of one embodiment of the preprocessed wafer, first insulation material layer, second insulation material layer, catalyst material layer, nanotube or nanowire, and third insulation material layer after planarization.

FIG. 10A illustrates a cross-sectional view of one embodiment of preprocessed wafer 125*a*, first insulation material layer 124*c*, second insulation material layer 126, catalyst material layer 116, nanotube or nanowire 118, and third insulation material layer 124*e* after planarization. Third insulation material layer 124*d* and nanotube or nanowire 118*a* is planarized to expose the top portion of second insulation material layer 126 to provide third insulation material layer 124*e* and nanotube or nanowire 118. Third insulation material layer 124*d* and nanotube or nanowire 118*a* is planarized using chemical mechanical planarization (CMP) or another suitable planarization process.

Figure 10B:
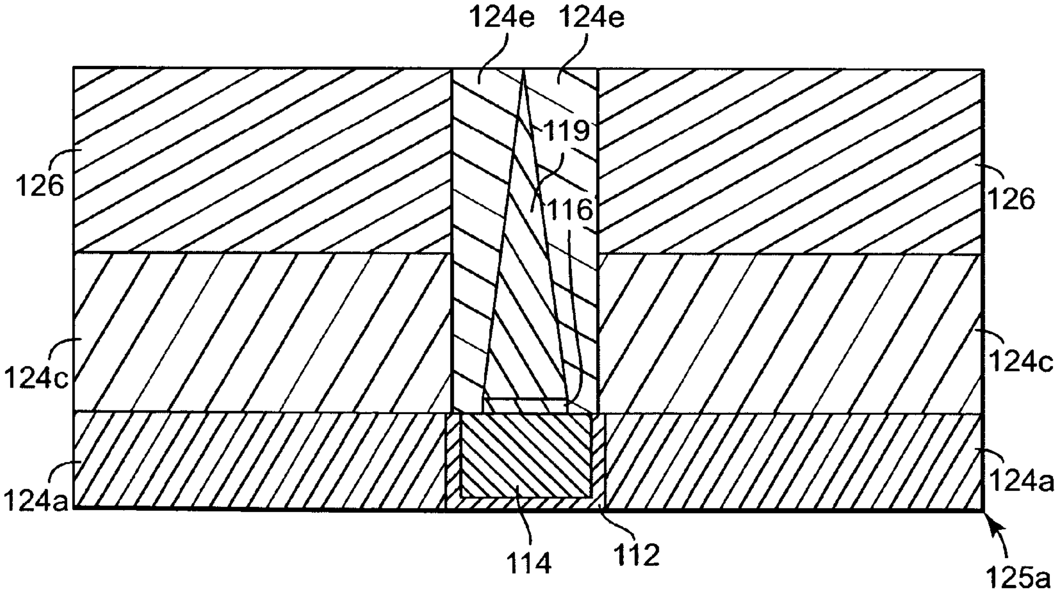
FIG. 10B illustrates a cross-sectional view of one embodiment of the preprocessed wafer, first insulation material layer, second insulation material layer, catalyst material layer, nanofiber, and third insulation material layer after planarization.

FIG. 10B illustrates a cross-sectional view of one embodiment of preprocessed wafer 125*a*, first insulation material layer 124*c*, second insulation material layer 126, catalyst material layer 116, nanofiber 119, and third insulation material layer 124*e* after planarization. Third insulation material layer 124*d* is planarized to expose second insulation material layer 126 to provide third insulation material layer 124*e*. Third insulation material layer 124*d* is planarized using CMP or another suitable planarization process.

Figure 11A:
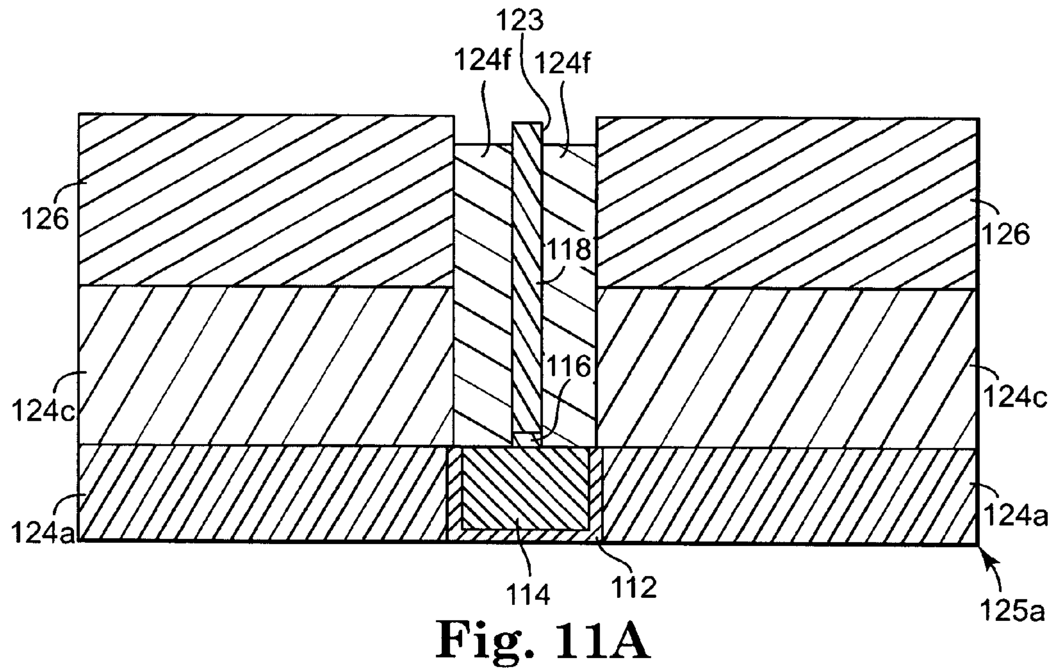
FIG. 11A illustrates a cross-sectional view of one embodiment of a preprocessed wafer, first insulation material layer, second insulation material layer, catalyst material layer, nanowire or nanofiber, and third insulation material layer after etching the third insulation material layer.

FIG. 11A illustrates a cross-sectional view of one embodiment of preprocessed wafer 125*a*, first insulation material layer 124*c*, second insulation material layer 126, catalyst material layer 116, nanotube or nanowire 118, and third insulation material layer 124*f* after etching third insulation material layer 124*e*. Third insulation material layer 124*e* is etched back using diluted HF or other suitable etchant to provide third insulation material layer 124*f* and to expose a top portion 123 of nanotube or nanowire 118. In another embodiment, third insulation material layer 124*e* is not etched back.

Figure 11B:
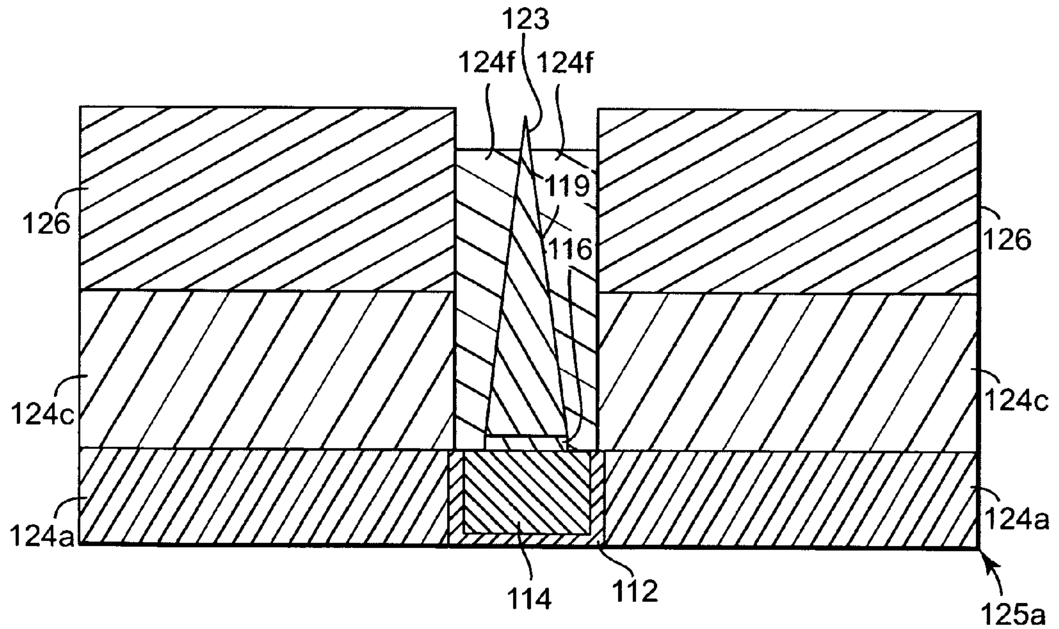
FIG. 11B illustrates a cross-sectional view of one embodiment of the preprocessed wafer, first insulation material layer, second insulation material layer, catalyst material layer, nanofiber, and third insulation material layer after etching the third insulation material layer.

FIG. 11B illustrates a cross-sectional view of one embodiment of preprocessed wafer 125*a*, first insulation material layer 124*c*, second insulation material layer 126, catalyst material layer 116, nanofiber 119, and third insulation material layer 124*f* after etching third insulation material layer 124*e*. Third insulation material layer 124*e* is etched back using diluted HF or other suitable etchant to provide third insulation material layer 124*f* and to expose a top portion 123 of nanofiber 119. In another embodiment, third insulation material layer 124*e* is not etched back.

Figure 12A:
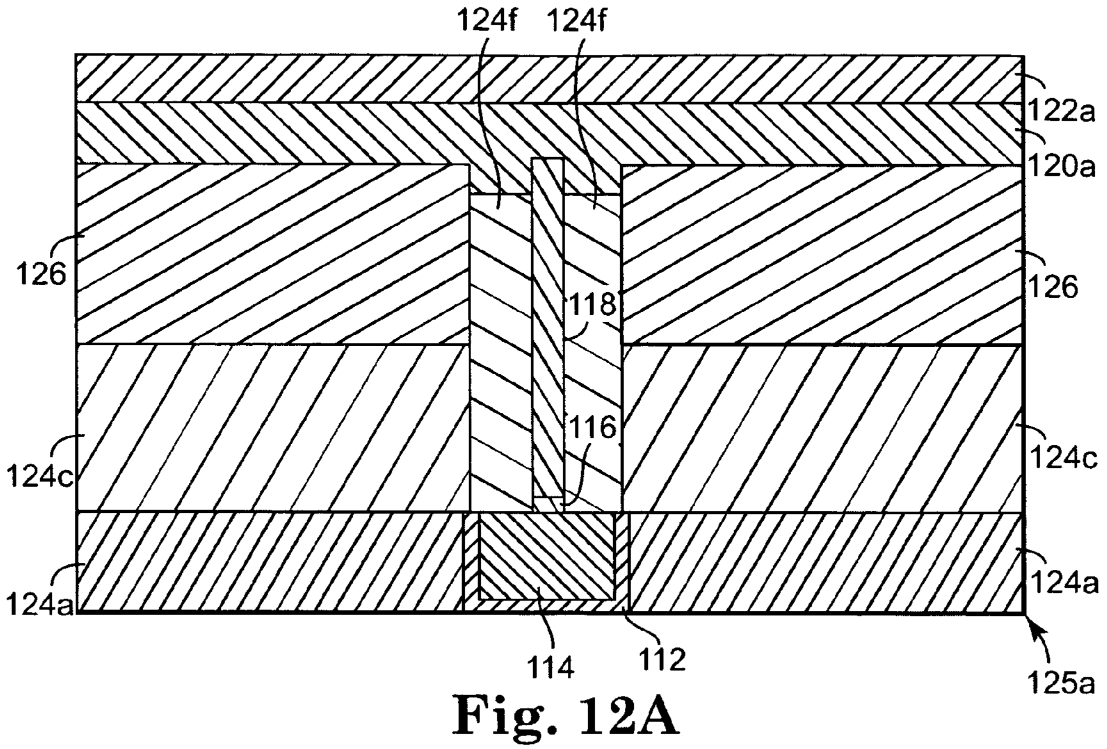
FIG. 12A illustrates a cross-sectional view of one embodiment of the preprocessed wafer, first insulation material layer, second insulation material layer, catalyst material layer, nanotube or nanowire, third insulation material layer, a phase-change material layer, and an electrode material layer.

FIG. 12A illustrates a cross-sectional view of one embodiment of preprocessed wafer 125*a*, first insulation material layer 124*c*, second insulation material layer 126, catalyst material layer 116, nanotube or nanowire 118, third insulation material layer 124*f*, a phase-change material layer 120*a*, and an electrode material layer 122*a*. Phase-change material, such as a calcogenic compound or other suitable phase-change material, is deposited over exposed portions of second insulation material layer 126, third insulation material layer 124*f*, and nanotube or nanowire 118 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 110*a* as illustrated in FIG. 2A.

Figure 12B:
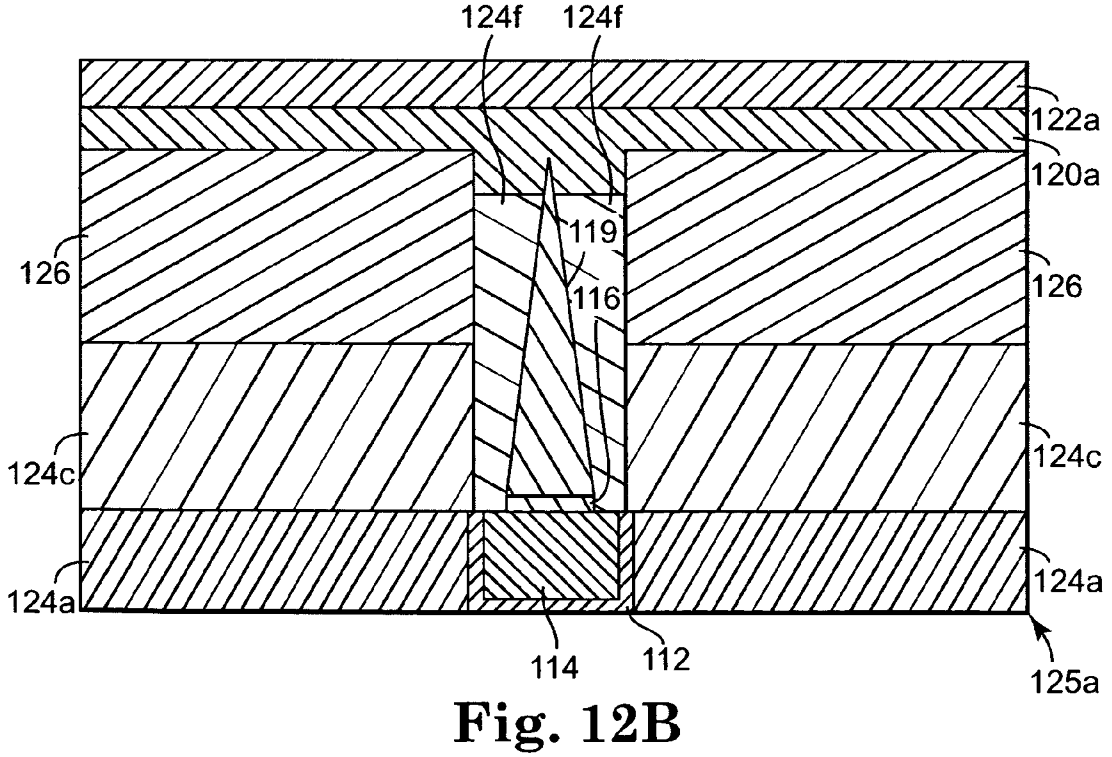
FIG. 12B illustrates a cross-sectional view of one embodiment of the preprocessed wafer, first insulation material layer, second insulation material layer, catalyst material layer, nanofiber, third insulation material layer, a phase-change material layer, and an electrode material layer.

FIG. 12B illustrates a cross-sectional view of preprocessed wafer 125*a*, first insulation material layer 124*c*, second insulation material layer 126, catalyst material layer 116, nanofiber 119, third insulation material layer 124*f*, a phase-change material layer 120*a*, and an electrode material layer 122*a*. Phase-change material, such as a calcogenic compound or other suitable phase-change material, is deposited over exposed portions of second insulation material layer 126, third insulation material layer 124*f*, and nanofiber 119 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 110*b* as illustrated in FIG. 2B.

Figure 13A:
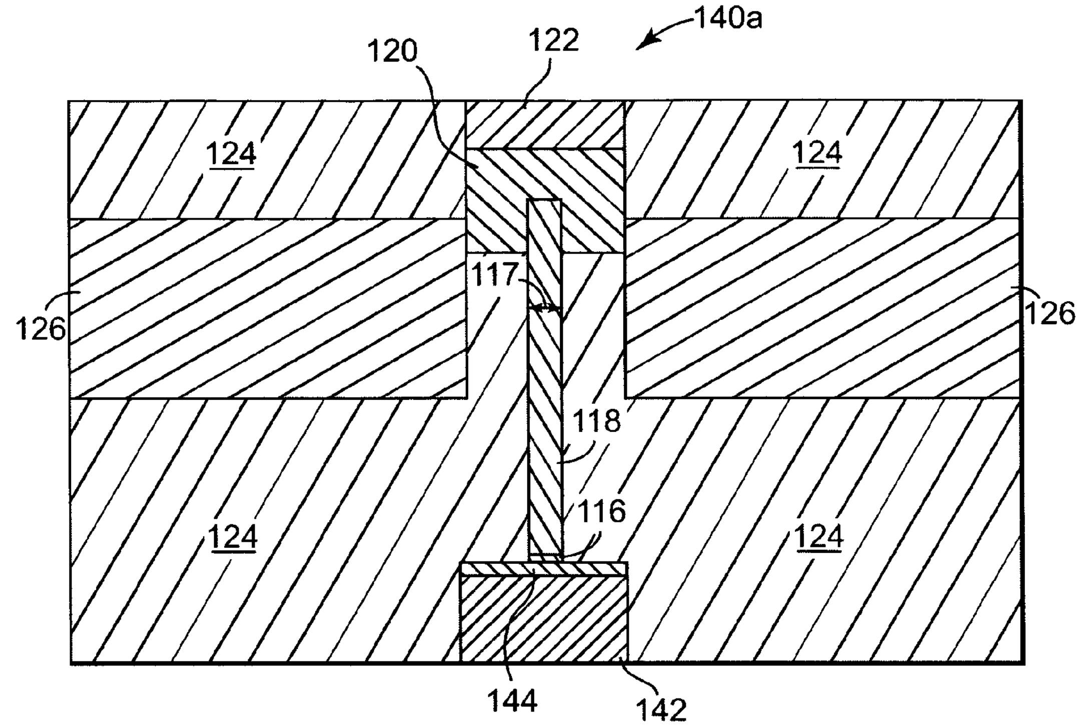
FIG. 13A illustrates a cross-sectional view of another embodiment of a phase-change memory cell.

FIG. 13A illustrates a cross-sectional view of another embodiment of a phase-change memory cell 140*a*. Phase-change memory cell 140*a* is similar to phase-change memory cell 110*a* except that landing pad 114 having liner 112 is replaced with a poly-Si landing pad 142 having a silicided top portion 144. Silicided top portion 144 enables selective electroless deposition of a catalyst material on surfaces where silicide is exposed. Phase-change memory cell 140*a* operates similarly to phase-change memory cell 110*a*.

Figure 13B:
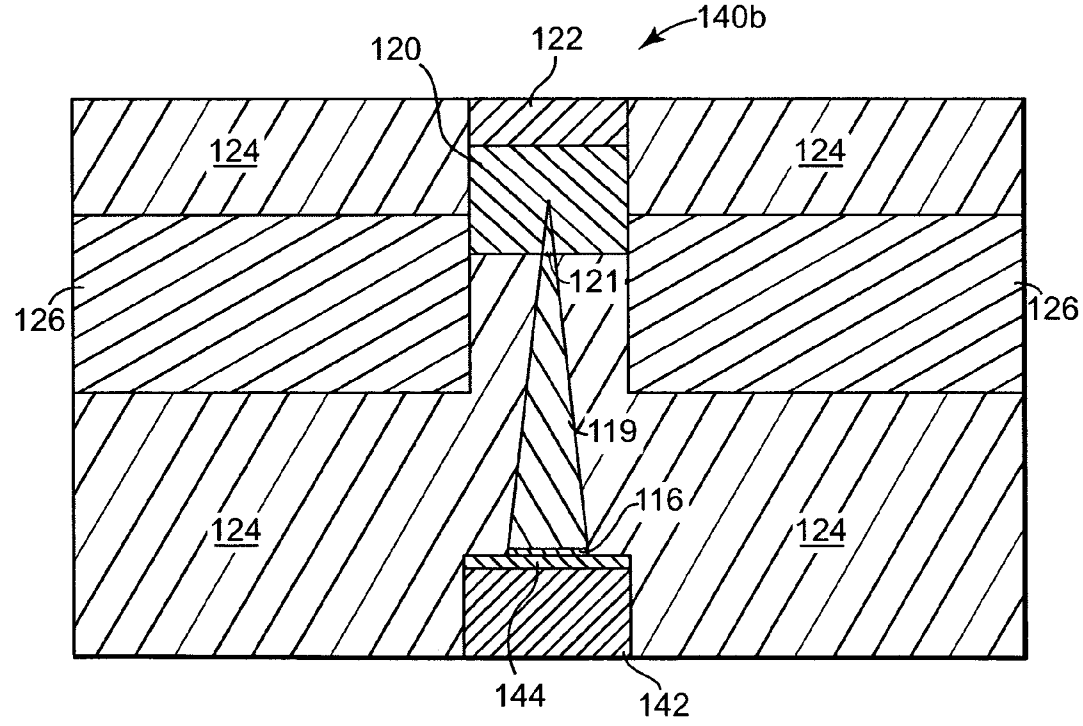
FIG. 13B illustrates a cross-sectional view of another embodiment of a phase-change memory cell.

FIG. 13B illustrates a cross-sectional view of another embodiment of a phase-change memory cell 140*b*. Phase-change memory cell 140*b* is similar to phase-change memory cell 140*a* except that first electrode 118 comprising a nanowire or nanotube is replaced with first electrode 119 comprising a nanofiber. Phase-change memory cell 140*b* operates similarly to phase-change memory cell 140*a*.

Figure 14:
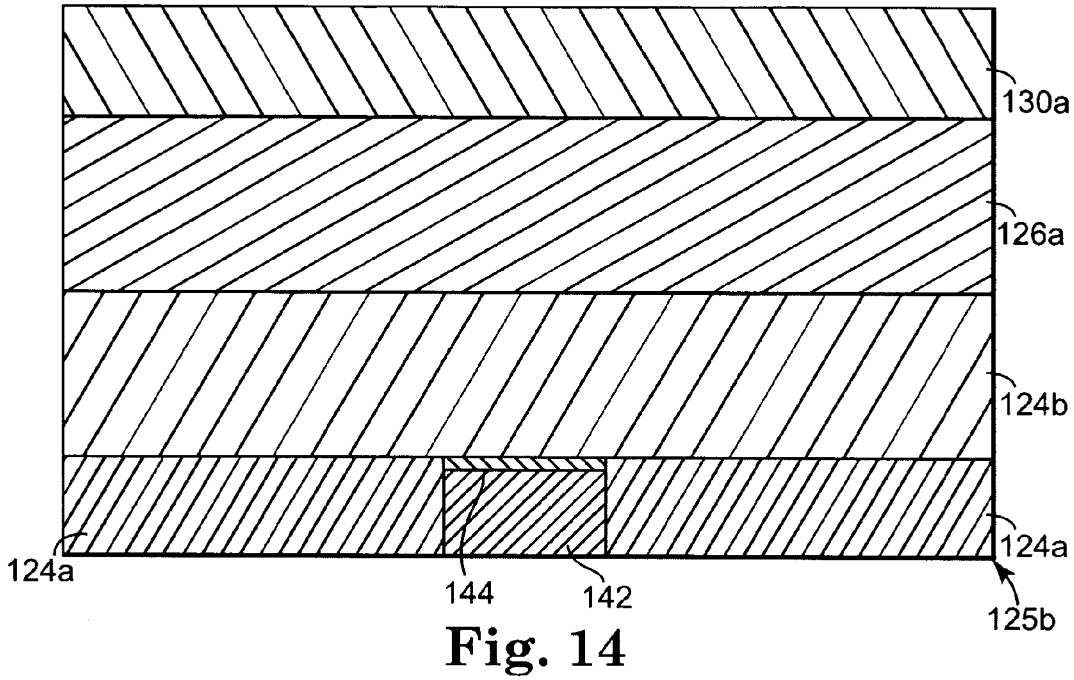
FIG. 14 illustrates a cross-sectional view of one embodiment of a preprocessed wafer, first insulation material layer, second insulation material layer, and photoresist layer.

FIG. 14 illustrates a cross-sectional view of one embodiment of a preprocessed wafer 125*b*, a first insulation material layer 124*b*, a second insulation material layer 126*a*, and a photoresist layer 130*a*. Preprocessed wafer 125*b* includes insulation material 124*a*, a poly-Si landing pad 142 having a silicided top portion 144, and lower wafer layers (not shown). In one embodiment, silicided top portion 144 is $TiSi_x$, $CoSi_x$, $NiSi_x$, or another suitable silicide. Insulation material 124*a* is $SiO_2$, FSG or other suitable dielectric material.

Insulation material, such as $SiO_2$, FSG, or other suitable dielectric material, is deposited over preprocessed wafer 125*b* to provide first insulation material layer 124*b*. First insulation material layer 124*b* is deposited using CVD, ALD, MOCVD, PVD, JVP, or other suitable deposition technique. Insulation material, such as $Si_3N_4$ or other suitable dielectric material, is deposited over first insulation material layer 124*b* to provide second insulation material layer 126*a*. Second insulation material layer 126*a* is deposited using CVD, ALD, MOCVD, PVD, JVP or other suitable deposition technique. Photoresist is spin coated or applied in another suitable manner over second insulation material layer 126*a* to provide photoresist layer 130*a*.

Figure 15:
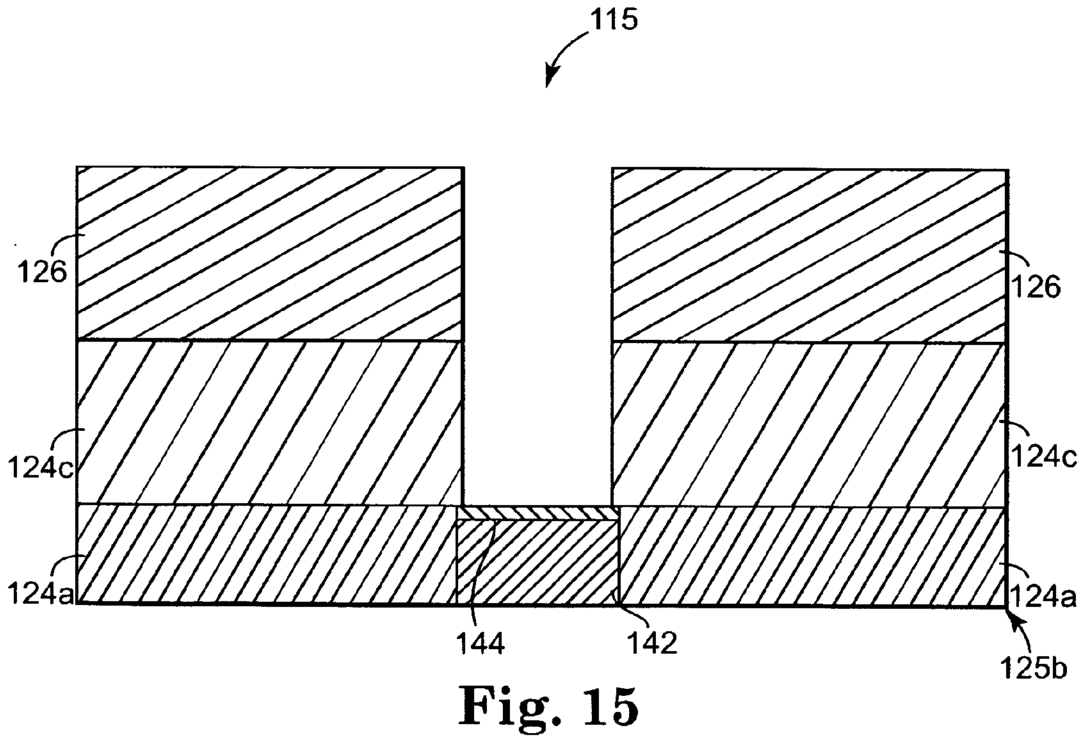
FIG. 15 illustrates a cross-sectional view of one embodiment of the preprocessed wafer, first insulation material layer, and second insulation material layer after etching the first insulation material layer and the second insulation material layer and removing the photoresist layer.

FIG. 15 illustrates a cross-sectional view of one embodiment of preprocessed wafer 125*b*, first insulation material layer 124*c*, and second insulation material layer 126 after etching second insulation material layer 126*a* and first insulation material layer 124*b* and removing photoresist layer 130*a*. Optical lithography is used to pattern opening 115 in photoresist layer 130*a*. The exposed portion of second insulation material layer 126*a* is etched and then the exposed portion of first insulation material layer 124*b* is etched to provide second insulation material layer 126 and first insulation material layer 124*c* and to expose top portion 144 of landing pad 142.

Figure 16:
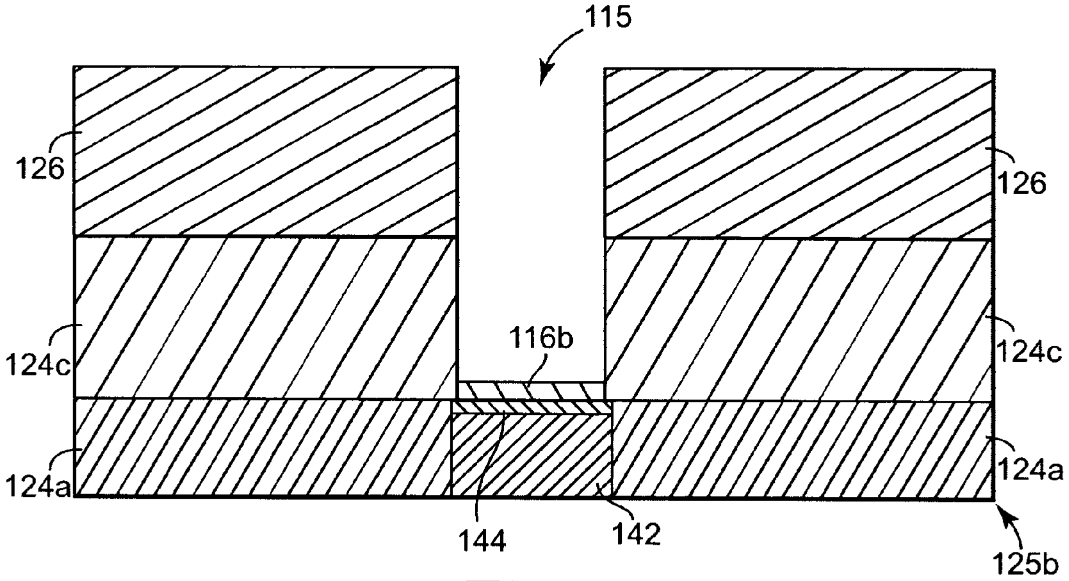
FIG. 16 illustrates a cross-sectional view of one embodiment of the preprocessed wafer, first insulation material layer, second insulation material layer, and a catalyst material layer.

FIG. 16 illustrates a cross-sectional view of one embodiment of preprocessed wafer 125*b*, first insulation material layer 124*c*, second insulation material layer 126, and a catalyst material layer 116*b*. A catalyst material, such as a silicide forming metal such as Ti, Pd, Pt, Au, Cu, Co, Cr, Hf, Ir, Mn, Mo, Ni, Rh, Ta, W, Zr, or other suitable catalyst material, is selectively deposited over top portion 144 of landing pad 142 to provide catalyst material layer 116*b*. Catalyst material layer 116*b* is deposited by selective electroless deposition or other suitable deposition technique.

Figure 17:
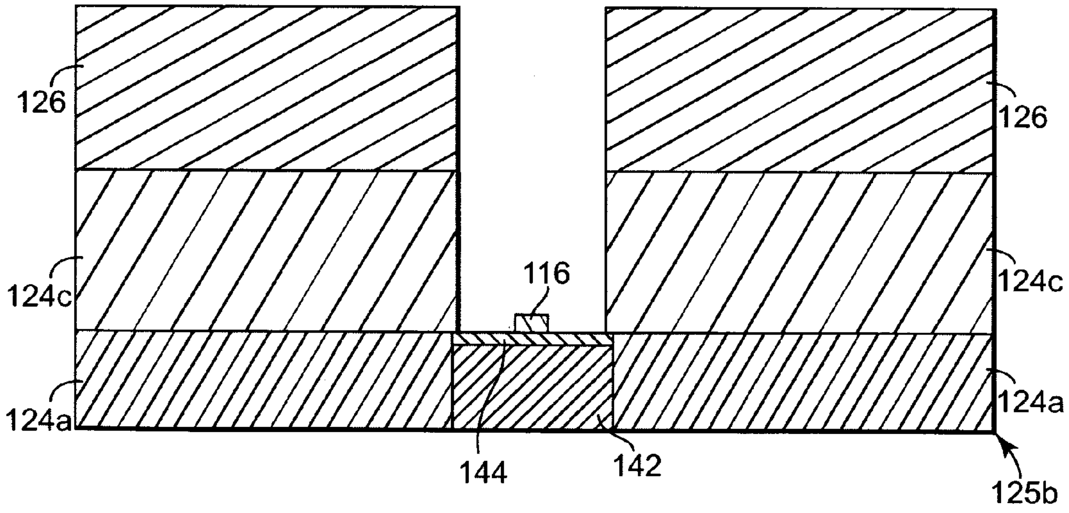
FIG. 17 illustrates a cross-sectional view of one embodiment of the preprocessed wafer, first insulation material layer, second insulation material layer, and catalyst material layer after heating the catalyst material layer.

FIG. 17 illustrates a cross-sectional view of one embodiment of preprocessed wafer 125*b*, first insulation material layer 124*c*, second insulation material layer 126, and catalyst material layer 116 after heating catalyst material layer 116*b*. In one embodiment, catalyst material layer 116*b* is heated to reduce the area of the catalyst material by coagulation to provide catalyst material layer 116. Catalyst material layer 116 defines the area on which a nanotube, nanowire, or nanofiber is grown.

Figure 18A:
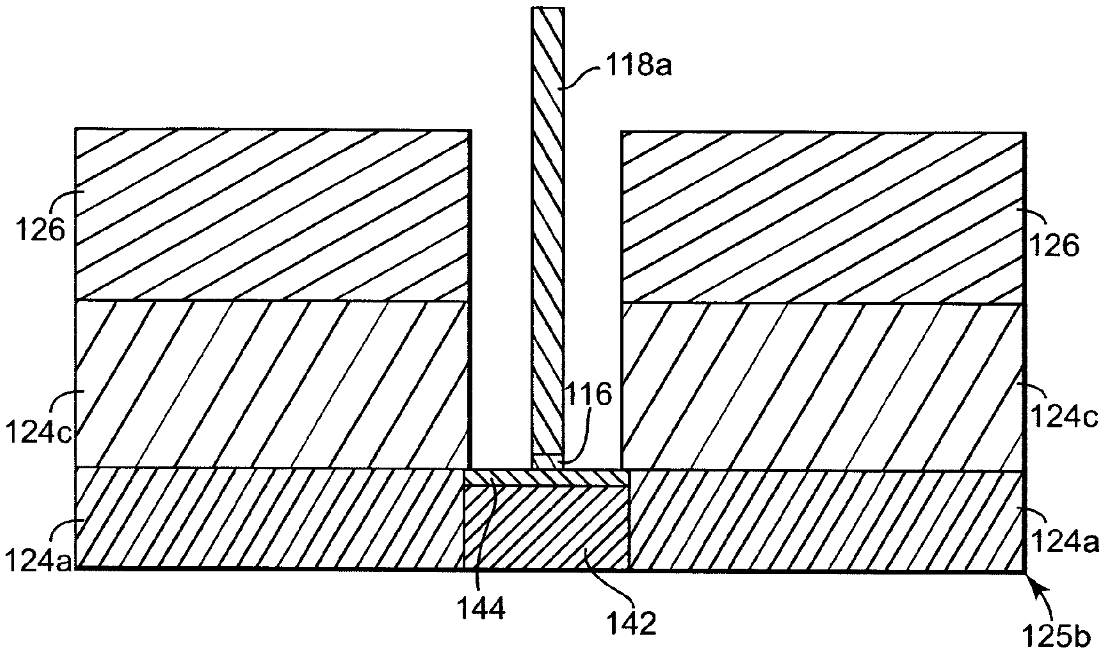
FIG. 18A illustrates a cross-sectional view of one embodiment of the preprocessed wafer, first insulation material layer, second insulation material layer, catalyst material layer, and a nanowire or nanotube.

FIG. 18A illustrates a cross-sectional view of one embodiment of preprocessed wafer 125*b*, first insulation material layer 124*c*, second insulation material layer 126, catalyst material layer 116, and a nanotube or nanowire 118*a*. Nanotube or nanowire 118*a* is grown on catalyst material layer 116 to provide a first electrode. Nanotube or nanowire 118*a* is a silicon based, carbon based, or other suitable material based nanotube or nanowire.

Figure 18B:
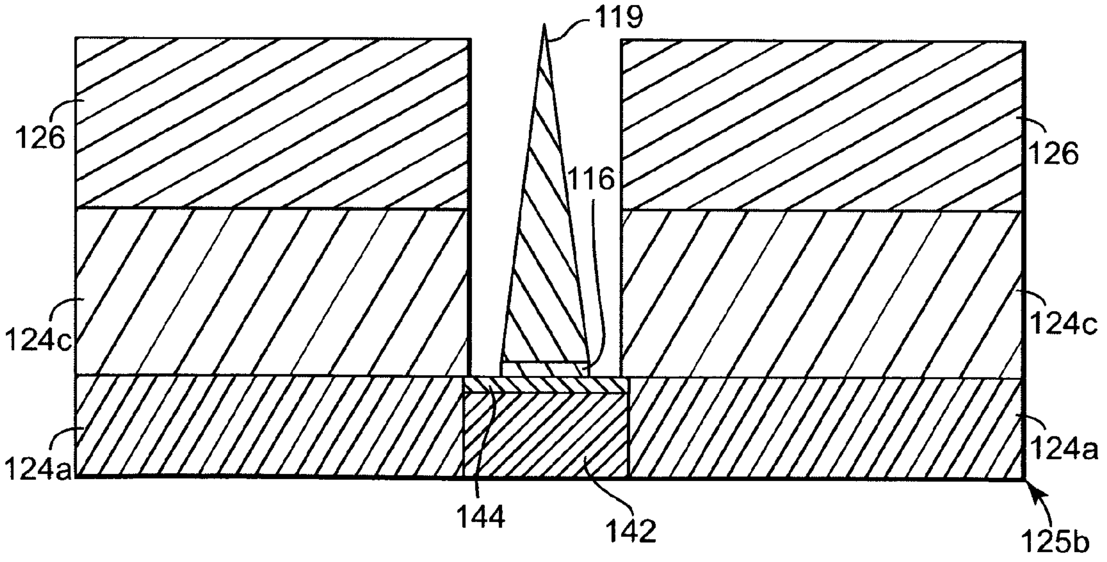
FIG. 18B illustrates a cross-sectional view of one embodiment of the preprocessed wafer, first insulation material layer, second insulation material layer, catalyst material layer, and a nanofiber.

FIG. 18B illustrates a cross-sectional view of one embodiment of preprocessed wafer 125*b*, first insulation material layer 124*c*, second insulation material layer 126, catalyst material layer 116, and a nanofiber 119. Nanofiber 119 is grown on catalyst material layer 116 to provide a first electrode. Nanofiber 119 is a silicon based, carbon based, or other suitable material based nanofiber.

Figure 19A:
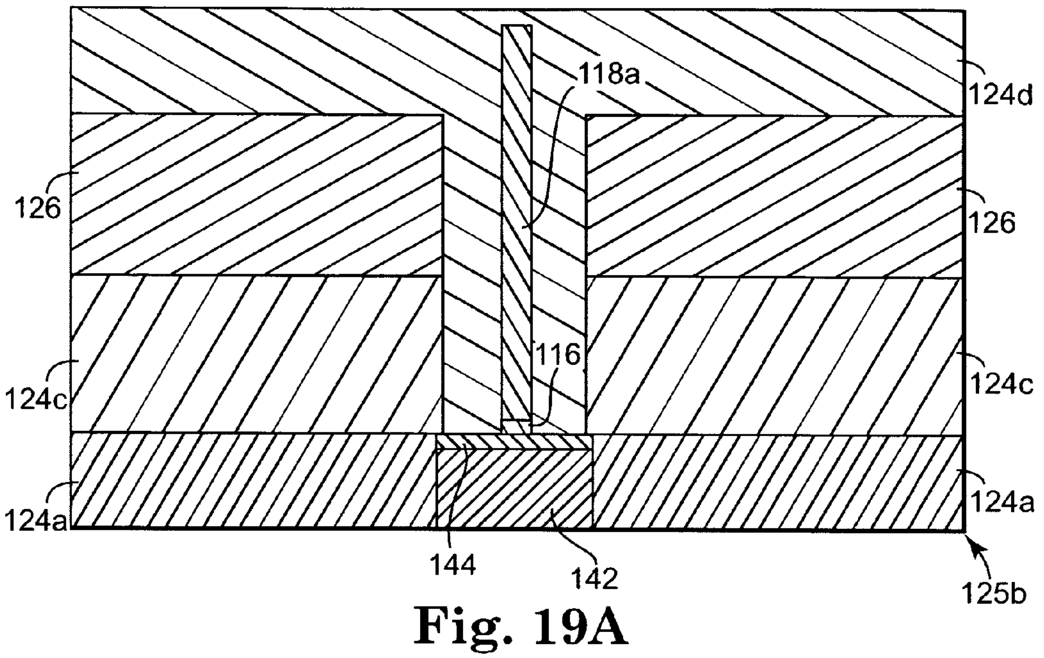
FIG. 19A illustrates a cross-sectional view of one embodiment of the preprocessed wafer, first insulation material layer, second insulation material layer, catalyst material layer, nanowire or nanotube, and a third insulation material layer.

FIG. 19A illustrates a cross-sectional view of one embodiment of preprocessed wafer 125*b*, first insulation material layer 124*c*, second insulation material layer 126, catalyst material layer 116, nanotube or nanowire 118*a*, and a third insulation material layer 124*d*. Insulation material, such as $SiO_2$, FSG, or other suitable dielectric material, is deposited over exposed portions of second insulation material layer 126, first insulation material layer 124*c*, top portion 144 of landing pad 142, and nanotube or nanowire 118*a* to provide third insulation material layer 124*d*. Third insulation material layer 124*d* is deposited using CVD, ALD, MOCVD, PVD, JVP, or other suitable deposition technique.

Figure 19B:
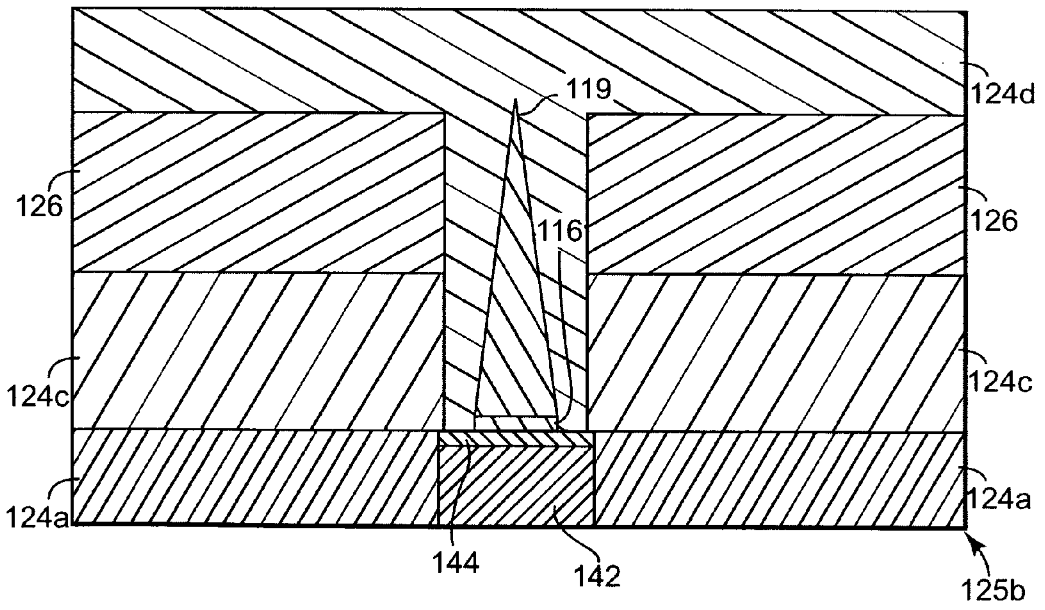
FIG. 19B illustrates a cross-sectional view of one embodiment of the preprocessed wafer, first insulation material layer, second insulation material layer, catalyst material layer, nanofiber, and a third insulation material layer.

FIG. 19B illustrates a cross-sectional view of one embodiment of preprocessed wafer 125*b*, first insulation material layer 124*c*, second insulation material layer 126, catalyst material layer 116, nanofiber 119, and a third insulation material layer 124*d*. Insulation material, such as $SiO_2$, FSG, or other suitable dielectric material, is deposited over exposed portions of second insulation material layer 126, first insulation material layer 124*c*, catalyst material layer 116, and nanofiber 119 to provide third insulation material layer 124*d*. Third insulation material layer 124*d* is deposited using CVD, ALD, MOCVD, PVD, JVP, or other suitable deposition technique.

Figure 20A:
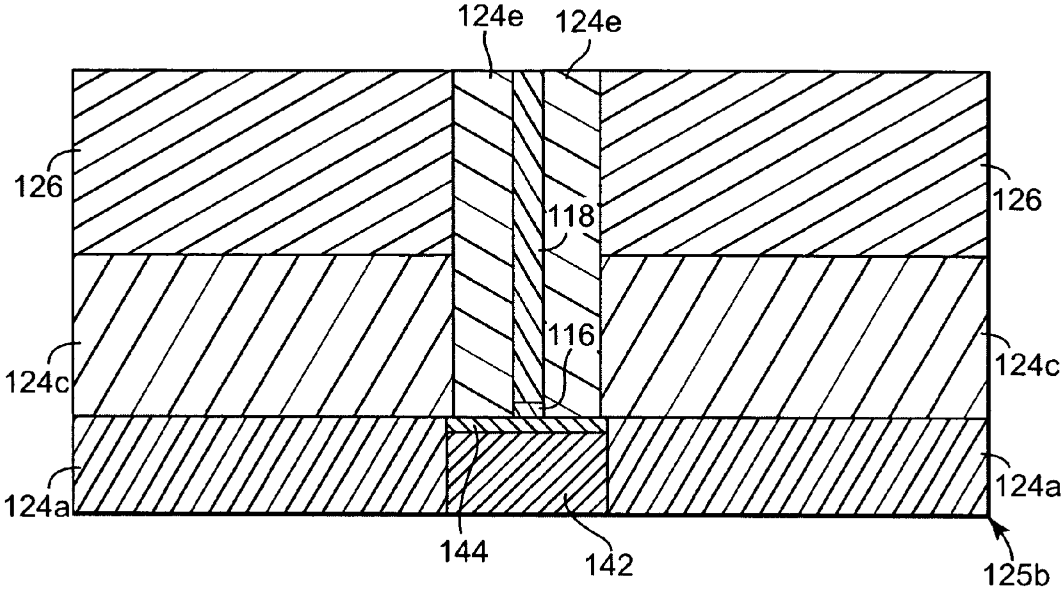
FIG. 20A illustrates a cross-sectional view of one embodiment of the preprocessed wafer, first insulation material layer, second insulation material layer, catalyst material layer, nanowire or nanotube, and third insulation material layer after planarization.

FIG. 20A illustrates a cross-sectional view of one embodiment of preprocessed wafer 125*b*, first insulation material layer 124*c*, second insulation material layer 126, catalyst material layer 116, nanotube or nanowire 118, and third insulation material layer 124*e* after planarization. Third insulation material layer 124*d* and nanotube or nanowire 118*a* is planarized to expose second insulation material layer 126 to provide third insulation material layer 124*e* and nanotube or nanowire 118. Third insulation material layer 124*d* and nanotube or nanowire 118*a* is planarized using CMP or another suitable planarization process.

Figure 20B:
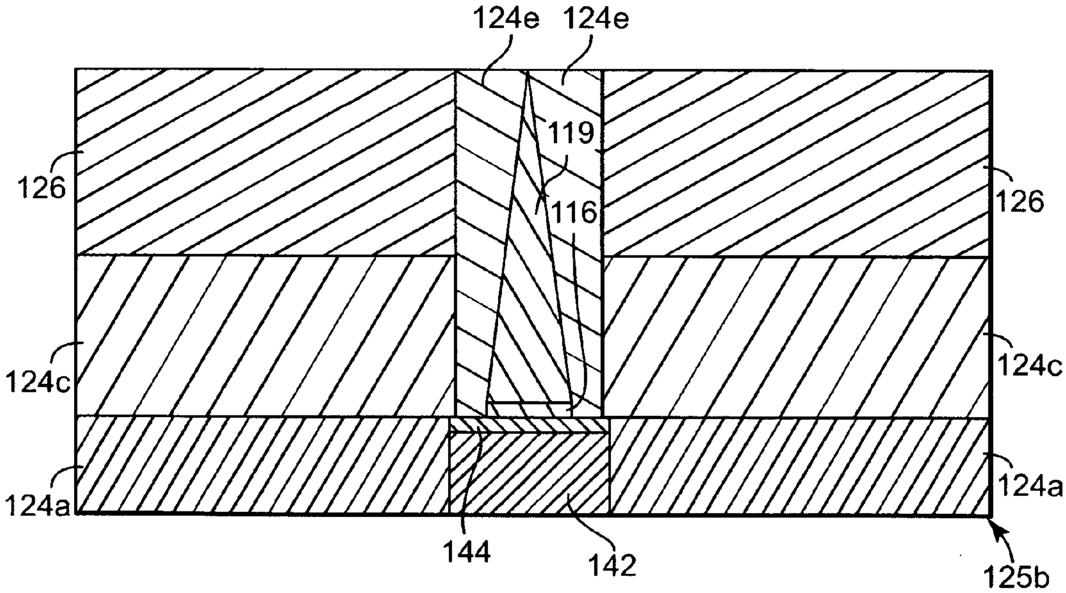
FIG. 20B illustrates a cross-sectional view of one embodiment of the preprocessed wafer, first insulation material layer, second insulation material layer, catalyst material layer, nanofiber, and third insulation material layer after planarization.

FIG. 20B illustrates a cross-sectional view of one embodiment of preprocessed wafer 125*b*, first insulation material layer 124*c*, second insulation material layer 126, catalyst material layer 116, nanofiber 119, and third insulation material layer 124*e* after planarization. Third insulation material layer 124*d* is planarized to expose second insulation material layer 126 to provide third insulation material layer 124*e*. Third insulation material layer 124*d* is planarized using CMP or another suitable planarization process.

Figure 21A:
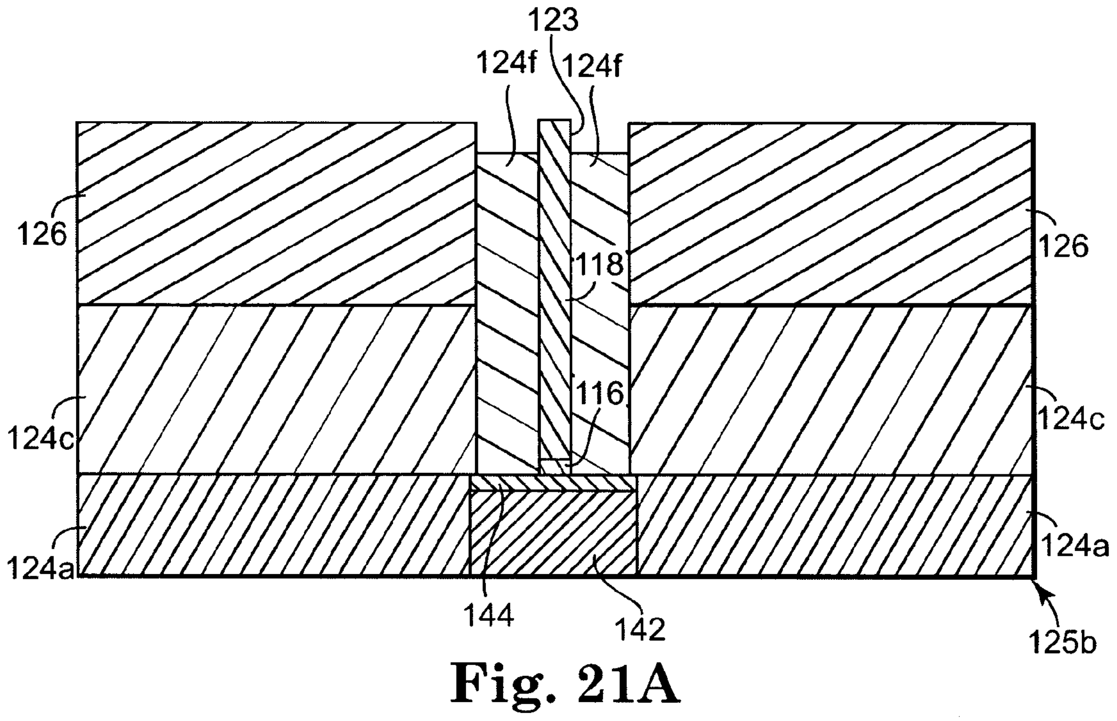
FIG. 21A illustrates a cross-sectional view of one embodiment of the preprocessed wafer, first insulation material layer, second insulation material layer, catalyst material layer, nanotube or nanowire, and third insulation material layer after etching the third insulation material layer.

FIG. 21A illustrates a cross-sectional view of one embodiment of preprocessed wafer 125*b*, first insulation material layer 124*c*, second insulation material layer 126, catalyst material layer 116, nanotube or nanowire 118, and third insulation material layer 124*f* after etching third insulation material layer 124*e*. Third insulation material layer 124*e* is etched back using diluted HF or other suitable etchant to provide third insulation material layer 124*f* and to expose a top portion 123 of nanotube or nanowire 118. In another embodiment, third insulation material layer 124*e* is not etched back.

Figure 21B:
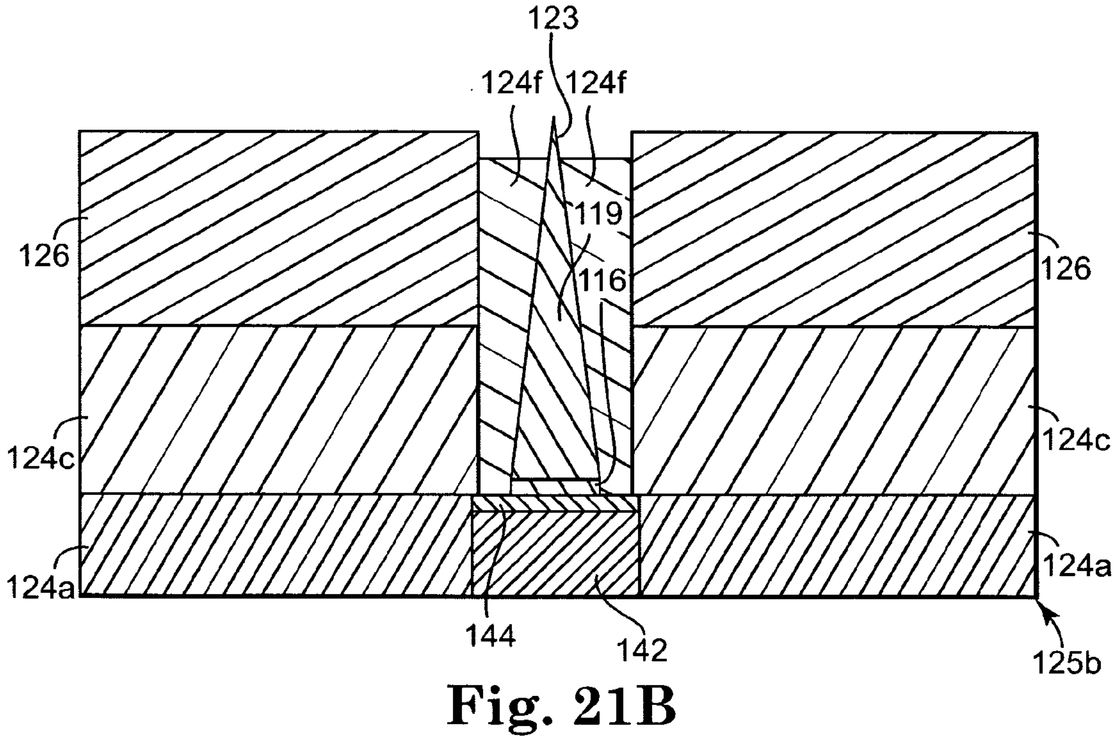
FIG. 21B illustrates a cross-sectional view of one embodiment of the preprocessed wafer, first insulation material layer, second insulation material layer, catalyst material layer, nanofiber, and third insulation material layer after etching the third insulation material layer.

FIG. 21B illustrates a cross-sectional view of one embodiment of preprocessed wafer 125*b*, first insulation material layer 124*c*, second insulation material layer 126, catalyst material layer 116, nanofiber 119, and third insulation material layer 124*f* after etching third insulation material layer 124*e*. Third insulation material layer 124*e* is etched back using diluted HF or other suitable etchant to provide third insulation material layer 124*f* and to expose a top portion 123 of nanofiber 119. In another embodiment, third insulation material layer 124*e* is not etched back.

Figure 22A:
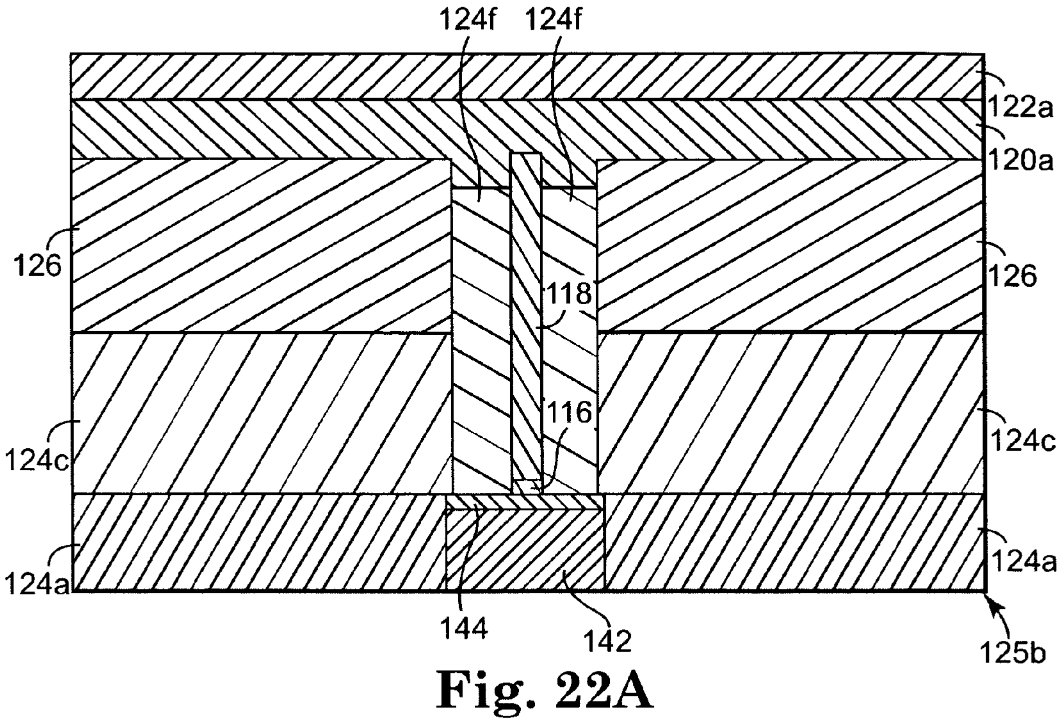
FIG. 22A illustrates a cross-sectional view of one embodiment of the preprocessed wafer, first insulation material layer, second insulation material layer, catalyst material layer, nanotube or nanowire, third insulation material layer, a phase-change material layer, and an electrode material layer.

FIG. 22A illustrates a cross-sectional view of one embodiment of preprocessed wafer 125*b*, first insulation material layer 124*c*, second insulation material layer 126, catalyst material layer 116, nanotube or nanowire 118, third insulation material layer 124*f*, a phase-change material layer 120*a*, and an electrode material layer 122*a*. Phase-change material, such as a chalcogenic compound or other suitable phase-change material, is deposited over exposed portions of second insulation material layer 126, third insulation material layer 124*f*, and nanotube or nanowire 118 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120a to provide electrode material layer 122a. Electrode material layer 122a is deposited using CVD, ALD, MOCVD, PVD, JVP, or other suitable deposition technique. Phase-change material layer 120a and electrode material layer 122a are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 140a as illustrated in FIG. 13A.

Figure 22B:
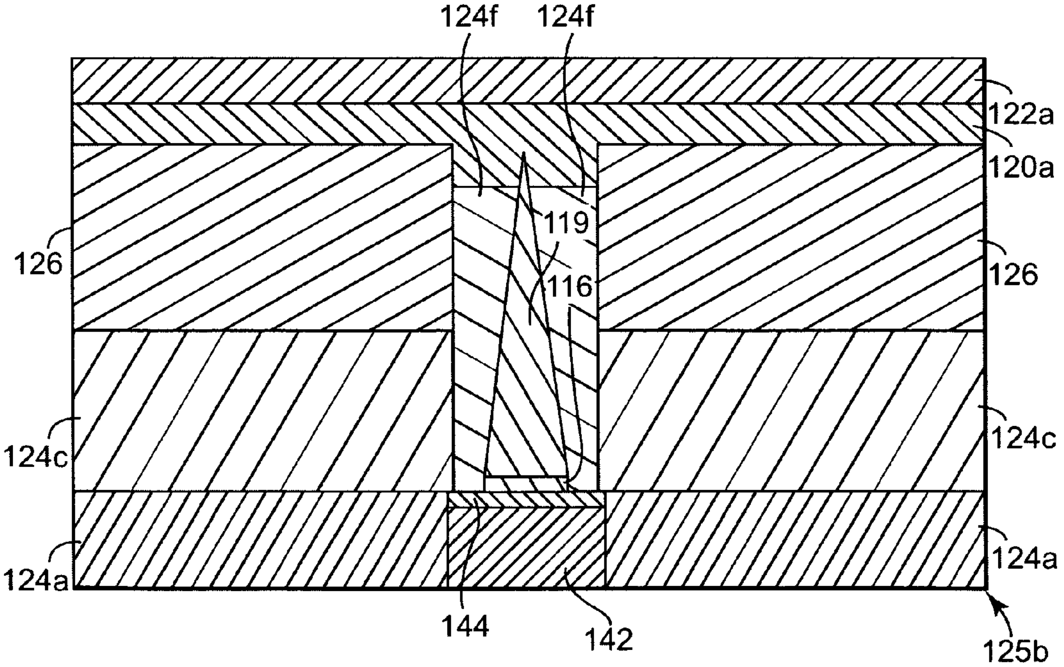
FIG. 22B illustrates a cross-sectional view of one embodiment of the preprocessed wafer, first insulation material layer, second insulation material layer, catalyst material layer, nanofiber, third insulation material layer, a phase-change material layer, and an electrode material layer.

FIG. 22B illustrates a cross-sectional view of preprocessed wafer 125b, first insulation material layer 124c, second insulation material layer 126, catalyst material layer 116, nanofiber 119, third insulation material layer 124f, a phase-change material layer 120a, and an electrode material layer 122a. Phase-change material, such as a chalcogenic compound or other suitable phase-change material, is deposited over exposed portions of second insulation material layer 126, third insulation material layer 124f, and nanofiber 119 to provide phase-change material layer 120a. Phase-change material layer 120a is deposited using CVD, ALD, MOCVD, PVD, JVP, or other suitable deposition technique.

Electrode material, such as TiN, TaN, W, Al, Cu, or other suitable electrode material, is deposited over phase-change material layer 120a to provide electrode material layer 122a. Electrode material layer 122a is deposited using CVD, ALD, MOCVD, PVD, JVP, or other suitable deposition technique. Phase-change material layer 120a and electrode material layer 122a are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 140b as illustrated in FIG. 13B.

Figure 23A:
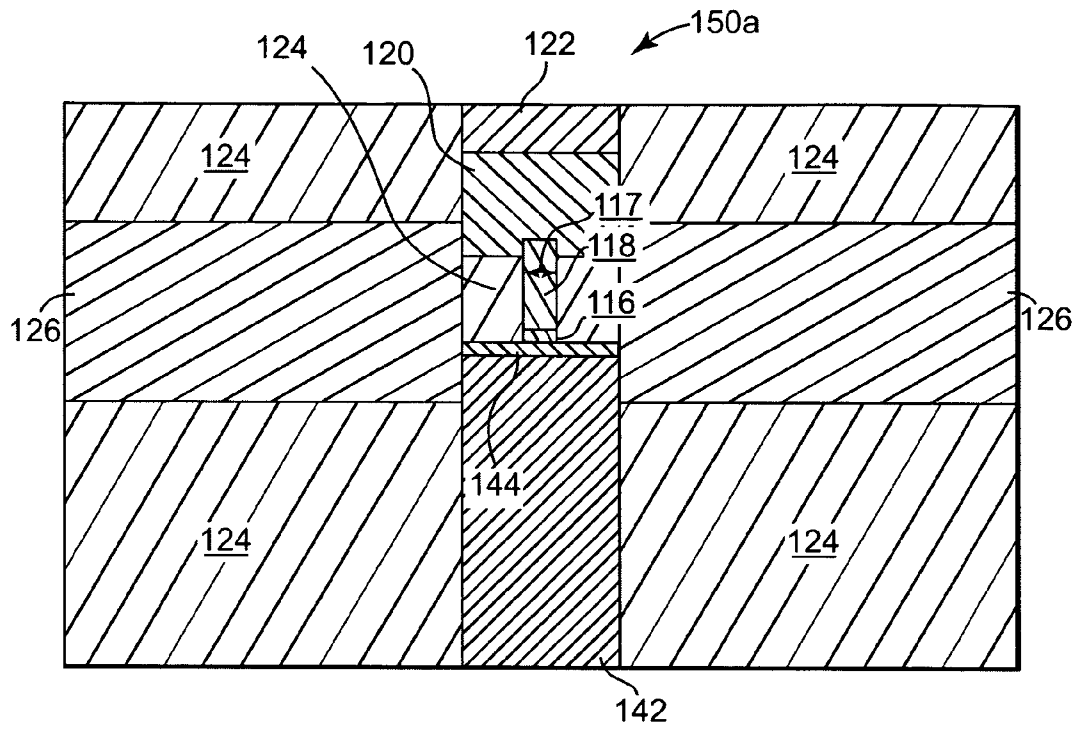
FIG. 23A illustrates a cross-sectional view of another embodiment of a phase-change memory cell.

FIG. 23A illustrates a cross-sectional view of another embodiment of a phase-change memory cell 150a. Phase-change memory cell 150a is similar to phase-change memory cell 140a except that first electrode 118 comprising a nanotube or nanowire is shorter. Phase-change memory cell 150a operates similarly to phase-change memory cell 140a.

Figure 23B:
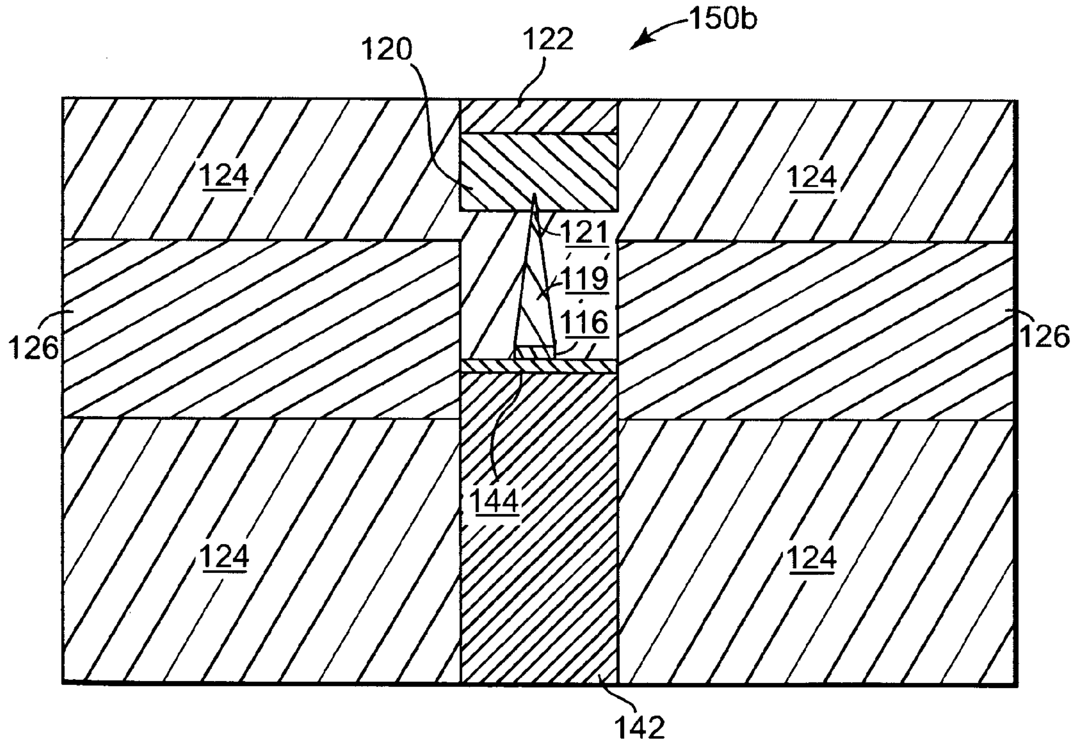
FIG. 23B illustrates a cross-sectional view of another embodiment of a phase-change memory cell.

FIG. 23B illustrates a cross-sectional view of another embodiment of a phase-change memory cell 150b. Phase-change memory cell 150b is similar to phase-change memory cell 150a except that first electrode 118 comprising a nanowire or nanotube is replaced with first electrode 119 comprising a nanofiber. Phase-change memory cell 150b operates similarly to phase-change memory cell 150a.

Figure 24:
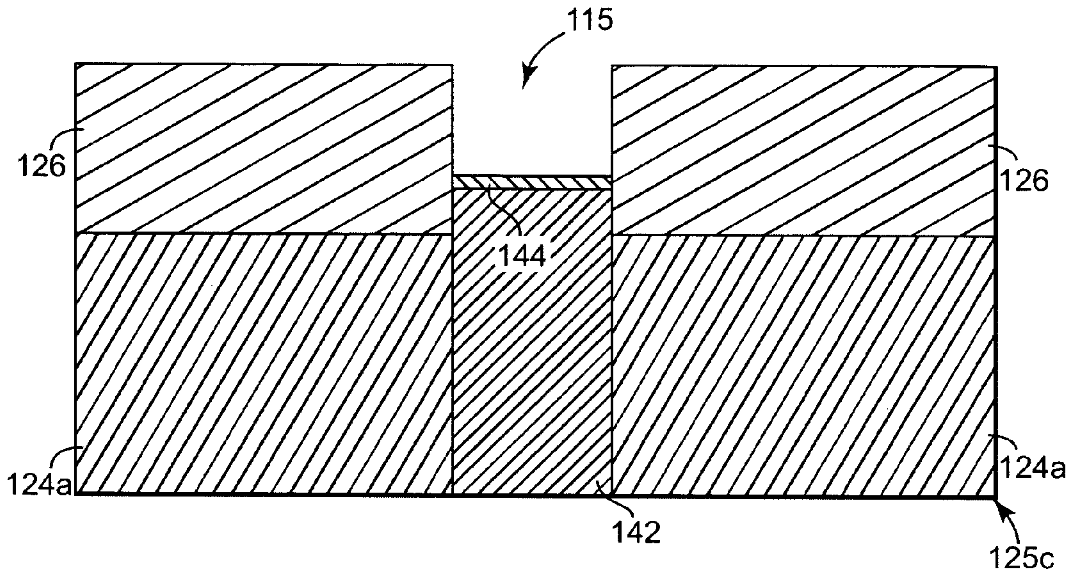
FIG. 24 illustrates a cross-sectional view of one embodiment of a preprocessed wafer.

FIG. 24 illustrates a cross-sectional view of one embodiment of a preprocessed wafer 125c. Preprocessed wafer 125c includes insulation material 124a and 126, a poly-Si landing pad 142 having a silicided top portion 144, and lower wafer layers (not shown). In one embodiment, silicided top portion 144 is $TiSi_x$, $CoSi_x$, $NiSi_x$, or another suitable silicide. Insulation material 124a is $SiO_2$, FSG, or other suitable dielectric material. Insulation material 126 is $Si_3N_4$ or other suitable dielectric material. An opening 115 is formed in insulation material 126 to expose top portion 144 of landing pad 142.

Figure 25:
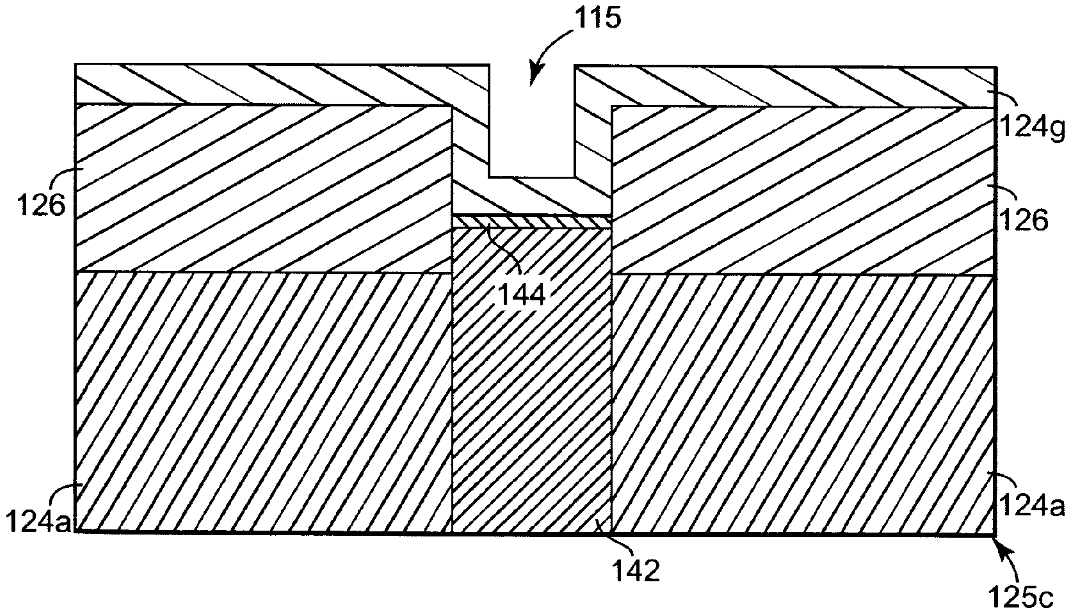
FIG. 25 illustrates a cross-sectional view of one embodiment of the preprocessed wafer and a first insulation material layer.

FIG. 25 illustrates a cross-sectional view of one embodiment of preprocessed wafer 125c and a first insulation material layer 124g. Insulation material, such as $SiO_2$, FSG, or other suitable dielectric material, is deposited over preprocessed wafer 125c to provide first insulation material layer 124g. First insulation material layer 124g is deposited using CVD, ALD, MOCVD, PVD, JVP, or other suitable deposition technique.

Figure 26:
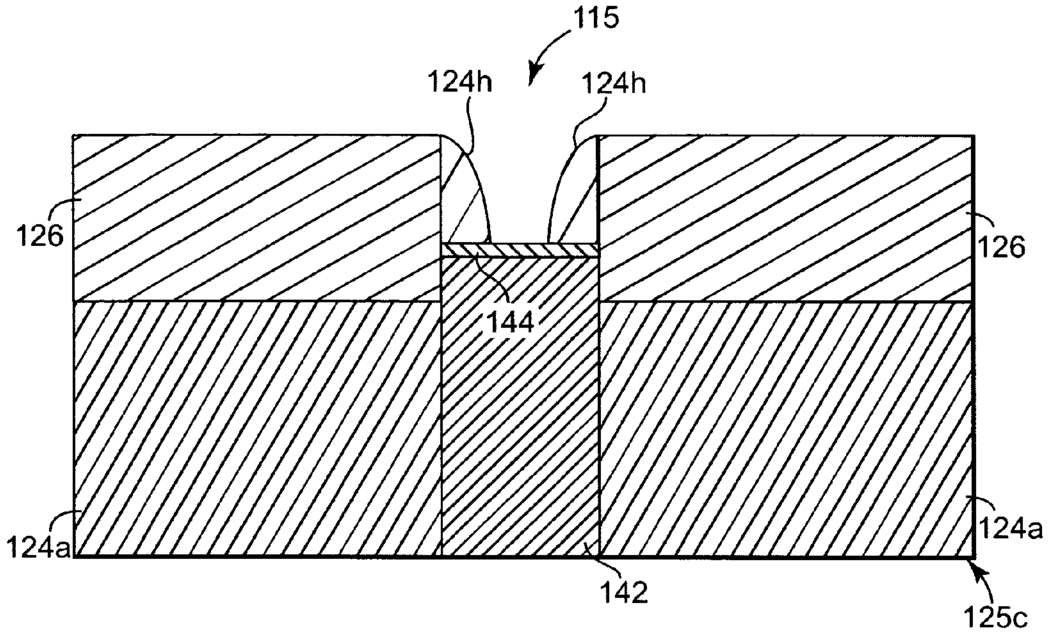
FIG. 26 illustrates a cross-sectional view of one embodiment of the preprocessed wafer and first insulation material layer after etching the first insulation material layer.

FIG. 26 illustrates a cross-sectional view of one embodiment of preprocessed wafer 125c and first insulation material layer 124h after etching first insulation material layer 124g. First insulation material layer 124g is anisotropically etched to provide the spacers of first insulation material layer 124h. The spacers reduce the width or cross-section of the exposed top portion 144 of landing pad 142 within opening 115.

Figure 27:
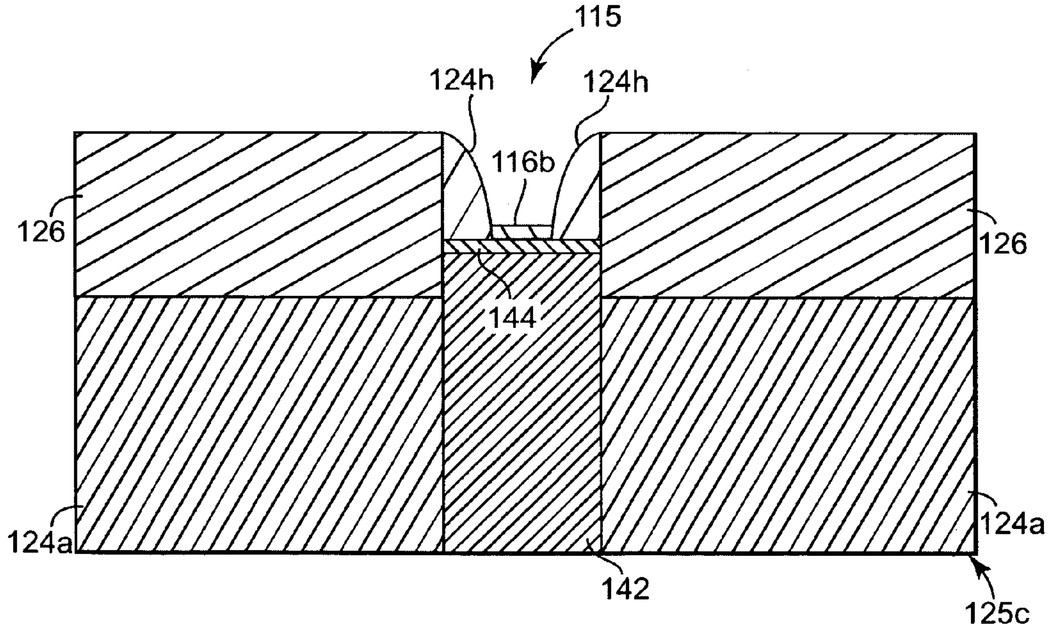
FIG. 27 illustrates a cross-sectional view of one embodiment of the preprocessed wafer, first insulation material layer, and a catalyst material layer.

FIG. 27 illustrates a cross-sectional view of one embodiment of preprocessed wafer 125c, first insulation material layer 124h, and a catalyst material layer 116b. A catalyst material, such as a silicide forming metal such as Ti, Pd, Pt, Au, Cu, Co, Cr, Hf, Ir, Mn, Mo, Ni, Rh, Ta, W, Zr, or other suitable catalyst material, is selectively deposited over exposed top portion 144 of landing pad 142 to provide catalyst material layer 116b. Catalyst material layer 116b is deposited by selective electroless deposition or other suitable deposition technique.

Figure 28:
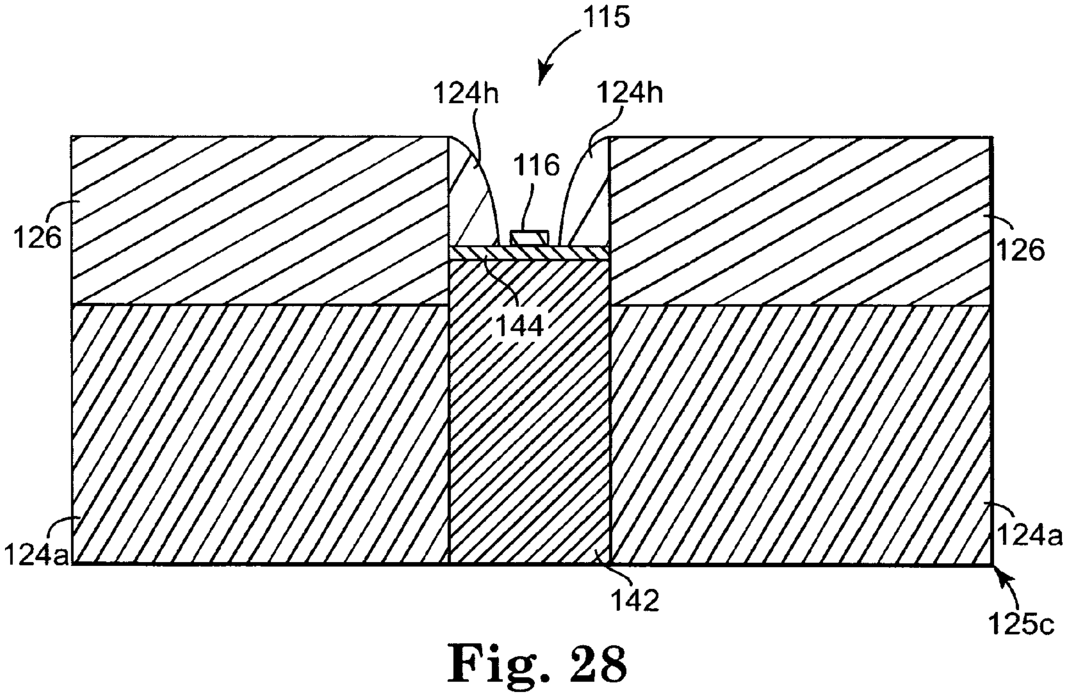
FIG. 28 illustrates a cross-sectional view of one embodiment of the preprocessed wafer, first insulation material layer, and catalyst material layer after heating the catalyst material layer.

FIG. 28 illustrates a cross-sectional view of one embodiment of preprocessed wafer 125c, first insulation material layer 124h, and catalyst material layer 116 after heating catalyst material layer 116b. In one embodiment, catalyst material layer 116b is heated to reduce the area of the catalyst material by coagulation to provide catalyst material layer 116. Catalyst material layer 116 defines the area on which a nanotube, nanowire, or nanofiber is grown.

Figure 29A:
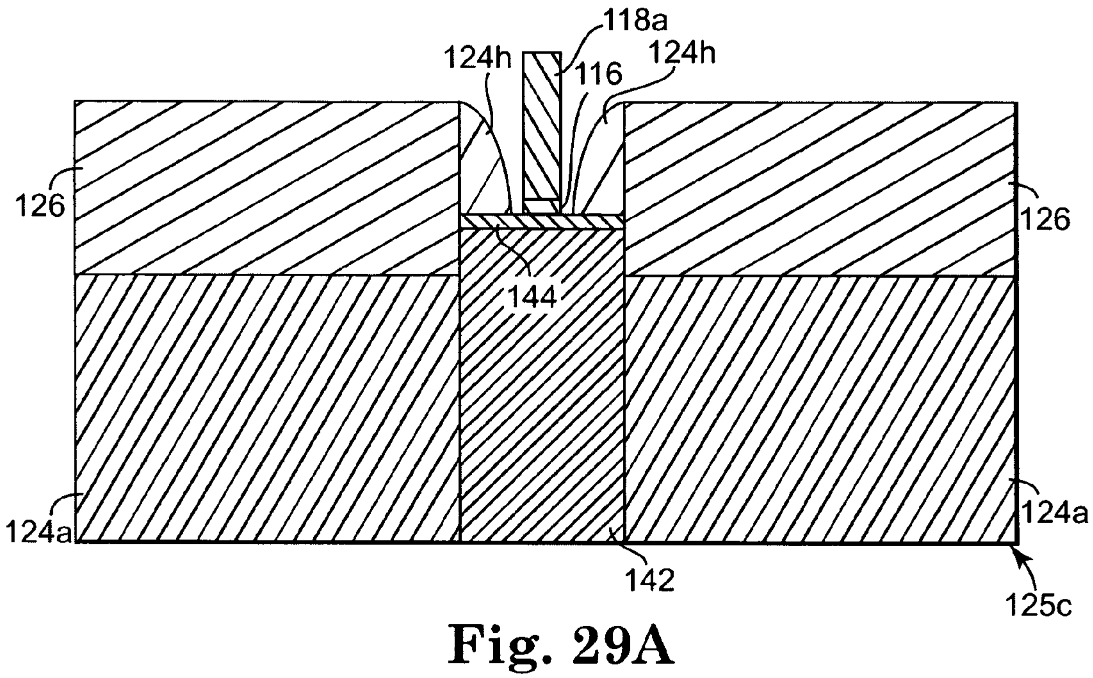
FIG. 29A illustrates a cross-sectional view of one embodiment of the preprocessed wafer, first insulation material layer, catalyst material layer, and a nanotube or nanowire.

FIG. 29A illustrates a cross-sectional view of one embodiment of preprocessed wafer 125c, first insulation material layer 124h, catalyst material layer 116, and a nanotube or nanowire 118a. Nanotube or nanowire 118a is grown on catalyst material layer 116 to provide a first electrode. Nanotube or nanowire 118a is a silicon based, carbon based, or other suitable material based nanotube or nanowire.

Figure 29B:
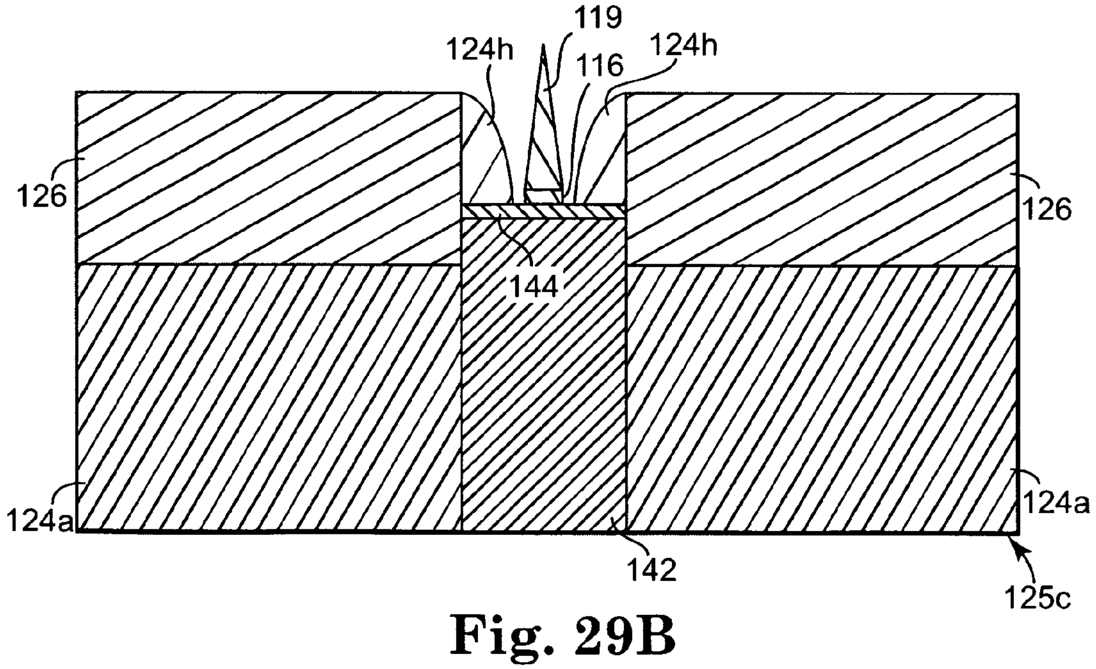
FIG. 29B illustrates a cross-sectional view of one embodiment of the preprocessed wafer, first insulation material layer, catalyst material layer, and a nanofiber.

FIG. 29B illustrates a cross-sectional view of one embodiment of preprocessed wafer 125c, first insulation material layer 124h, catalyst material layer 116, and a nanofiber 119. Nanofiber 119 is grown on catalyst material layer 116 to provide a first electrode. Nanofiber 119 is a silicon based, carbon based, or other suitable material based nanofiber.

Figure 30A:
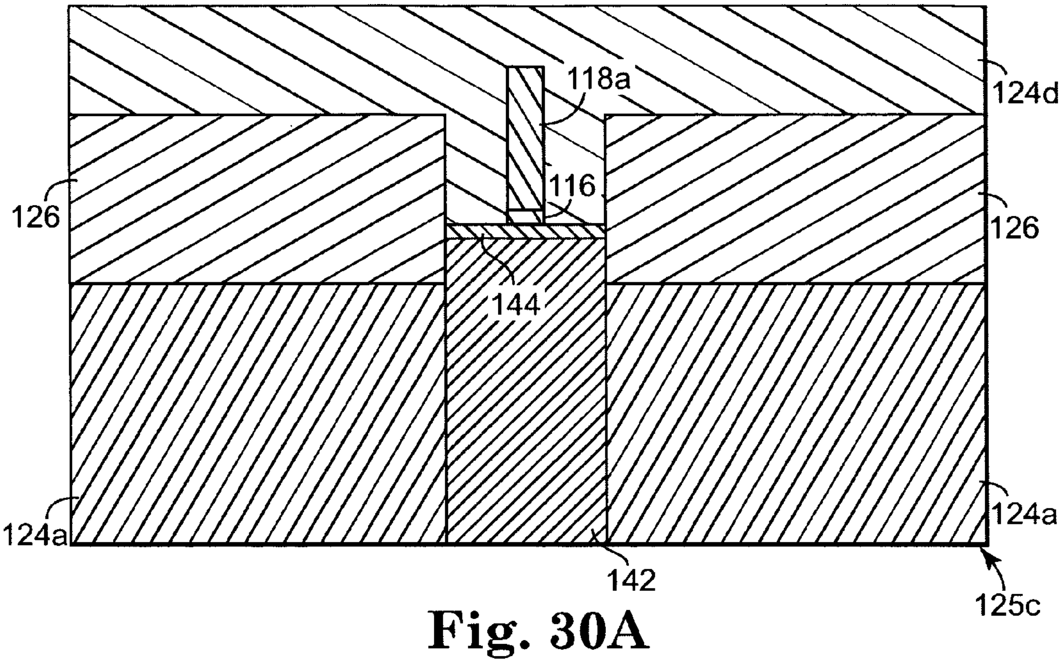
FIG. 30A illustrates a cross-sectional view of one embodiment of the preprocessed wafer, catalyst material layer, nanotube or nanowire, and a second insulation material layer.

FIG. 30A illustrates a cross-sectional view of one embodiment of preprocessed wafer 125c, catalyst material layer 116, nanotube or nanowire 118a, and a second insulation material layer 124d. Insulation material, such as $SiO_2$, FSG, or other suitable dielectric material, is deposited over exposed portions of preprocessed wafer 125c, first insulation material layer 124h, catalyst material layer 116, and nanotube or nanowire 118a to provide second insulation material layer 124d. First insulation material layer 124h becomes a part of second insulation material layer 124d. Second insulation material layer 124d is deposited using CVD, ALD, MOCVD, PVD, JVP, or other suitable deposition technique.

Figure 30B:
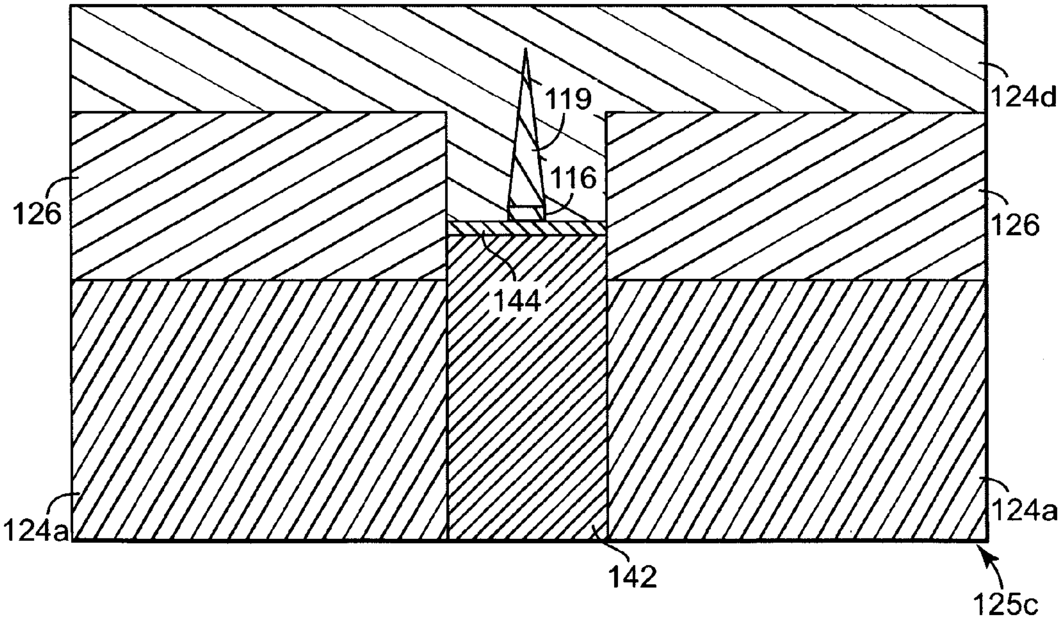
FIG. 30B illustrates a cross-sectional view of one embodiment of the preprocessed wafer, catalyst material layer, nanofiber, and a second insulation material layer.

FIG. 30B illustrates a cross-sectional view of one embodiment of preprocessed wafer 125c, catalyst material layer 116, nanofiber 119, and a second insulation material layer 124d. Insulation material, such as $SiO_2$, FSG, or other suitable dielectric material, is deposited over exposed portions of preprocessed wafer 125c, first insulation material layer 124h, catalyst material layer 116, and nanofiber 119 to provide second insulation material layer 124d. Second insulation material layer 124d is deposited using CVD, ALD, MOCVD, PVD, JVP, or other suitable deposition technique.

Figure 31A:
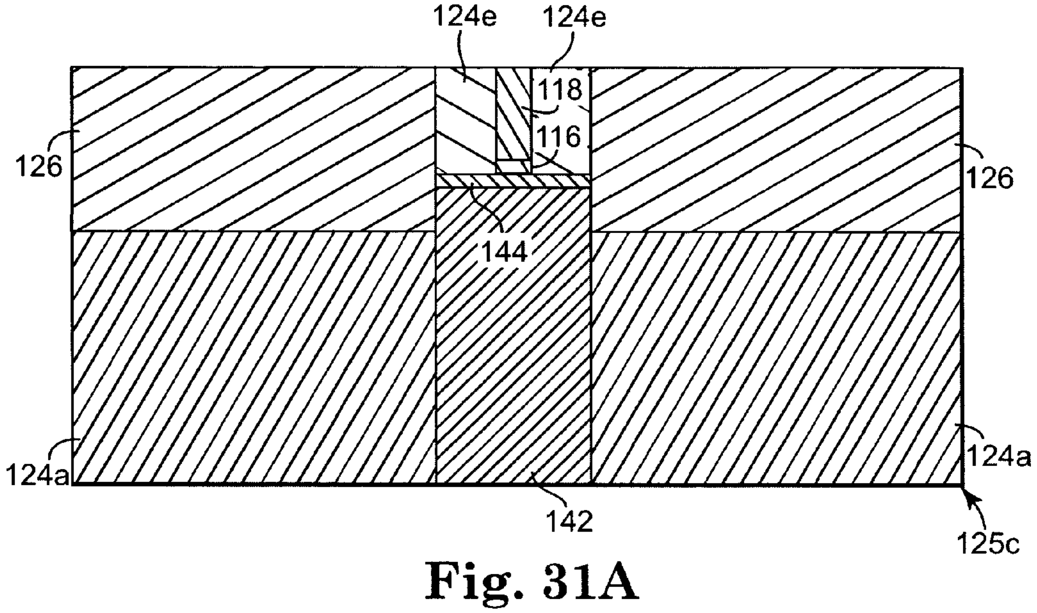
FIG. 31A illustrates a cross-sectional view of one embodiment of the preprocessed wafer, catalyst material layer, nanowire or nanotube, and second insulation material layer after planarization.

FIG. 31A illustrates a cross-sectional view of one embodiment of preprocessed wafer 125c, catalyst material layer 116, nanotube or nanowire 118, and second insulation material layer 124e after planarization. Second insulation material layer 124d and nanotube or nanowire 118a is planarized to expose insulation material 126 and to provide second insulation material layer 124e and nanotube or nanowire 118. Second insulation material layer 124*d* and nanotube or nanowire 118*a* is planarized using CMP or another suitable planarization process.

Figure 31B:
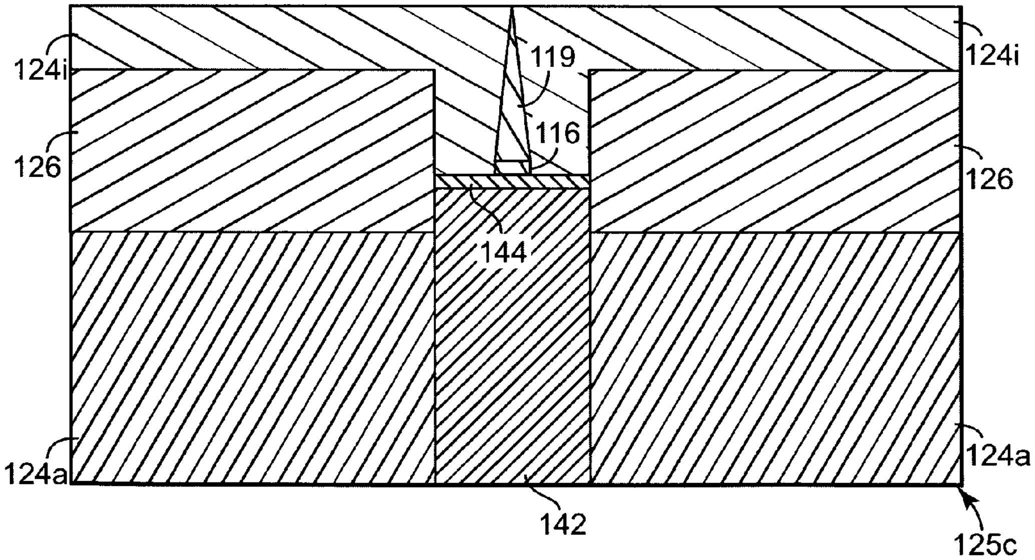
FIG. 31B illustrates a cross-sectional view of one embodiment of the preprocessed wafer, catalyst material layer, nanofiber, and second insulation material layer after planarization.

FIG. 31B illustrates a cross-sectional view of one embodiment of preprocessed wafer 125*c*, catalyst material layer 116, nanofiber 119, and second insulation material layer 124*i* after planarization. Second insulation material layer 124*d* is planarized to expose nanofiber 119 and to provide second insulation material layer 124*i*. Second insulation material layer 124*d* is planarized using CMP or another suitable planarization process.

Figure 32A:
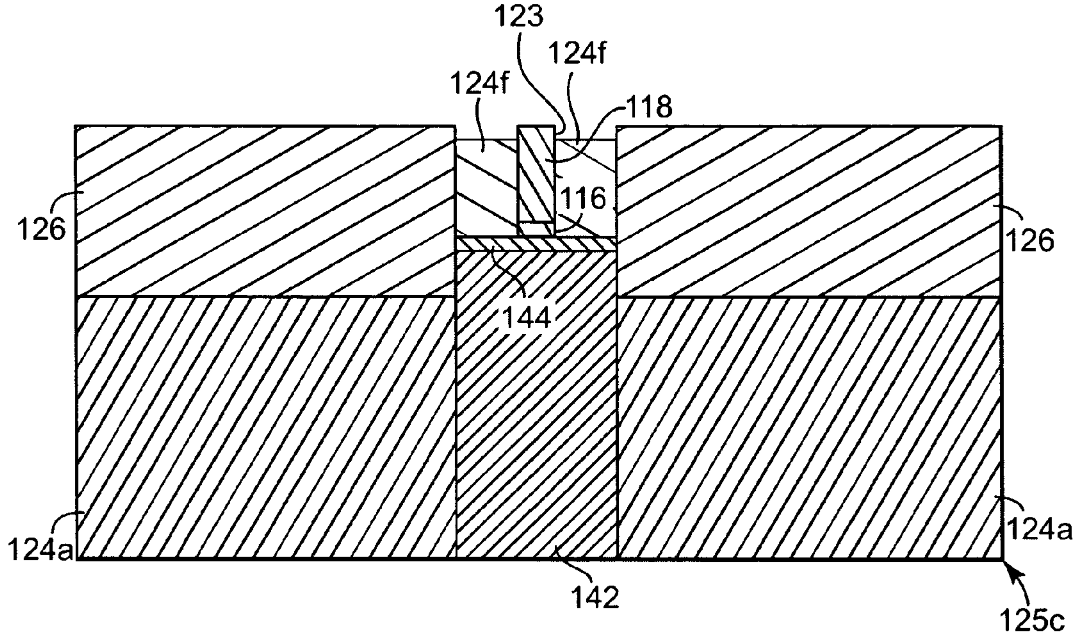
FIG. 32A illustrates a cross-sectional view of one embodiment of the preprocessed wafer, catalyst material layer, nanotube or nanowire, and second insulation material layer after etching the second insulation material layer.

FIG. 32A illustrates a cross-sectional view of one embodiment of preprocessed wafer 125*c*, catalyst material layer 116, nanotube or nanowire 118, and second insulation material layer 124*f* after etching second insulation material layer 124*e*. Second insulation material layer 124*e* is etched back using diluted HF or other suitable etchant to provide second insulation material layer 124*f* and to expose a top portion 123 of nanotube or nanowire 118. In another embodiment, second insulation material layer 124*e* is not etched back.

Figure 32B:
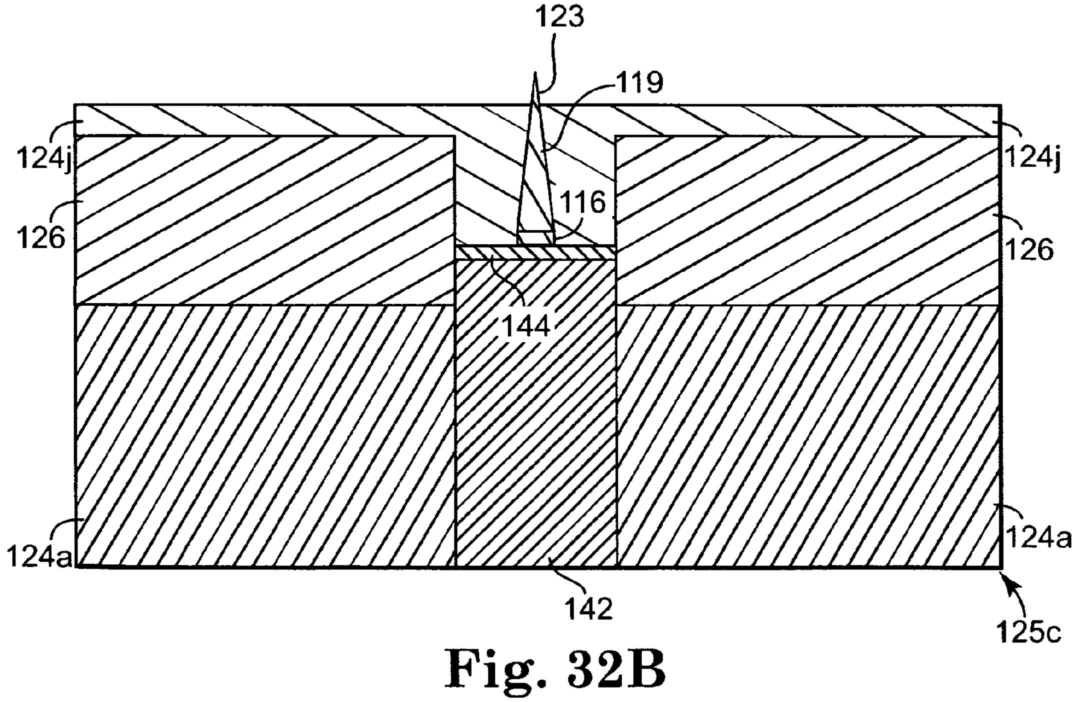
FIG. 32B illustrates a cross-sectional view of one embodiment of the preprocessed wafer, catalyst material layer, nanofiber, and second insulation material layer after etching the second insulation material layer.

FIG. 32B illustrates a cross-sectional view of one embodiment of preprocessed wafer 125*c*, catalyst material layer 116, nanofiber 119, and second insulation material layer 124*j* after etching second insulation material layer 124*i*. Second insulation material layer 124*i* is etched back using diluted HF or other suitable etchant to provide second insulation material layer 124*j* and to expose a top portion 123 of nanofiber 119. In another embodiment, second insulation material layer 124*i* is not etched back.

Figure 33A:
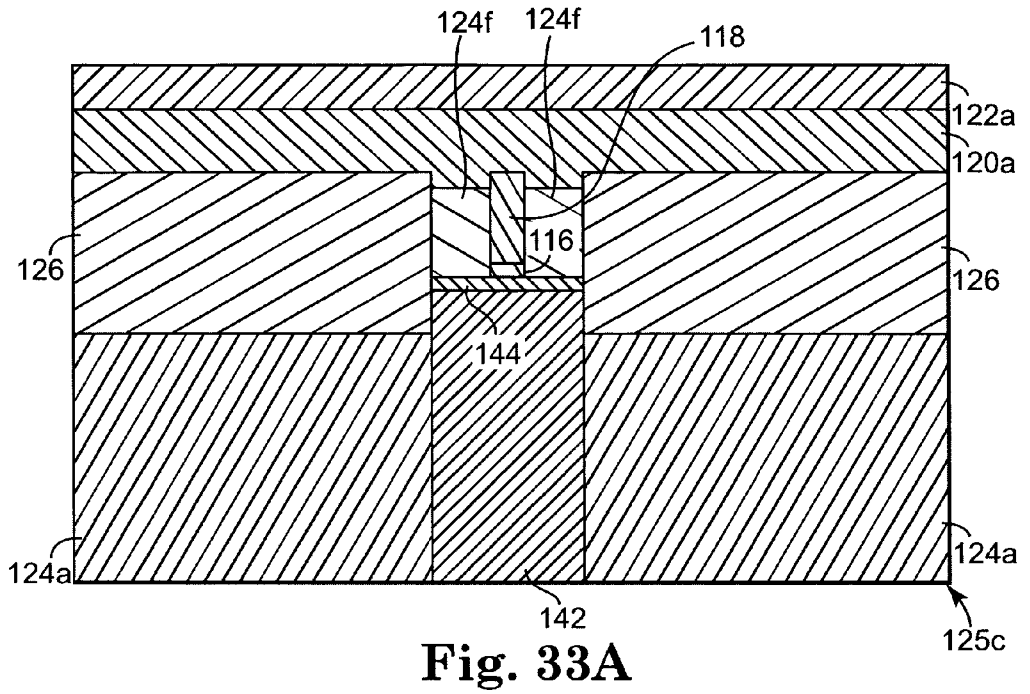
FIG. 33A illustrates a cross-sectional view of one embodiment of the preprocessed wafer, catalyst material layer, nanotube or nanowire, second insulation material layer, a phase-change material layer, and an electrode material layer.

FIG. 33A illustrates a cross-sectional view of one embodiment of preprocessed wafer 125*c*, catalyst material layer 116, nanotube or nanowire 118, second insulation material layer 124*f*, a phase-change material layer 120*a*, and an electrode material layer 122*a*. Phase-change material, such as a chalcogenic compound or other suitable phase-change material, is deposited over exposed portions of insulation material 126, second insulation material layer 124*f*, and nanotube or nanowire 118 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 150*a* as illustrated in FIG. 23A.

Figure 33B:
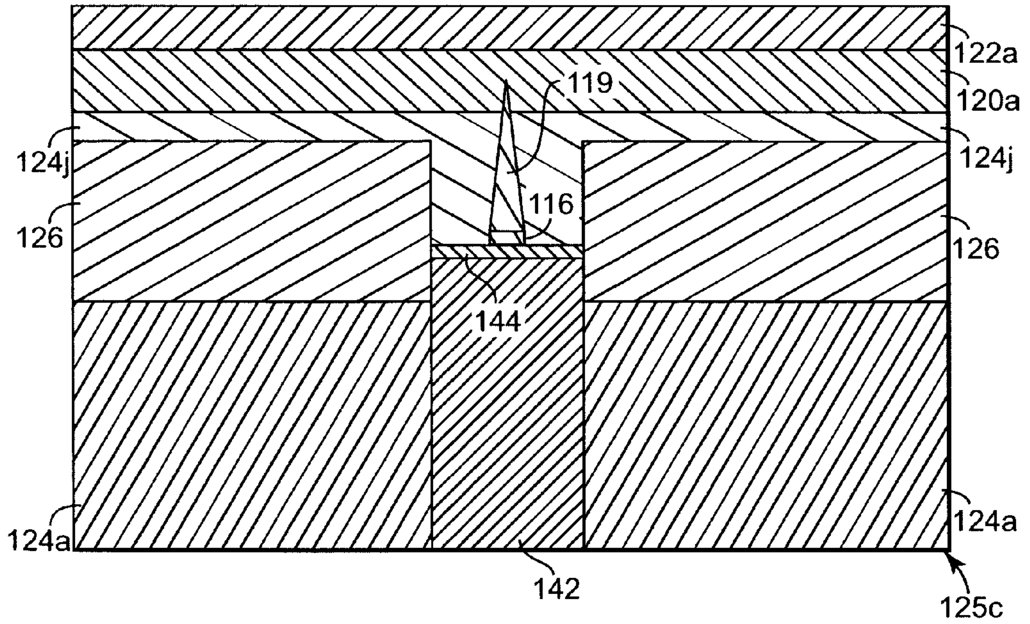
FIG. 33B illustrates a cross-sectional view of one embodiment of the preprocessed wafer, catalyst material layer, nanofiber, second insulation material layer, a phase-change material layer, and an electrode material layer.

FIG. 33B illustrates a cross-sectional view of preprocessed wafer 125*c*, catalyst material layer 116, nanofiber 119, second insulation material layer 124*j*, a phase-change material layer 120*a*, and an electrode material layer 122*a*. Phase-change material, such as a chalcogenic compound or other suitable phase-change material, is deposited over exposed portions of second insulation material layer 124*j* and nanofiber 119 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 150*b* as illustrated in FIG. 23B.

Figure 34A:
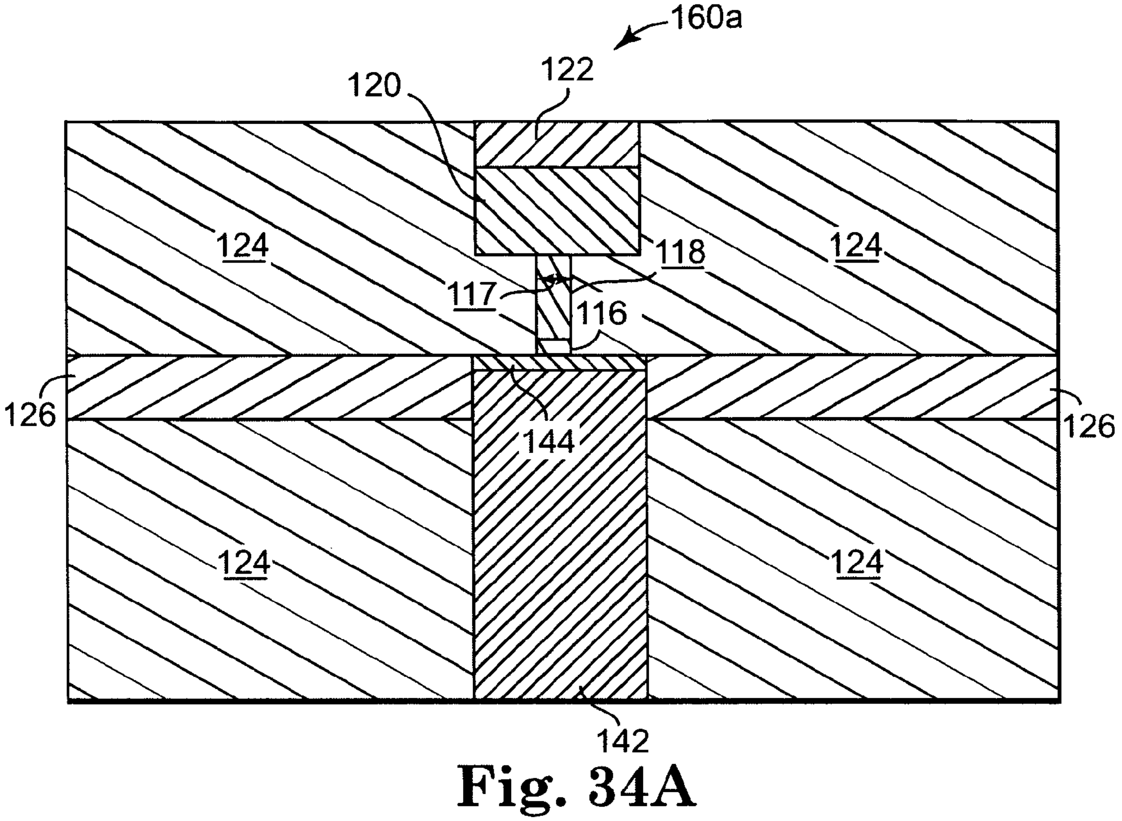
FIG. 34A illustrates a cross-sectional view of another embodiment of a phase-change memory cell.

FIG. 34A illustrates a cross-sectional view of another embodiment of a phase-change memory cell 160*a*. Phase-change memory cell 160*a* is similar to phase-change memory cell 150*a* except for the location of insulation material 124 and 126. Phase-change memory cell 160*a* operates similarly to phase-change memory cell 150*a*.

Figure 34B:
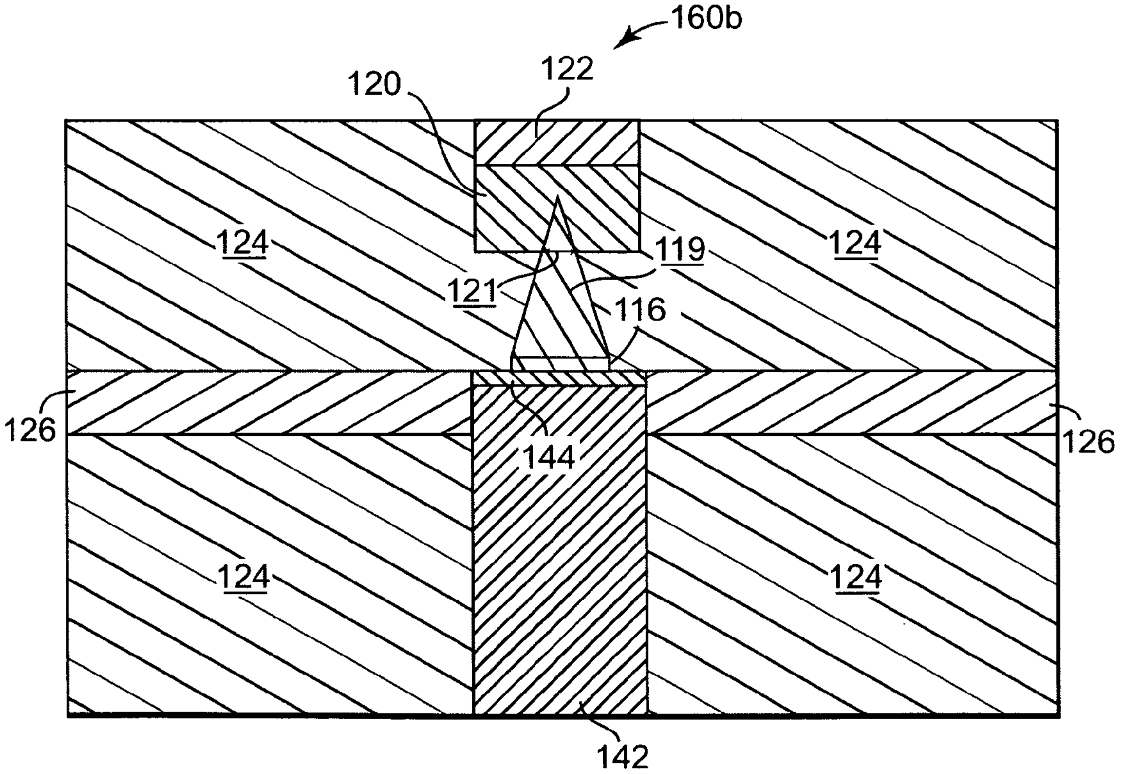
FIG. 34B illustrates a cross-sectional view of another embodiment of a phase-change memory cell.

FIG. 34B illustrates a cross-sectional view of another embodiment of a phase-change memory cell 160*b*. Phase-change memory cell 160*b* is similar to phase-change memory cell 160*a* except that first electrode 118 comprising a nanowire or nanotube is replaced with first electrode 119 comprising a nanofiber. Phase-change memory cell 160*b* operates similarly to phase-change memory cell 160*a*.

Figure 35:
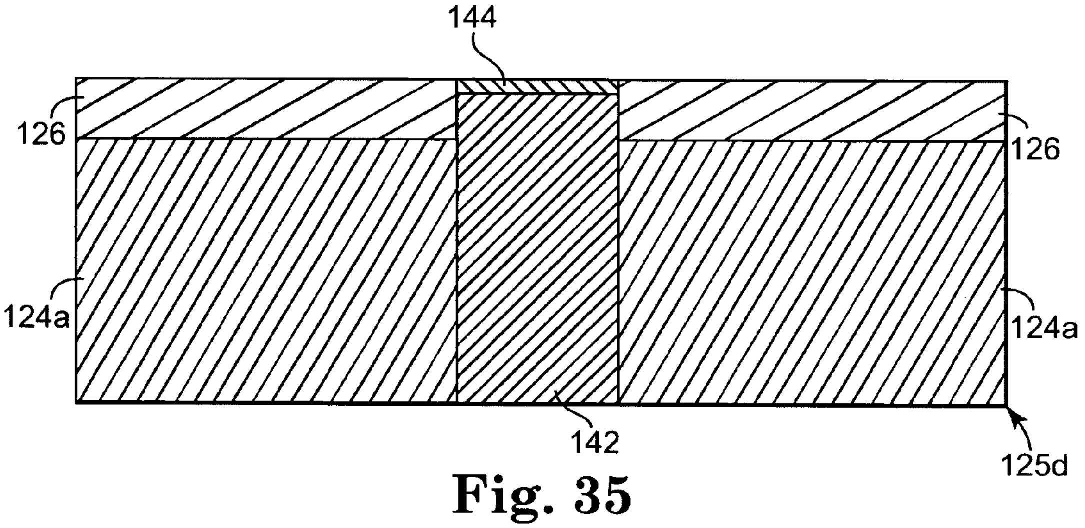
FIG. 35 illustrates a cross-sectional view of one embodiment of a preprocessed wafer.

FIG. 35 illustrates a cross-sectional view of one embodiment of a preprocessed wafer 125*d*. Preprocessed wafer 125*d* includes insulation material 124*a* and 126, a poly-Si landing pad 142 having a silicided top portion 144, and lower wafer layers (not shown). In one embodiment, silicided top portion 144 is $TiSi_x$, $CoSi_x$, $NiSi_x$, or another suitable silicide. Insulation material 124*a* is $SiO_2$, FSG or other suitable dielectric material. Insulation material 126 is $Si_3N_4$ or other suitable dielectric material.

Figure 36:
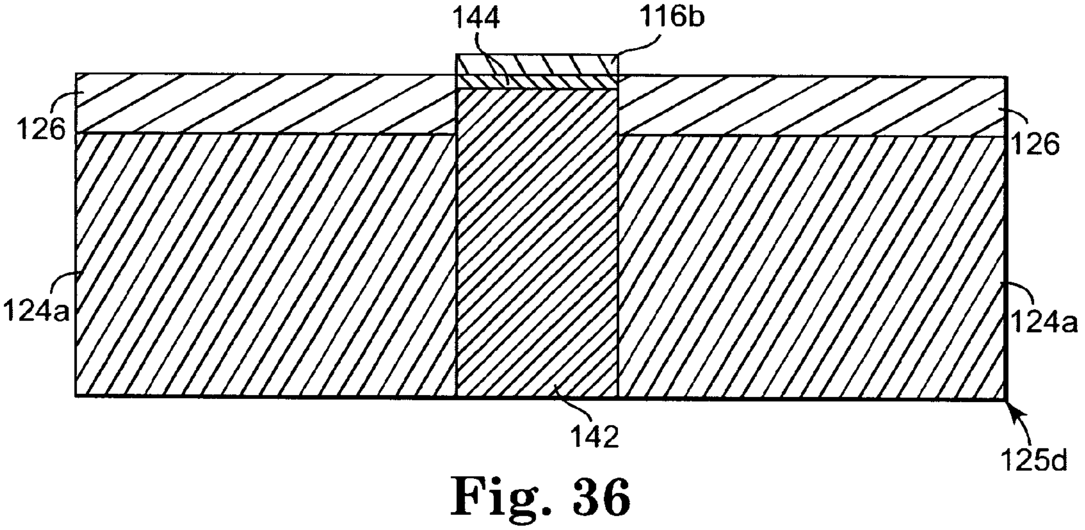
FIG. 36 illustrates a cross-sectional view of one embodiment of the preprocessed wafer and a catalyst material layer.

FIG. 36 illustrates a cross-sectional view of one embodiment of preprocessed wafer 125*d* and a catalyst material layer 116*b*. A catalyst material, such as a silicide forming metal such as Ti, Pd, Pt, Au, Cu, Co, Cr, Hf, Ir, Mn, Mo, Ni, Rh, Ta, W, Zr, or other suitable catalyst material, is selectively deposited over top portion 144 of landing pad 142 to provide catalyst material layer 116*b*. Catalyst material layer 116*b* is deposited by selective electroless deposition or other suitable deposition technique.

Figure 37:
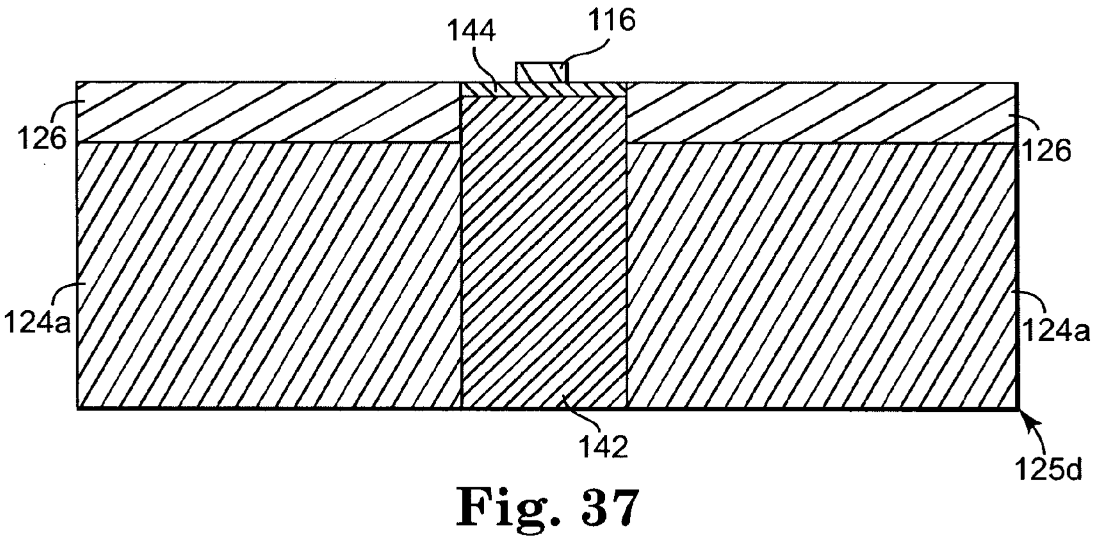
FIG. 37 illustrates a cross-sectional view of one embodiment of the preprocessed wafer and catalyst material layer after heating the catalyst material layer.

FIG. 37 illustrates a cross-sectional view of one embodiment of preprocessed wafer 125*d* and catalyst material layer 116 after heating catalyst material layer 116*b*. In one embodiment, catalyst material layer 116*b* is heated to reduce the area of the catalyst material by coagulation to provide catalyst material layer 116. Catalyst material layer 116 defines the area on which a nanotube, nanowire, or nanofiber is grown.

Figure 38A:
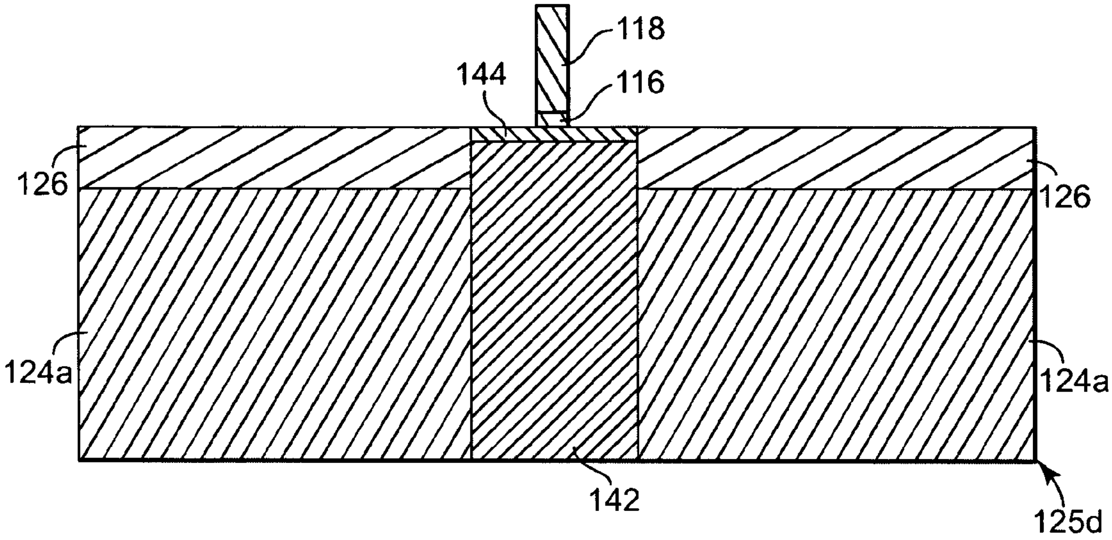
FIG. 38A illustrates a cross-sectional view of one embodiment of the preprocessed wafer, catalyst material layer, and a nanotube or nanowire.

FIG. 38A illustrates a cross-sectional view of one embodiment of preprocessed wafer 125*d*, catalyst material layer 116, and a nanotube or nanowire 118. Nanotube or nanowire 118 is grown on catalyst material layer 116 to provide a first electrode. Nanotube or nanowire 118 is a silicon based, carbon based, or other suitable material based nanotube or nanowire.

Figure 38B:
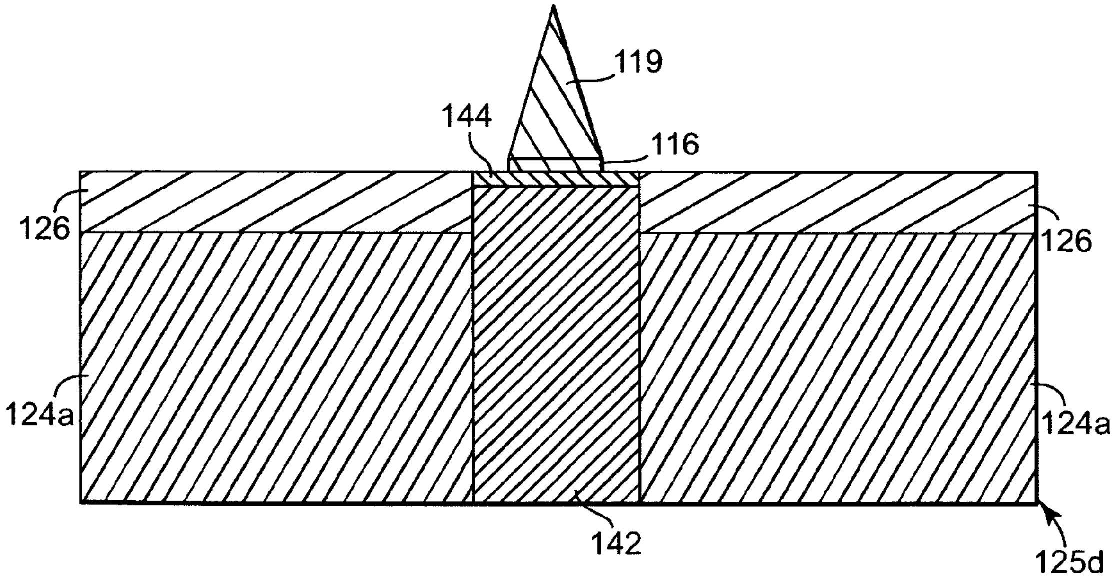
FIG. 38B illustrates a cross-sectional view of one embodiment of the preprocessed wafer, catalyst material layer, and a nanofiber.

FIG. 38B illustrates a cross-sectional view of one embodiment of preprocessed wafer 125*d*, catalyst material layer 116, and a nanofiber 119. Nanofiber 119 is grown on catalyst material layer 116 to provide a first electrode. Nanofiber 119 is a silicon based, carbon based, or other suitable material based nanofiber.

Figure 39A:
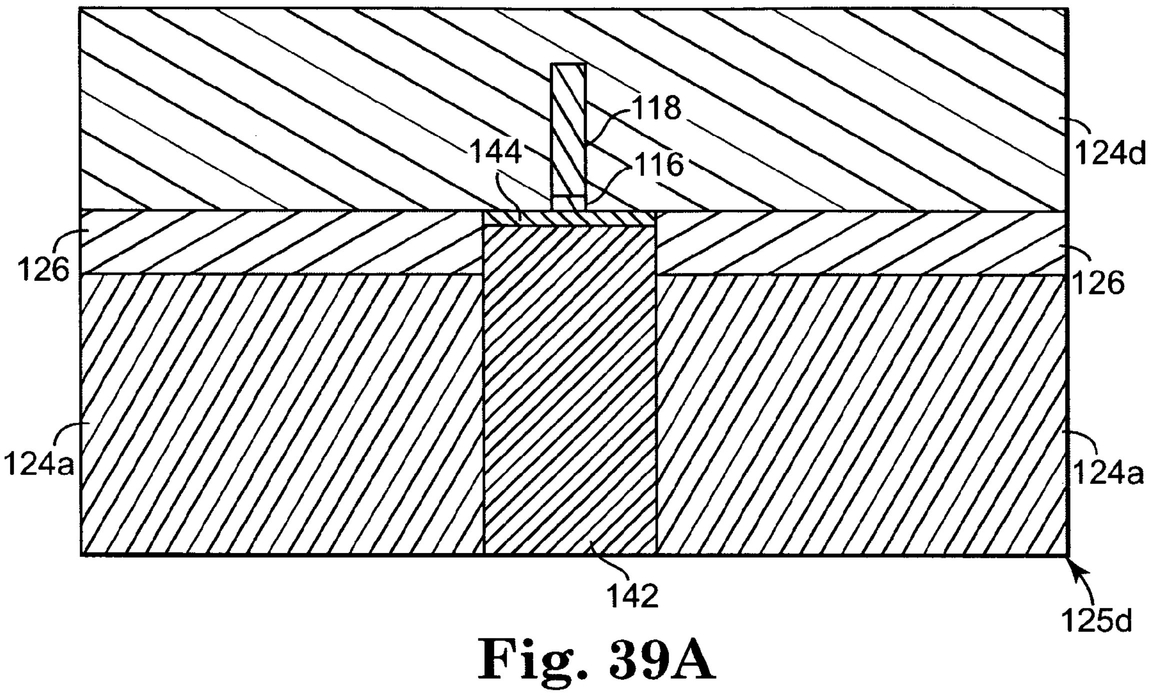
FIG. 39A illustrates a cross-sectional view of one embodiment of the preprocessed wafer, catalyst material layer, nanotube or nanowire, and a first insulation material layer.

FIG. 39A illustrates a cross-sectional view of one embodiment of preprocessed wafer 125*d*, catalyst material layer 116, nanotube or nanowire 118, and a first insulation material layer 124*d*. Insulation material, such as $SiO_2$, FSG, or other suitable dielectric material, is deposited over exposed portions of preprocessed wafer 125*d*, catalyst material layer 116, and nanotube or nanowire 118 to provide first insulation material layer 124*d*. First insulation material layer 124*d* is deposited using CVD, ALD, MOCVD, PVD, JVP, or other suitable deposition technique.

Figure 39B:
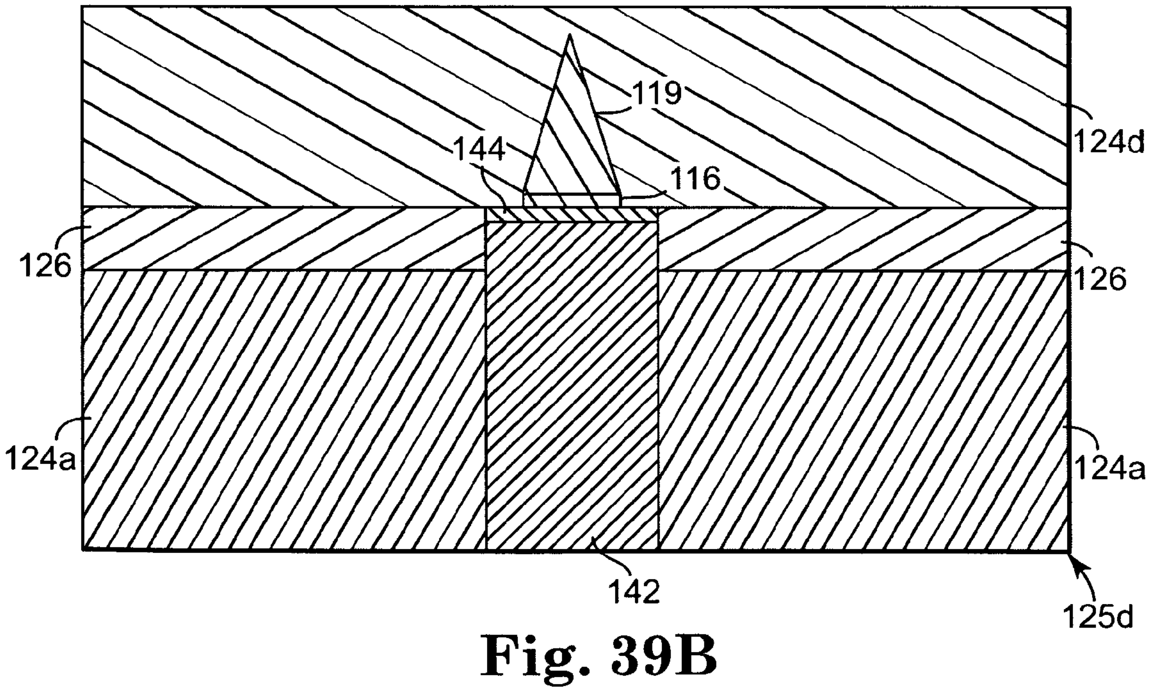
FIG. 39B illustrates a cross-sectional view of one embodiment of the preprocessed wafer, catalyst material layer, nanofiber, and a first insulation material layer.

FIG. 39B illustrates a cross-sectional view of one embodiment of preprocessed wafer 125*d*, catalyst material layer 116, nanofiber 119, and a first insulation material layer 124*d*. Insulation material, such as $SiO_2$, FSG, or other suitable dielectric material, is deposited over exposed portions of preprocessed wafer 125*d*, catalyst material layer 116, and nanofiber 119 to provide first insulation material layer 124*d*. First insulation material layer 124*d* is deposited using CVD, ALD, MOCVD, PVD, JVP, or other suitable deposition technique.

Figure 40A:
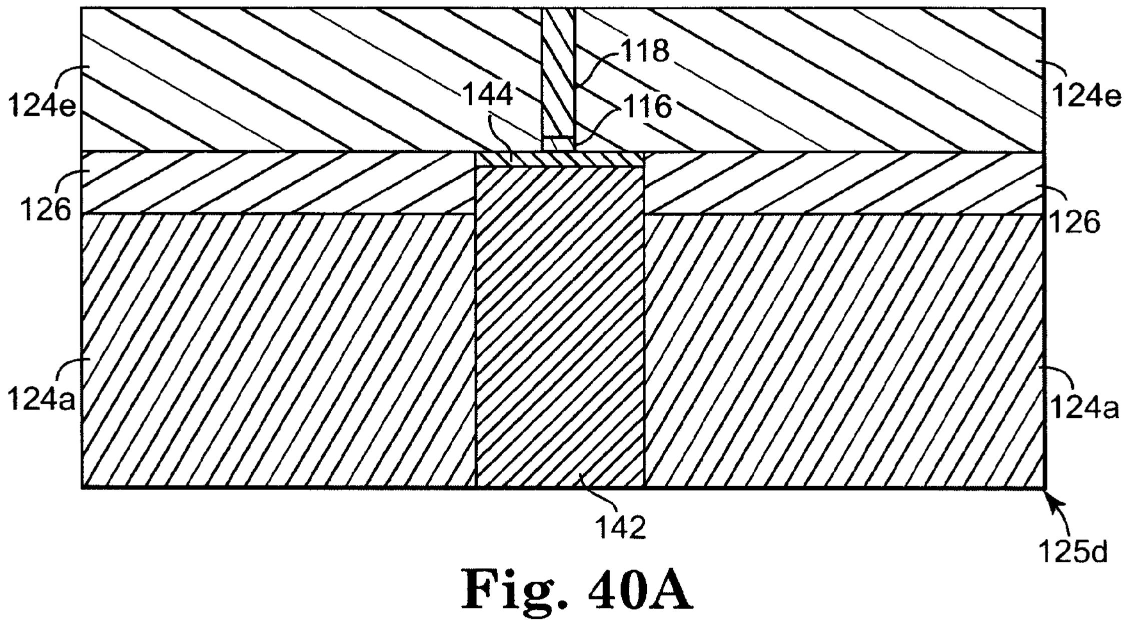
FIG. 40A illustrates a cross-sectional view of one embodiment of the preprocessed wafer, catalyst material layer, nanotube or nanowire, and first insulation material layer after planarization.

FIG. 40A illustrates a cross-sectional view of one embodiment of preprocessed wafer 125*d*, catalyst material layer 116, nanotube or nanowire 118, and first insulation material layer 124*e* after planarization. First insulation material layer 124*d* is planarized to provide first insulation material layer 124*e* and to expose nanotube or nanowire 118. First insulation material layer 124*d* is planarized using CMP or another suitable planarization process.

Figure 40B:
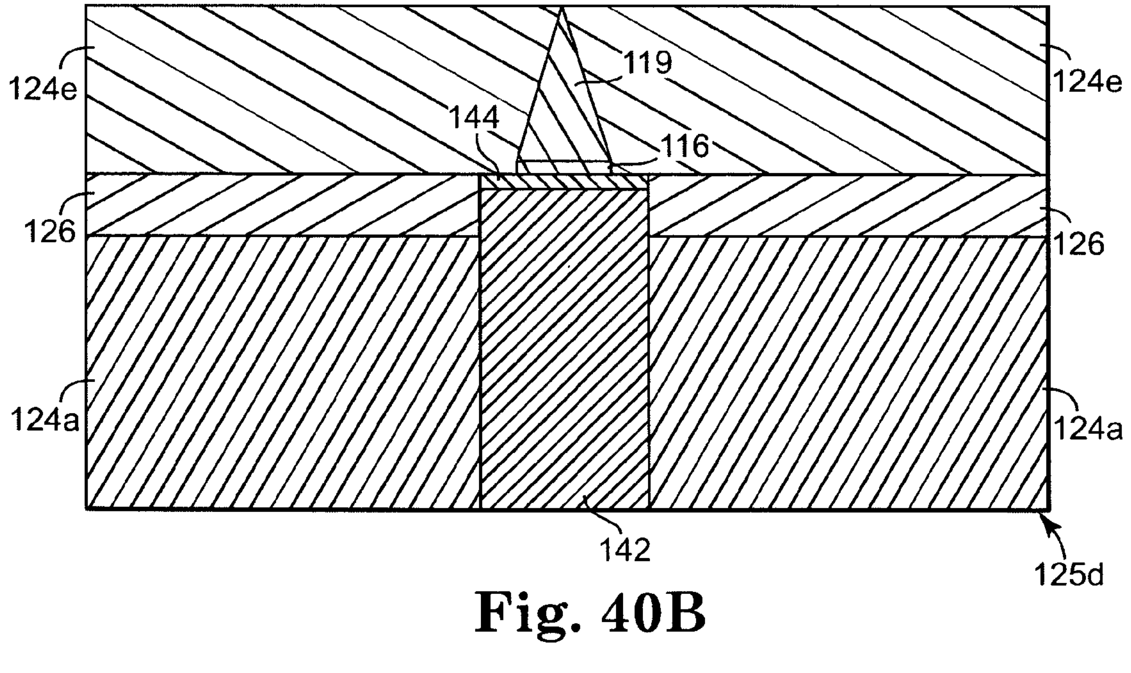
FIG. 40B illustrates a cross-sectional view of one embodiment of the preprocessed wafer, catalyst material layer, nanofiber, and first insulation material layer after planarization.

FIG. 40B illustrates a cross-sectional view of one embodiment of preprocessed wafer 125*d*, catalyst material layer 116, nanofiber 119, and first insulation material layer 124*e* after planarization. First insulation material layer 124*d* is planarized to provide first insulation material layer 124*e* and to expose nanofiber 119. First insulation material layer 124*d* is planarized using CMP or another suitable planarization process.

Figure 41A:
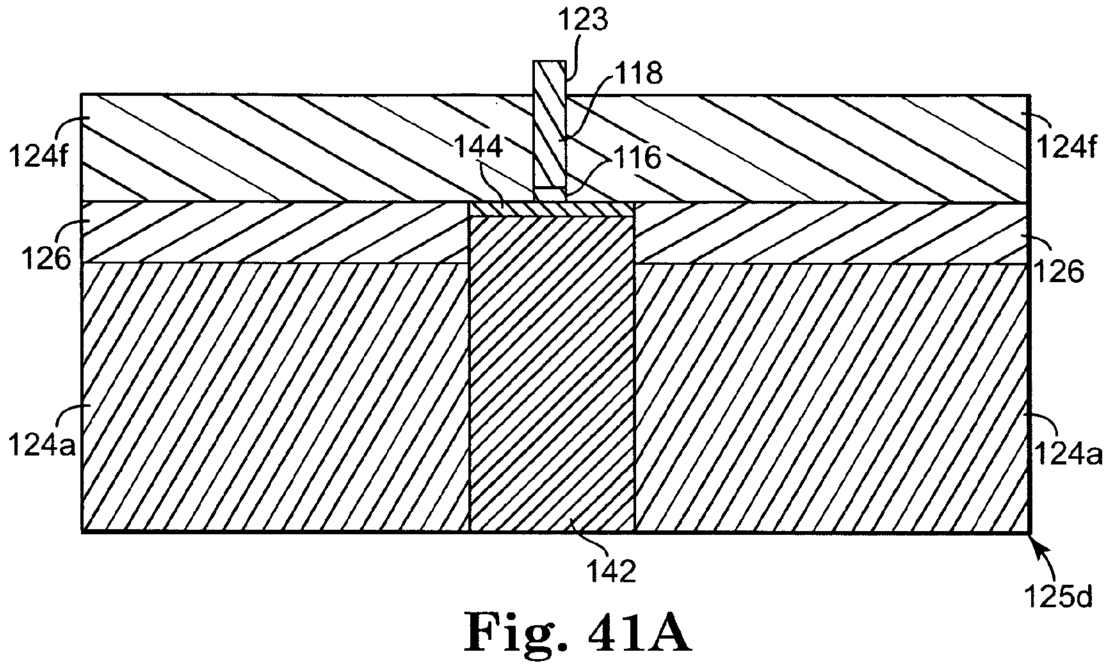
FIG. 41A illustrates a cross-sectional view of one embodiment of the preprocessed wafer, catalyst material layer, nanotube or nanowire, and first insulation material layer after etching the first insulation material layer.

FIG. 41A illustrates a cross-sectional view of one embodiment of preprocessed wafer 125*d*, catalyst material layer 116, nanotube or nanowire 118, and first insulation material layer 124*f* after etching first insulation material layer 124*e*. First insulation material layer 124*e* is etched back using diluted HF or other suitable etchant to provide first insulation material layer 124*f* and to expose a top portion 123 of nanotube or nanowire 118. In another embodiment, first insulation material layer 124*e* is not etched back.

Figure 41B:
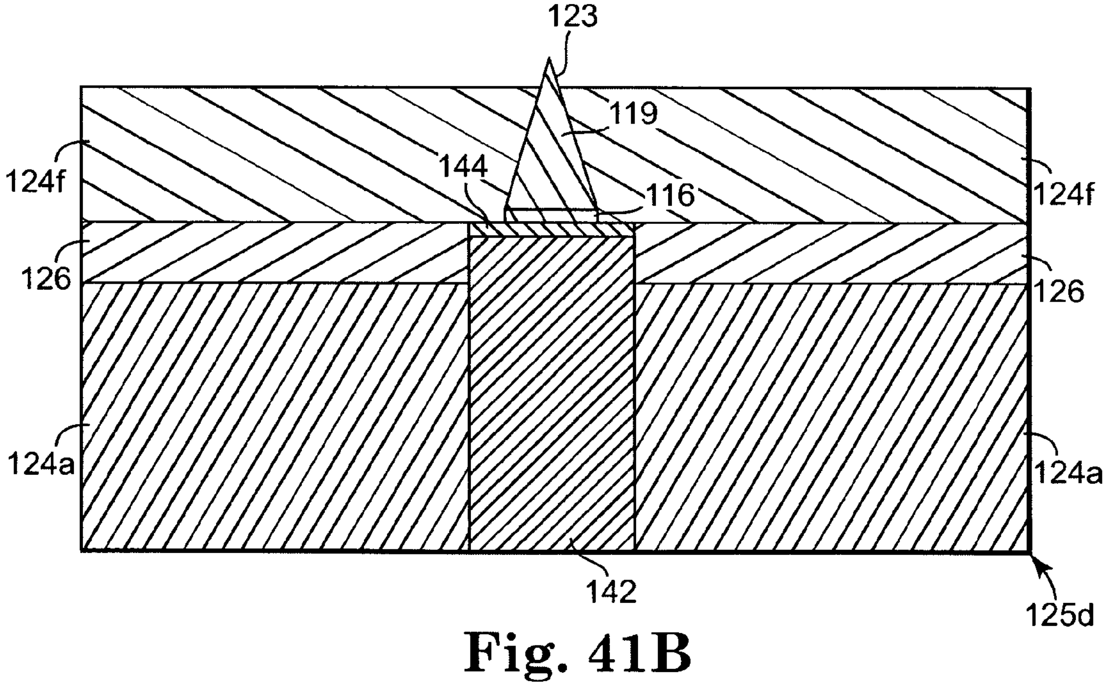
FIG. 41B illustrates a cross-sectional view of one embodiment of the preprocessed wafer, catalyst material layer, nanofiber, and first insulation material layer after etching the first insulation material layer.

FIG. 41B illustrates a cross-sectional view of one embodiment of preprocessed wafer 125*d*, catalyst material layer 116, nanofiber 119, and first insulation material layer 124*f* after etching first insulation material layer 124*e*. First insulation material layer 124*e* is etched back using diluted HF or other suitable etchant to provide first insulation material layer 124*f* and to expose a top portion 123 of nanofiber 119. In another embodiment, first insulation material layer 124*e* is not etched back.

Figure 42A:
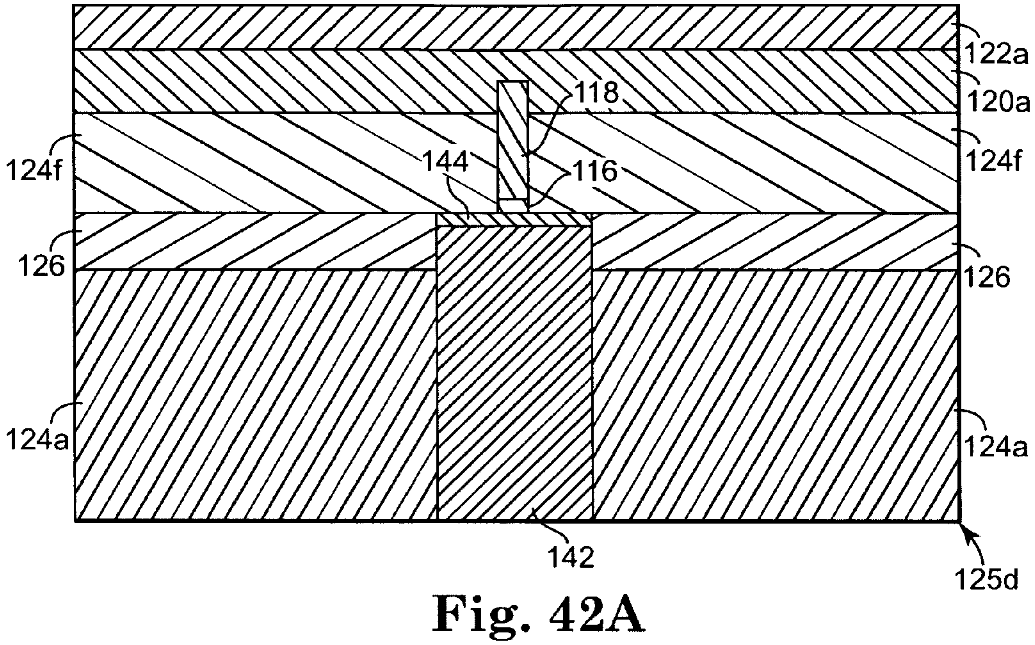
FIG. 42A illustrates a cross-sectional view of one embodiment of the preprocessed wafer, catalyst material layer, nanotube or nanowire, a phase-change material layer, and an electrode material layer.

FIG. 42A illustrates a cross-sectional view of one embodiment of preprocessed wafer 125*d*, catalyst material layer 116, nanotube or nanowire 118, first insulation material layer 124*f*, a phase-change material layer 120*a*, and an electrode material layer 122*a*. Phase-change material, such as a chalcogenic compound or other suitable phase-change material, is deposited over exposed portions of first insulation material layer 124*f* and nanotube or nanowire 118 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 160*a* as illustrated in FIG. 34A.

Figure 42B:
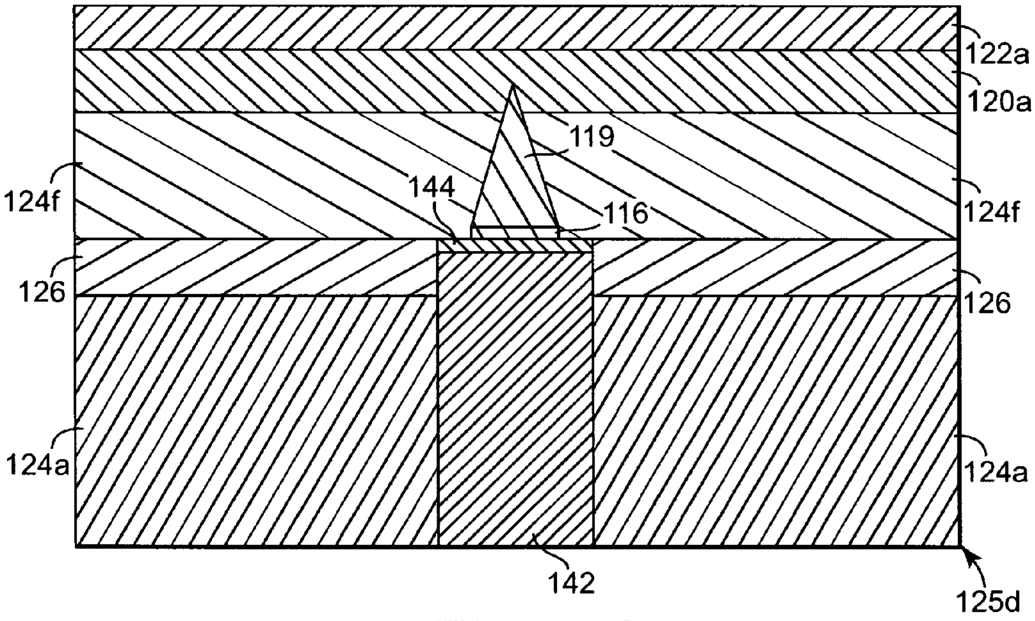
FIG. 42B illustrates a cross-sectional view of one embodiment of the preprocessed wafer, catalyst material layer, nanofiber, first insulation material layer, a phase-change material layer, and an electrode material layer.

FIG. 42B illustrates a cross-sectional view of preprocessed wafer 125*d*, catalyst material layer 116, nanofiber 119, first insulation material layer 124*f*, a phase-change material layer 120*a*, and an electrode material layer 122*a*. Phase-change material, such as a chalcogenic compound or other suitable phase-change material, is deposited over exposed portions of first insulation material layer 124*f* and nanofiber 119 to provide phase-change material layer 120*a*. Phase-change material layer 120*a* is deposited using CVD, ALD, MOCVD, PVD, JVP, or other suitable deposition technique.

Electrode material, such as TiN, TaN, W, Al, Cu, or other suitable electrode material, is deposited over phase-change material layer 120*a* to provide electrode material layer 122*a*. Electrode material layer 122*a* is deposited using CVD, ALD, MOCVD, PVD, JVP, or other suitable deposition technique. Phase-change material layer 120*a* and electrode material layer 122*a* are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 160*b* as illustrated in FIG. 34B.

Figure 43:
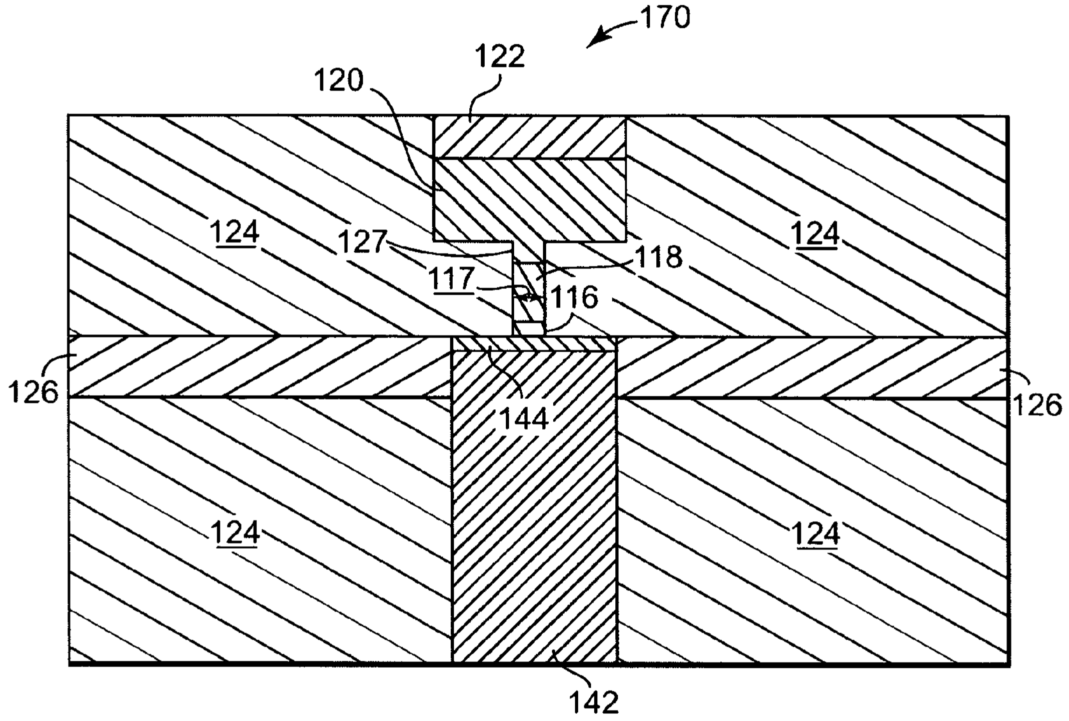
FIG. 43 illustrates a cross-sectional view of another embodiment of a phase-change memory cell.

FIG. 43 illustrates a cross-sectional view of another embodiment of a phase-change memory cell 170. Phase-change memory cell 170 is similar to phase-change memory cell 160*a* except phase-change material 120 includes a portion 127 having a width or cross-section 117 that contacts nanotube or nanowire 118. Phase-change memory cell 170 operates similarly to phase-change memory cell 160*a*.

Figure 44:
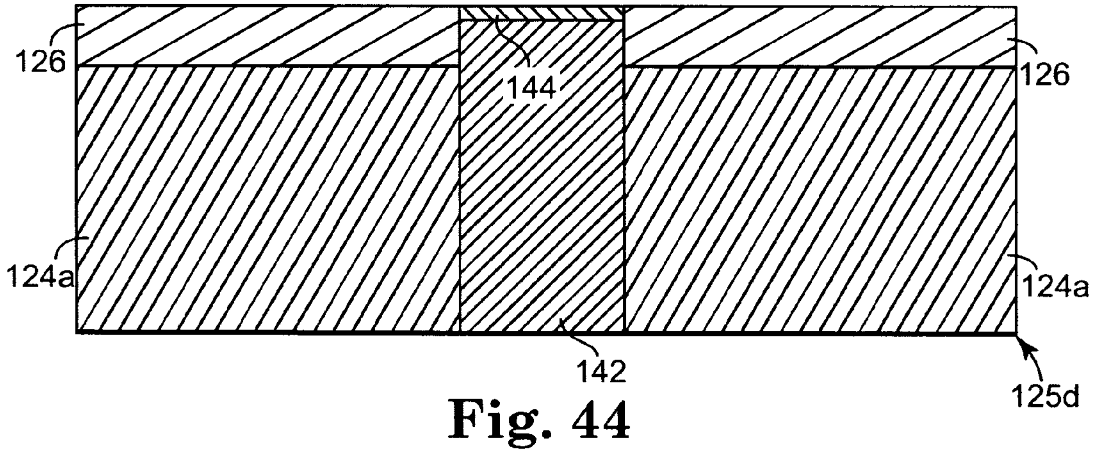
FIG. 44 illustrates a cross-sectional view of one embodiment of a preprocessed wafer.

FIG. 44 illustrates a cross-sectional view of one embodiment of a preprocessed wafer 125*d*. Preprocessed wafer 125*d* includes insulation material 124*a* and 126, a poly-Si landing pad 142 having a silicided top portion 144, and lower wafer layers (not shown). In one embodiment, silicided top portion 144 is $TiSi_x$, $CoSi_x$, $NiSi_x$, or another suitable silicide. Insulation material 124*a* is $SiO_2$, FSG or other suitable dielectric material. Insulation material 126 is $Si_3N_4$ or other suitable dielectric material.

Figure 45:
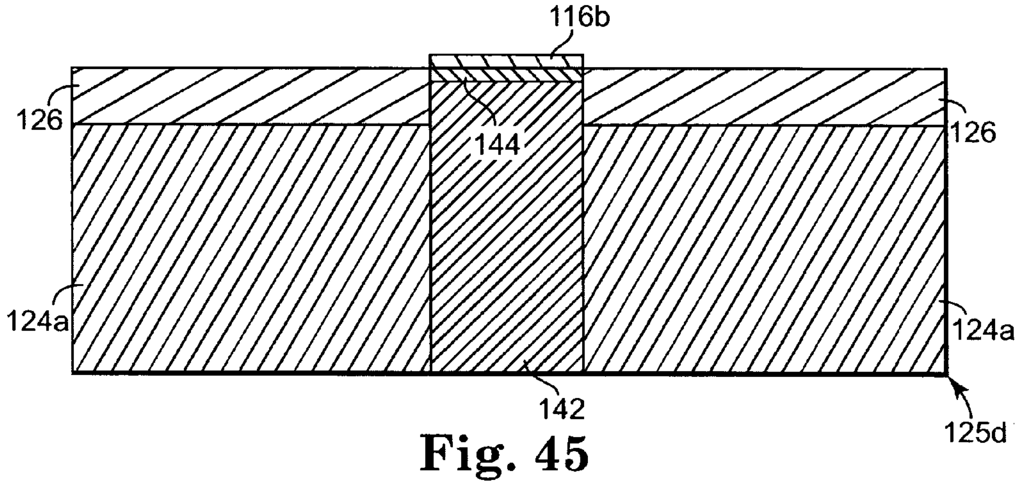
FIG. 45 illustrates a cross-sectional view of one embodiment of the preprocessed wafer and a catalyst material layer.

FIG. 45 illustrates a cross-sectional view of one embodiment of preprocessed wafer 125*d* and a catalyst material layer 116*b*. A catalyst material, such as a silicide forming metal such as Ti, Pd, Pt, Au, Cu, Co, Cr, Hf, Ir, Mn, Mo, Ni, Rh, Ta, W, Zr, or other suitable catalyst material, is selectively deposited over top portion 144 of landing pad 142 to provide catalyst material layer 116*b*. Catalyst material layer 116*b* is deposited by selective electroless deposition or other suitable deposition technique.

Figure 46:
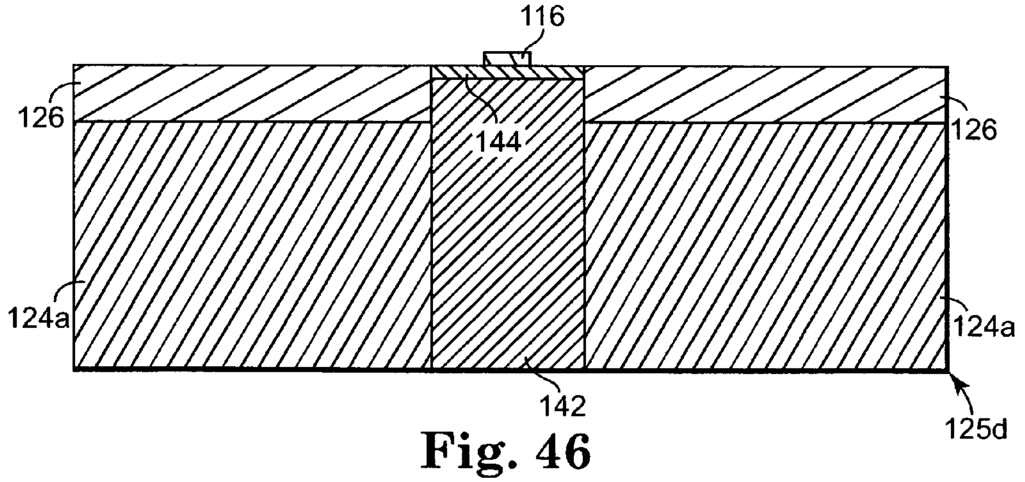
FIG. 46 illustrates a cross-sectional view of the preprocessed wafer and the catalyst material layer after heating the catalyst material layer.

FIG. 46 illustrates a cross-sectional view of one embodiment of preprocessed wafer 125*d* and catalyst material layer 116 after heating catalyst material layer 116*b*. In one embodiment, catalyst material layer 116*b* is heated to reduce the area of the catalyst material by coagulation to provide catalyst material layer 116. Catalyst material layer 116 defines the area on which a nanotube, nanowire, or nanofiber is grown.

Figure 47:
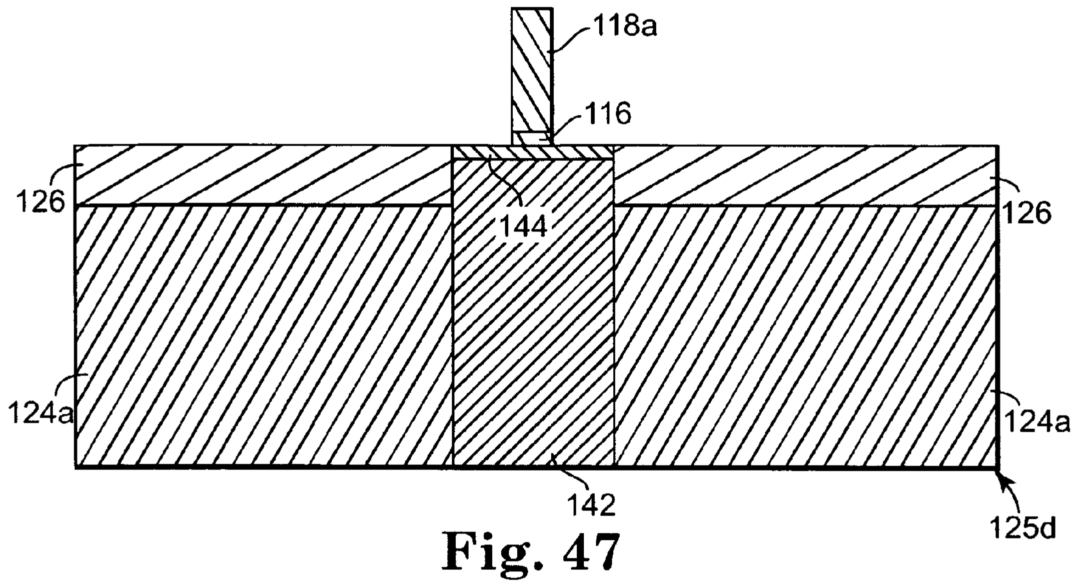
FIG. 47 illustrates a cross-sectional view of one embodiment of the preprocessed wafer, catalyst material layer, and a nanotube or nanowire.

FIG. 47 illustrates a cross-sectional view of one embodiment of preprocessed wafer 125*d*, catalyst material layer 116, and a nanotube or nanowire 118*a*. Nanotube or nanowire 118*a* is grown on catalyst material layer 116 to provide a first electrode. Nanotube or nanowire 118*a* is a silicon based, carbon based, or other suitable material based nanotube or nanowire.

Figure 48:
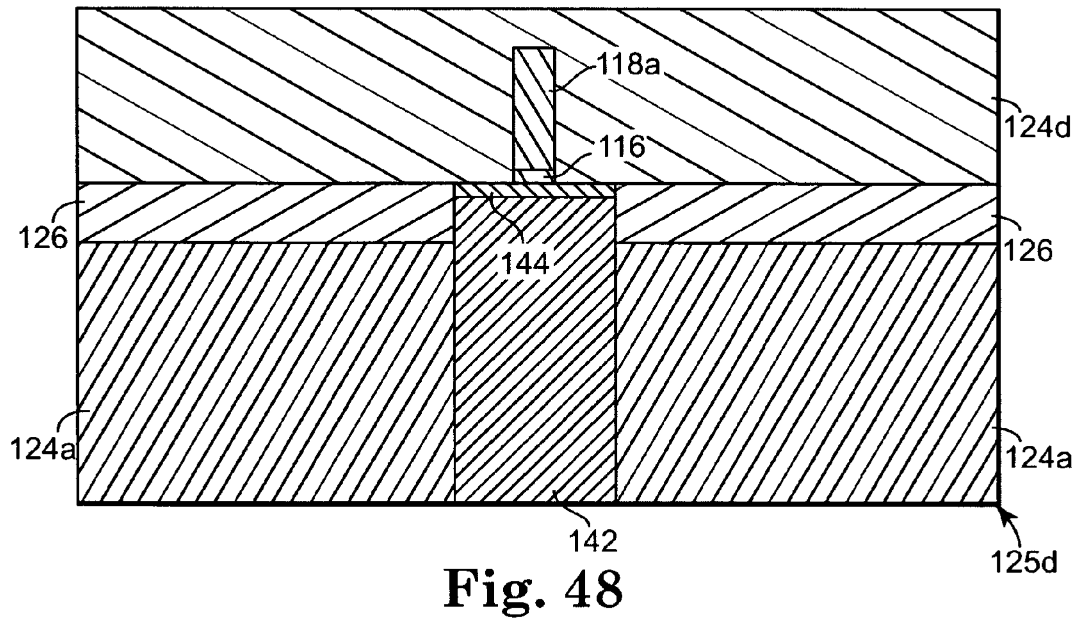
FIG. 48 illustrates a cross-sectional view of one embodiment of the preprocessed wafer, catalyst material layer, nanotube or nanowire, and a first insulation material layer.

FIG. 48 illustrates a cross-sectional view of one embodiment of preprocessed wafer 125*d*, catalyst material layer 116, nanotube or nanowire 118*a*, and a first insulation material layer 124_d_. Insulation material, such as $SiO_2$, FSG, or other suitable dielectric material, is deposited over exposed portions of preprocessed wafer 125_d_, catalyst material layer 116, and nanotube or nanowire 118_a_ to provide first insulation material layer 124_d_. First insulation material layer 124_d_ is deposited using CVD, ALD, MOCVD, PVD, JVP, or other suitable deposition technique.

Figure 49:
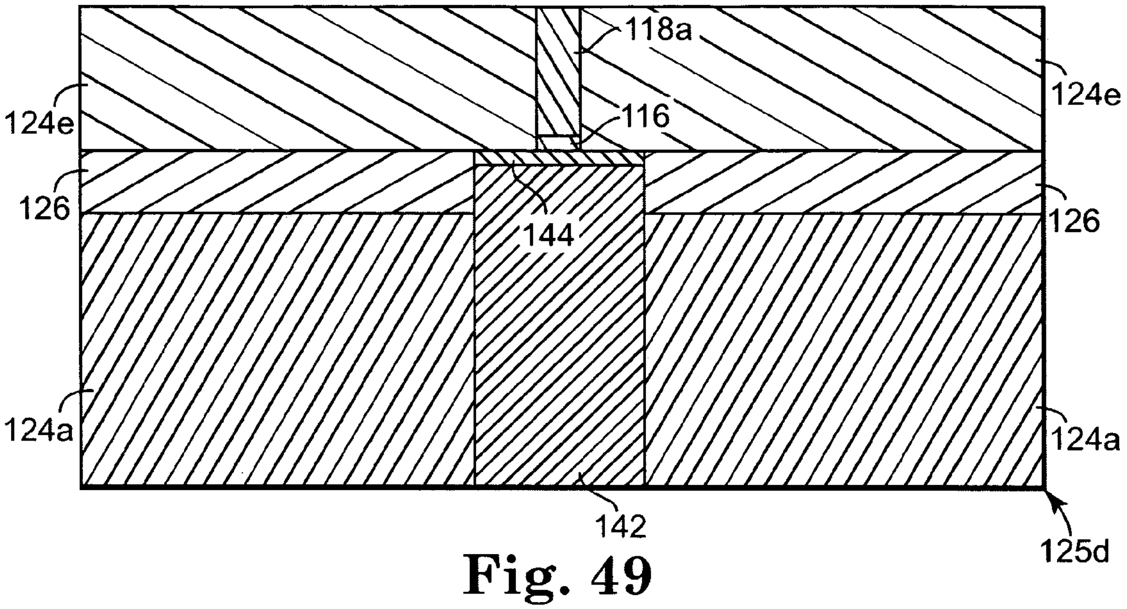
FIG. 49 illustrates a cross-sectional view of one embodiment of the preprocessed wafer, catalyst material layer, nanotube or nanowire, and first insulation material layer after planarization.

FIG. 49 illustrates a cross-sectional view of one embodiment of preprocessed wafer 125_d_, catalyst material layer 116, nanotube or nanowire 118_a_, and first insulation material layer 124_e_ after planarization. First insulation material layer 124_d_ is planarized to provide first insulation material layer 124_e_ and to expose nanotube or nanowire 118_a_. First insulation material layer 124_d_ is planarized using CMP or another suitable planarization process.

Figure 50:
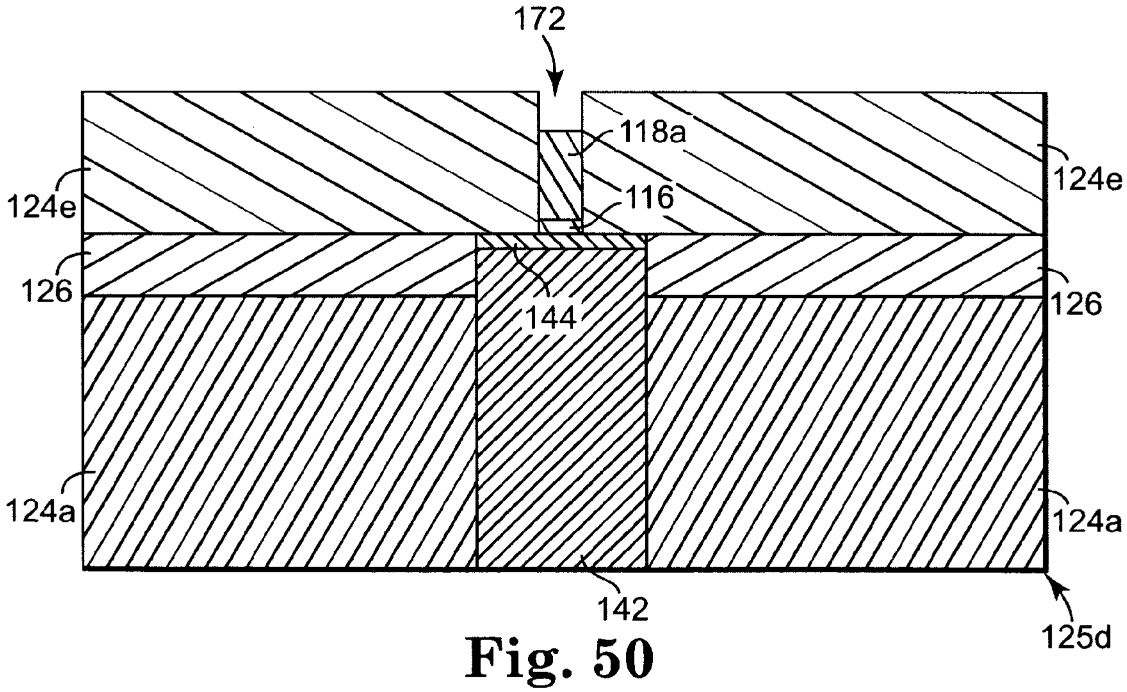
FIG. 50 illustrates a cross-sectional view of one embodiment of the preprocessed wafer, catalyst material layer, nanotube or nanowire, and first insulation material layer after etching the nanotube or nanowire.

FIG. 50 illustrates a cross-sectional view of one embodiment of preprocessed wafer 125_d_, catalyst material layer 116, nanotube or nanowire 118, and first insulation material layer 124_e_ after etching nanotube or nanowire 118_a_. Nanotube or nanowire 118_a_ is etched to provide nanotube or nanowire 118 and opening 172.

Figure 51:
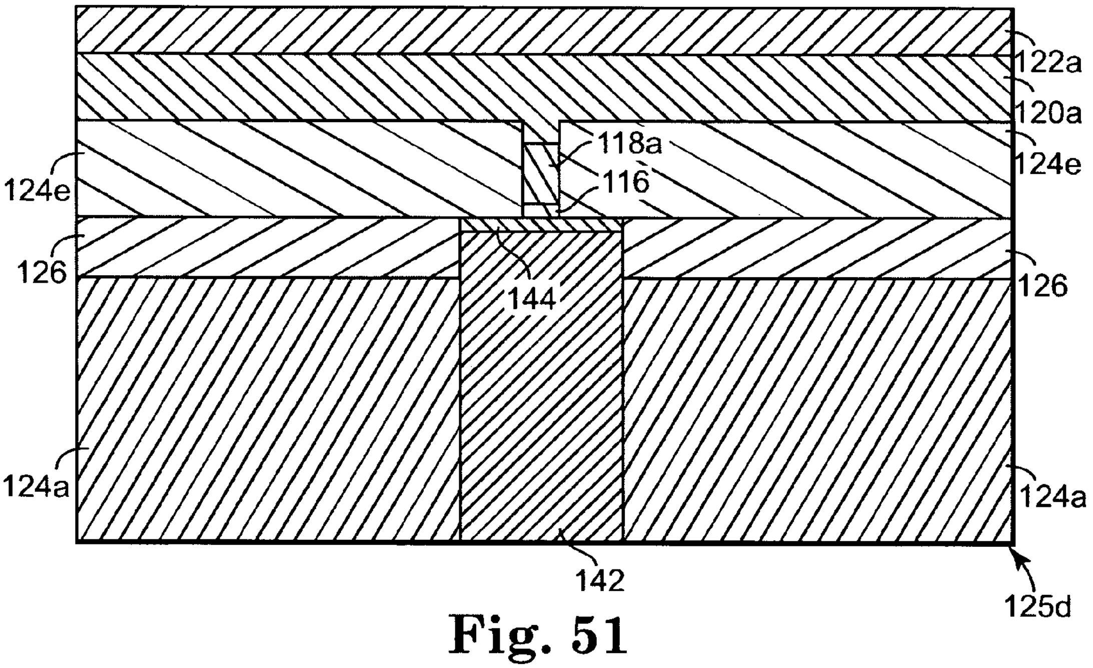
FIG. 51 illustrates a cross-sectional view of one embodiment of the preprocessed wafer, catalyst material layer, nanotube or nanowire, first insulation material layer, a phase-change material layer, and an electrode material layer.

FIG. 51 illustrates a cross-sectional view of one embodiment of preprocessed wafer 125_d_, catalyst material layer 116, nanotube or nanowire 118, first insulation material layer 124_e_, a phase-change material layer 120_a_, and an electrode material layer 122_a_. Phase-change material, such as a chalcogenic compound or other suitable phase-change material, is deposited over exposed portions of first insulation material layer 124_e_ and nanotube or nanowire 118 in opening 172 to provide phase-change material layer 120_a_. Phase-change material layer 120_a_ is deposited using CVD, ALD, MOCVD, PVD, JVP, or other suitable deposition technique.

Electrode material, such as TiN, TaN, W, Al, Cu, or other suitable electrode material, is deposited over phase-change material layer 120_a_ to provide electrode material layer 122_a_. Electrode material layer 122_a_ is deposited using CVD, ALD, MOCVD, PVD, JVP, or other suitable deposition technique. Phase-change material layer 120_a_ and electrode material layer 122_a_ are etched to provide second electrode 122 and phase-change material 120 forming a storage location. Insulation material, such as $SiO_2$, FSG, or other suitable dielectric material, is deposited around second electrode 122 and phase-change material 120 to provide phase-change memory cell 170 as illustrated in FIG. 43.

In one embodiment, the etching of nanotube or nanowire 118_a_ to form opening 172 and the depositing of phase-change material into opening 172 as illustrated in FIGS. 50 and 51 is also applied to phase-change memory cells 110_a_, 140_a_, and 150_a_.

Embodiments of the present invention provide a phase-change memory cell having a nanotube, nanowire, or nanofiber electrode that contacts the phase-change material. The contact area is defined based on a width or cross-section of the nanotube, nanowire, or nanofiber, which in turn is based on the width or cross-section of the catalyst material layer. By reducing the contact area between the electrode and the phase-change material, the amount of current and power used by the memory cell is reduced.

What is claimed is:

1. An integrated circuit having a memory cell comprising:
a first electrode comprising a nanowire;
a second electrode; and
resistivity changing material between the first electrode and the second electrode,
wherein a portion of the nanowire is laterally surrounded by the resistivity changing material.

2. The integrated circuit of claim 1, further comprising:
a catalyst material contacting the first electrode; and
a landing pad contacting the catalyst material.

3. The integrated circuit of claim 2, wherein the catalyst material is selected from the group consisting of Ti, Pd, Pt, Au, Cu, Co, Cr, Hf, Ir, Mn, Mo, Ni, Rh, Ta, W, and Zr.

4. The integrated circuit of claim 2, wherein the landing pad comprises one of tungsten and copper.

5. The integrated circuit of claim 2, wherein the landing pad comprises a metal silicide.

6. The integrated circuit of claim 1, wherein the resistivity changing material comprises a chalcogenide.

7. A memory cell comprising:
a first electrode comprising a nanowire;
a second electrode; and
phase-change material between the first electrode and the second electrode,
wherein a portion of the nanowire is laterally surrounded by the phase-change material.

8. The memory cell of claim 7, further comprising:
a catalyst material contacting the first electrode; and
a landing pad contacting the catalyst material.

9. The memory cell of claim 8, wherein the catalyst material is selected from the group consisting of Ti, Pd, Pt, Au, Cu, Co, Cr, Hf, Ir, Mn, Mo, Ni, Rh, Ta, W, and Zr.

10. The memory cell of claim 8, wherein the landing pad comprises one of tungsten and copper.

11. The memory cell of claim 8, wherein the landing pad comprises a metal silicide.

12. The memory cell of claim 7, wherein the phase-change material comprises a chalcogenide.

13. An integrated circuit having a memory cell comprising:
a first electrode comprising a nanowire;
a second electrode; and
resistive memory material between the first electrode and the second electrode,
wherein a portion of the nanowire is laterally surrounded by the resistive memory material.

14. The integrated circuit of claim 13, further comprising:
a catalyst material contacting the first electrode; and
a landing pad contacting the catalyst material.

15. The integrated circuit of claim 14, wherein the catalyst material is selected from the group consisting of Ti, Pd, Pt, Au, Cu, Co, Cr, Hf, Ir, Mn, Mo, Ni, Rh, Ta, W, and Zr.

16. The integrated circuit of claim 14, wherein the landing pad comprises one of tungsten and copper.

17. The integrated circuit of claim 14, wherein the landing pad comprises a metal silicide.

18. The integrated circuit of claim 13, wherein the resistive memory material comprises a chalcogenide.

* * * * *